United States Patent
Ohmi et al.

(10) Patent No.: US 8,568,577 B2
(45) Date of Patent: *Oct. 29, 2013

(54) MAGNETRON SPUTTERING APPARATUS

(75) Inventors: Tadahiro Ohmi, Miyagi (JP); Tetsuya Goto, Miyagi (JP); Takaaki Matsuoka, Tokyo (JP)

(73) Assignees: National University Corporation Tohoku University, Sendai-Shi (JP); Tokyo Electron Limited, Tokyo (JP)

( * ) Notice: Subject to any disclaimer, the term of this patent is extended or adjusted under 35 U.S.C. 154(b) by 550 days.

This patent is subject to a terminal disclaimer.

(21) Appl. No.: 12/594,676

(22) PCT Filed: Apr. 4, 2008

(86) PCT No.: PCT/JP2008/056819
§ 371 (c)(1),
(2), (4) Date: Oct. 5, 2009

(87) PCT Pub. No.: WO2008/126811
PCT Pub. Date: Oct. 23, 2008

(65) Prior Publication Data
US 2010/0059368 A1    Mar. 11, 2010

(30) Foreign Application Priority Data

Apr. 6, 2007 (JP) ................................. 2007-101159
Mar. 4, 2008 (JP) ................................. 2008-052891
Mar. 4, 2008 (JP) ................................. 2008-052934
Mar. 4, 2008 (JP) ................................. 2008-053981

(51) Int. Cl.
*C25B 9/00* (2006.01)
*C25B 11/00* (2006.01)
*C25B 13/00* (2006.01)
*C23C 14/00* (2006.01)

(52) U.S. Cl.
USPC ............ 204/298.22; 204/298.16; 204/298.17; 204/298.21; 204/298.23

(58) Field of Classification Search
USPC ................ 204/298.16, 298.17, 298.22, 298.2, 204/298.21, 298.23
See application file for complete search history.

(56) References Cited

U.S. PATENT DOCUMENTS 4,374,722 A * 2/1983 Zega ........................ 204/298.03
5,399,253 A * 3/1995 Grunenfelder ............ 204/298.2
(Continued)

FOREIGN PATENT DOCUMENTS

JP    60-204882 A    10/1985
JP    05-148642 A    6/1993
(Continued)

OTHER PUBLICATIONS

Korean Office action for 10-2009-7022976 dated Jun. 17, 2011.
Chinese Office action for 200880011109.8 dated Jan. 31, 2011.
International Search Report for PCT/JP2008/056819, dated Jul. 1, 2008.

*Primary Examiner* — Michael Band
(74) *Attorney, Agent, or Firm* — Pearne & Gordon LLP

(57) ABSTRACT

Provided is a magnetron sputtering apparatus that increases an instantaneous plasma density on a target to improve a film forming rate. The magnetron sputtering apparatus includes a substrate to be processed, a target installed to face the substrate and a rotary magnet installed at a side opposite to the substrate across the target. In the magnetron sputtering apparatus, plasma loops are formed on a target surface. The plasma loops are generated, move and disappear in an axis direction of the rotary magnet according to a rotation of the rotary magnet.

16 Claims, 32 Drawing Sheets

(56) References Cited

U.S. PATENT DOCUMENTS

| | | | |
|---|---|---|---|
| 6,322,679 B1 | 11/2001 | De Bosscher et al. | |
| 6,740,585 B2 * | 5/2004 | Yoon et al. | 438/680 |
| 2005/0252763 A1 * | 11/2005 | Chistyakov | 204/192.12 |
| 2006/0169582 A1 * | 8/2006 | Brown et al. | 204/298.01 |
| 2007/0175748 A1 * | 8/2007 | Atamny et al. | 204/192.1 |
| 2007/0175749 A1 * | 8/2007 | Schneider et al. | 204/192.1 |
| 2010/0101945 A1 * | 4/2010 | Ohmi et al. | 204/298.08 |
| 2010/0126848 A1 * | 5/2010 | Ohmi et al. | 204/192.12 |
| 2010/0126852 A1 * | 5/2010 | Ohmi et al. | 204/298.03 |
| 2011/0000783 A1 * | 1/2011 | Ohmi et al. | 204/192.15 |
| 2012/0064259 A1 * | 3/2012 | Ohmi et al. | 427/571 |

FOREIGN PATENT DOCUMENTS

| | | |
|---|---|---|
| JP | 05-209267 A | 8/1993 |
| JP | 2000-309867 A | 11/2000 |
| JP | 2001-032067 A | 2/2001 |
| JP | 2001-523770 A | 11/2001 |
| JP | 3566327 B2 | 6/2004 |
| KR | 10-0262768 B1 | 8/2000 |
| KR | 10-2002-0018083 A | 3/2002 |
| KR | 10-0450380 B1 | 9/2004 |
| WO | WO 2007071719 A1 * | 6/2007 |

* cited by examiner

1. MAGNETIC CIRCUIT IS NOT FORMED
2. PARAMAGNETIC BODY IS INSTALLED BELOW STATIONARY OUTER PERIPHERAL PLATE MAGNET (RELATIVE MAGNETIC PERMEABILITY OF 100)
3. MAGNETIC CIRCUIT IS FORMED BETWEEN PARAMAGNETIC MEMBER BELOW STATIONARY OUTER PERIPHERAL PLATE MAGNET AND COLUMN-SHAPED ROTATION SHAFT

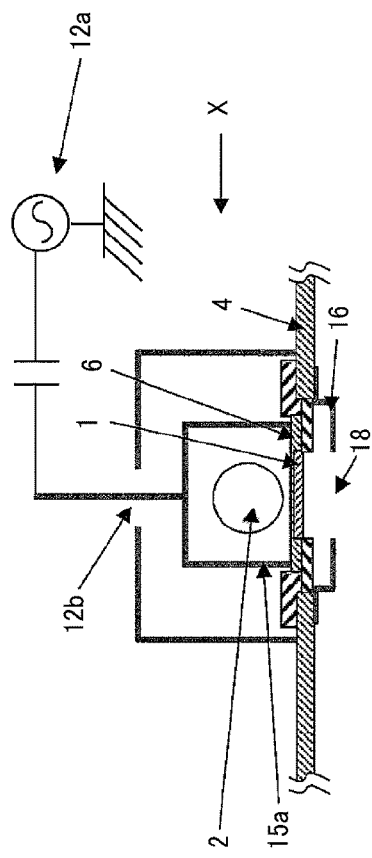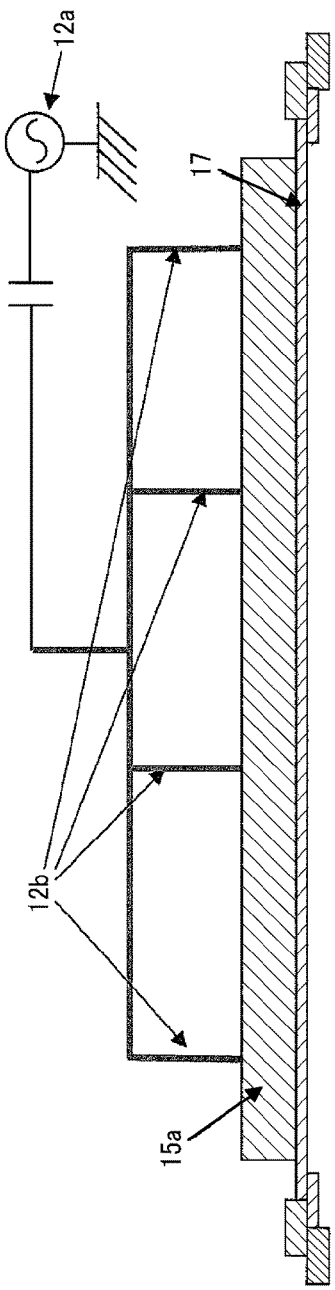

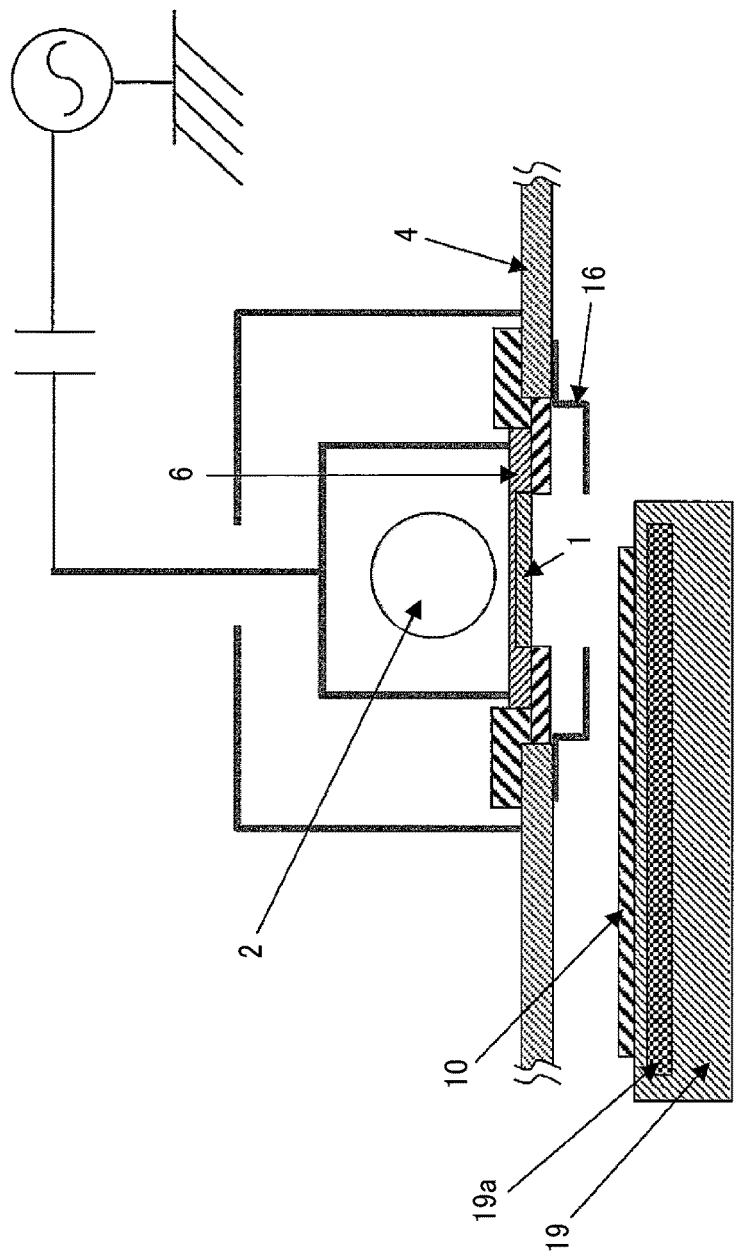

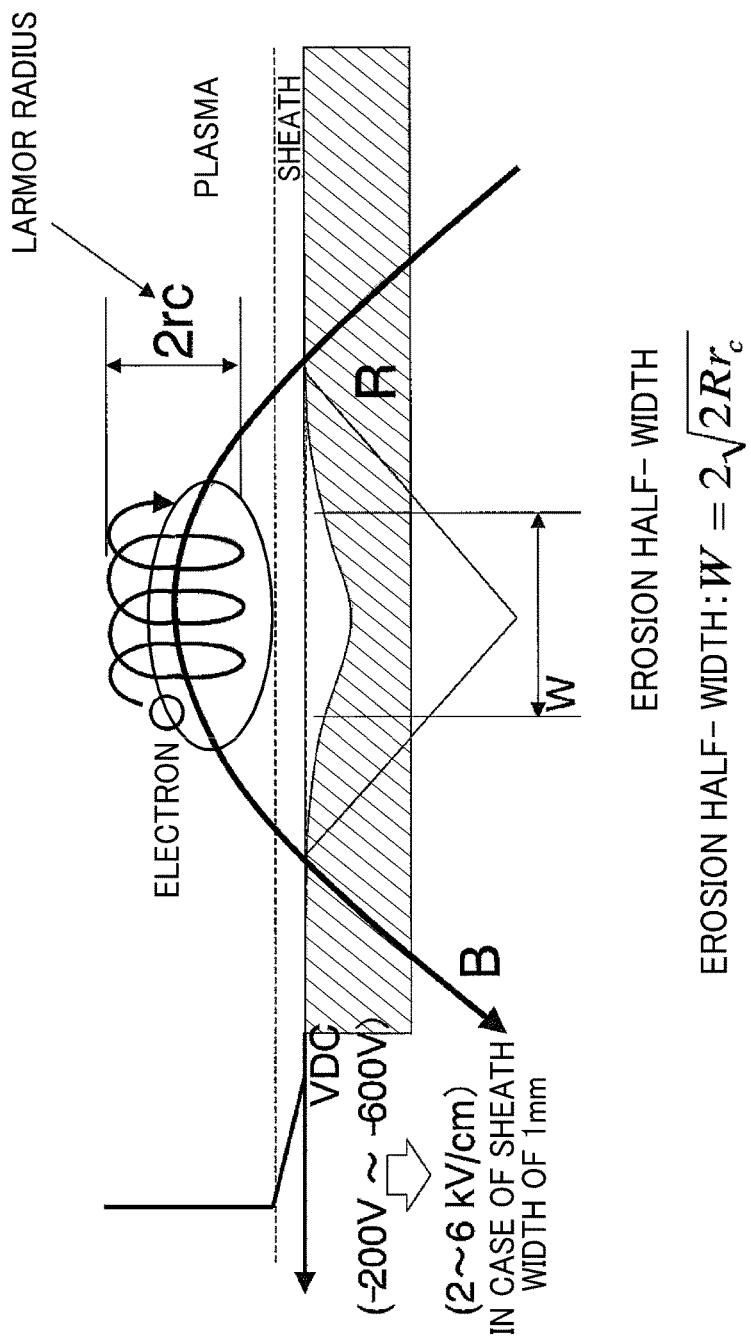

$W_n = B_n \sin \alpha$
$W_s = B_s \sin \alpha$
$c = s \sin \alpha$
m LOOPS (PLASMA SIDE)

(BACKING PLATE SIDE)

(PLASMA SIDE)

(BACKING PLATE SIDE)

MAGNET WIDTH:  8mm        12mm        17mm $\alpha = 84.7°$    $\alpha = 83.7°$    $\alpha = 82.5°$ ONE LOOP, MAGNET DIAMETER 150mm
DISTANCE BETWEEN MAGNETS 12mm
S-MAGNET WIDTH 18mm
N-MAGNET WIDTH 14mm ONE LOOP, MAGNET DIAMETER 150mm,
DISTANCE BETWEEN MAGNETS 12mm, S-MAGNET WIDTH 14mm

MAGNETRON SPUTTERING APPARATUS

TECHNICAL FIELD

The present invention relates to a magnetron sputtering apparatus which performs a preset surface processing on a target object such as a liquid crystal display substrate or a semiconductor substrate.

BACKGROUND ART

A thin film forming process for forming a thin film of a metal or an insulating material on a substrate is indispensable in the manufacture of a semiconductor device such as an IC or a liquid crystal display device. A film forming method using a sputtering apparatus is used in the thin film forming process. In this film forming method, a target made of a raw material for a thin film formation is used; and an argon gas or the like is excited into plasma by a DC high voltage or a high frequency power; and the target is activated by the gas excited into plasma and is sputtered; and then it is deposited on a target substrate.

A film forming method using a magnetron sputtering apparatus is mainly employed as a sputtering film forming method. In this film forming method, to achieve a high film forming rate, magnets are arranged on a rear surface of a target such that magnetic force lines are generated in parallel to each other on a target surface, thereby confining plasma on the target surface and thus obtaining high-density plasma.

FIG. 14 is a configuration view illustrating major components of such a conventional magnetron sputtering apparatus. In the figure, a reference numeral 101 denotes a target; 102, a target substrate on which a thin film is to be formed; 103, a plurality of magnets; 104, magnetic force lines; and 105, a target 101's area which is eroded, i.e., an erosion area.

As shown in FIG. 14, the plurality of magnets 103 are arranged on a rear surface of the target 101 such that their N and S poles are oriented toward predetermined directions. High frequency power (RF power) 106 or DC high voltage power 107 is applied between the target 101 and the substrate 102, so that plasma is excited on the target 101.

Meanwhile, the magnetic force lines 104 oriented from N poles to their adjacent S poles are generated from the plurality of magnets 103 installed on the rear surface of the target 101. A horizontal magnetic field (a magnetic force line parallel to a target surface) is maximized locally at a position on the target surface where a vertical magnetic field (a magnetic force line component perpendicular to the target surface) is zero. In an area where the horizontal magnetic field component is great, electrons are confined in the vicinity of the target surface, so that high-density plasma is obtained. As a result, the erosion area 105 is formed around this area.

Since the erosion area 105 is exposed to the higher-density plasma compared to the other areas, consumption of the target 101 tends to be great thereat. As a film formation is continued, a target material is consumed in this area, so that the entire target has to be replaced. As a result, the efficiency of the usage of the target 101 may be deteriorated. Besides, as for the thickness of a thin film on the target substrate 102 installed to face the target 101, since a film thickness at a position corresponding to the erosion area 105 is thicker than film thicknesses at the other areas, the uniformity of the entire film thickness of the target substrate 102 may also be deteriorated.

Conventionally, there have been proposed methods in which a bar magnet is used as a magnet for generating magnetic fields, and the bar magnet is moved and rotated to move an erosion area as time passes, so that a local consumption of target is substantially suppressed. That is, a time average of target consumption is uniform and the uniformity of the film thickness of a target substrate is improved (see, for example, Patent Documents 1 to 3).

In these methods, each bar magnet has a configuration in which an N pole and an S pole are respectively positioned at surfaces opposite to each other in its diametric direction while the same magnetic polarities are respectively arranged in parallel in its lengthwise direction, or an N pole and an S pole are respectively positioned at surfaces opposite to each other in its diametric direction while the same magnetic polarities are respectively arranged in a spiral shape in its lengthwise direction. Further, stationary bar magnets are positioned in the vicinity of moving or rotating bar magnets so that a closed circuit is formed at an erosion area within the target. Each of these stationary bar magnets has a configuration in which an N pole and an S pole are respectively positioned at surfaces opposite to each other in its diametric direction while the same magnetic polarities are respectively arranged in parallel in its lengthwise direction.

In addition, there has been also proposed a method in which a plurality of film-formation rotary magnets buried in a spiral shape is used to continuously form waves of a magnetic field (see, for example, Patent Document 4).

Patent Document 1: Japanese Patent Laid-open Publication No. H5-148642
Patent Document 2: Japanese Patent Laid-open Publication No. 2000-309867
Patent Document 3: Japanese Patent No. 3566327
Patent Document 4: Japanese Patent Laid-open Publication No.

DISCLOSURE OF THE INVENTION

Problems to Be Solved by the Invention

In the aforementioned conventional methods, however, the strength of bar magnets needs to be enhanced and the compact bar magnets need to be arranged more closely to each other, such that an instantaneous erosion density is increased, i.e., a ratio of erosion areas to an entire target area becomes high in order to increase a film forming rate on a target substrate. However, with such a configuration, magnets or fixing rods may be distorted due to repulsive or attractive forces between the magnets, or it may be difficult to move or rotate the magnets against those forces. To elaborate, an attractive or repulsive force of about 3000 N may be generated between the magnets, thereby causing some problems. That is, metals supporting the magnets may be deformed, or a torque of about 30 N·m may be simultaneously generated whereby a very strong motor may be needed, or it may become difficult to raise a rotational speed. These problems cause deterioration of the uniformity of the film formation or reduction of apparatus lifetime.

Further, as the rotary magnet adjacent to its surrounding stationary bar magnets is rotated, there inevitably occurs a case where a phase of a magnetic pole of the rotary magnet becomes identical with a phase of a magnetic pole of the stationary bar magnet surrounding the rotary magnet. In this case, a closed plasma region may not be formed.

Further, in film-formation rotary magnets buried in a spiral shape, although waves of a magnetic field are formed, a closed plasma loop may not be formed, or strong forces may be generated between the adjacent rotary magnets so that it may be difficult to rotate the magnets against the forces.

In view of the foregoing, the present invention has been conceived to solve the above-mentioned problems and provides a magnetron sputtering apparatus that increases an instantaneous plasma density on a target to increase a film forming rate.

Further, the present invention also provides a magnetron sputtering apparatus that moves a plasma loop as time passes and prevents a local abrasion of a target to achieve uniform consumption thereof, thereby increasing a lifetime of the target.

Moreover, the present invention also provides a magnetron sputtering apparatus having a magnet rotating mechanism and a long lifetime without imposing a great burden on a rotation device or a column-shaped rotation shaft.

Means for Solving the Problems

In accordance with a first aspect of the present invention, there is provided a magnetron sputtering apparatus that includes a substrate to be processed, a target installed to face the substrate and a magnet installed at a side opposite to the substrate across the target, and confines plasma on a surface of the target by forming a magnetic field on the target surface by the magnet. The magnet includes a rotary magnet body installed around a column-shaped rotation shaft in a spiral shape and a stationary outer peripheral body installed in the vicinity of the rotary magnet body in parallel to the target surface. The stationary outer peripheral body is made of a magnet magnetized in a direction perpendicular to the target surface or a ferromagnetic body which is not previously magnetized. The rotary magnet body rotates with the column-shaped rotation shaft, so that a pattern of the magnetic field on the target surface moves as time passes, and a torque applied to the column-shaped rotation shaft due to an interaction between the rotary magnet body and the stationary outer peripheral body is in a range of about 0.1 N·m to 1 N·m.

In accordance with a second aspect of the present invention, there is provided a magnetron sputtering apparatus that includes a substrate to be processed, a target installed to face the substrate and a magnet installed at a side opposite to the substrate across the target, and confines plasma on a surface of the target by forming a magnetic field on the target surface by the magnet. The magnet includes a rotary magnet body installed around a column-shaped rotation shaft in a spiral shape and a stationary outer peripheral body installed in the vicinity of the rotary magnet body in parallel to the target surface. The stationary outer peripheral body is made of a magnet magnetized in a direction perpendicular to the target surface or a ferromagnetic body which is not previously magnetized. The rotary magnet body rotates with the column-shaped rotation shaft, so that a pattern of the magnetic field on the target surface moves as time passes. A torque applied to the column-shaped rotation shaft due to an interaction between the rotary magnet body and the stationary outer peripheral body is in a range of about 0.1 N·m to 1 N·m, and a force applied to the column-shaped rotation shaft in one direction is in a range of about 1 N to 300 N.

In accordance with a third aspect of the present invention, there is provided a magnetron sputtering apparatus that includes a substrate to be processed, a target installed to face the substrate and a magnet installed at a side opposite to the substrate across the target, and confines plasma on a surface of the target by forming a magnetic field on the target surface by the magnet. The magnet includes a rotary magnet body installed around a column-shaped rotation shaft in a spiral shape and a stationary outer peripheral body installed in the vicinity of the rotary magnet body in parallel to the target surface. The stationary outer peripheral body is made of a magnet magnetized in a direction perpendicular to the target surface or a ferromagnetic body which is not previously magnetized. The rotary magnet body rotates with the column-shaped rotation shaft, so that a pattern of the magnetic field on the target surface moves as time passes, and a torque applied to the column-shaped rotation shaft due to an interaction between the rotary magnet body and the stationary outer peripheral body is in a range of about 0.1 N·m to 10 N·m.

In accordance with a fourth aspect of the present invention, there is provided a magnetron sputtering apparatus that includes a substrate to be processed, a target installed to face the substrate and a magnet installed at a side opposite to the substrate across the target, and confines plasma on a surface of the target by forming a magnetic field on the target surface by the magnet. The magnet includes a rotary magnet body installed around a column-shaped rotation shaft in a spiral shape and a stationary outer peripheral body installed in the vicinity of the rotary magnet body in parallel to the target surface. The stationary outer peripheral body is made of a magnet magnetized in a direction perpendicular to the target surface or a ferromagnetic body which is not previously magnetized. The rotary magnet body rotates with the column-shaped rotation shaft, so that a pattern of the magnetic field on the target surface moves as time passes, and a torque applied to the column-shaped rotation shaft due to an interaction between the rotary magnet body and the stationary outer peripheral body is in a range of about 0.1 N·m to 100 N·m.

In accordance with a fifth aspect of the present invention, there is provided a magnetron sputtering apparatus that includes a substrate to be processed, a target installed to face the substrate and a magnet installed at a side opposite to the substrate across the target, and confines plasma on a surface of the target by forming a magnetic field on the target surface by the magnet. A plurality of plasma loops is formed on the target surface.

In accordance with a sixth aspect of the present invention, there is provided a magnetron sputtering apparatus that includes a substrate to be processed, a target installed to face the substrate and a magnet installed at a side opposite to the substrate across the target, and confines plasma on a surface of the target by forming a magnetic field on the target surface by the magnet. A plurality of plasma loops is formed on the target surface, and the plurality of plasma loops moves as the magnet moves.

In accordance with a seventh aspect of the present invention, there is provided a magnetron sputtering apparatus that includes a substrate to be processed, a target installed to face the substrate and a magnet installed at a side opposite to the substrate across the target, and confines plasma on a surface of the target by forming a magnetic field on the target surface by the magnet. A plasma loop formed on the target surface is repeatedly generated, moves and disappears as the magnet moves.

In accordance with an eighth aspect of the present invention, there is provided a magnetron sputtering apparatus as described in any one of the fifth aspect to the seventh aspect, wherein the magnet may include a rotary magnet body installed around a column-shaped rotation shaft in a spiral shape and a stationary outer peripheral body installed in the vicinity of the rotary magnet body in parallel to the target surface. The stationary outer peripheral body may be made of a magnet magnetized in a direction perpendicular to the target surface or a ferromagnetic body which is not previously magnetized. The rotary magnet body may rotate with the column-shaped rotation shaft, so that the plasma loop is generated, moves, and disappears.

In accordance with a ninth aspect of the present invention, there is provided a magnetron sputtering apparatus that includes a substrate to be processed, a target installed to face the substrate and a magnet installed at a side opposite to the substrate across the target, and confines plasma on a surface of the target by forming a magnetic field on the target surface by the magnet. On the target surface, a plasma loop is formed around a region on a loop where a vertical magnetic field component perpendicular to the target does not substantially exist while a horizontal magnetic field component parallel to the target mainly exists, and the horizontal magnetic field component at all position on the loop where the horizontal magnetic field mainly exists is in a range of about 500 Gauss to 1200 Gauss.

In accordance with a tenth aspect of the present invention, there is provided a magnetron sputtering apparatus that includes a substrate to be processed, a target installed to face the substrate and a magnet installed at a side opposite to the substrate across the target, and confines plasma on a surface of the target by forming a magnetic field on the target surface by the magnet. On the target surface, a plasma loop is formed around a region on a loop where a vertical magnetic field component perpendicular to the target does not substantially exist while a horizontal magnetic field component parallel to the target mainly exists, and the horizontal magnetic field component at all position on the loop where the horizontal magnetic field mainly exists is in a range of about 500 Gauss to 750 Gauss.

In accordance with an eleventh aspect of the present invention, there is provided a magnetron sputtering apparatus that includes a substrate to be processed, a target installed to face the substrate and a magnet installed at a side opposite to the substrate across the target, and confines plasma on a surface of the target by forming a magnetic field on the target surface by the magnet. On the target surface, a plasma loop is formed around a region on a loop where a vertical magnetic field component perpendicular to the target does not substantially exist while a horizontal magnetic field component parallel to the target mainly exists, and the horizontal magnetic field component at all position on the loop where the horizontal magnetic field mainly exists has a minimum value in a range of about 25% to 65% of a maximum value.

In accordance with a twelfth aspect of the present invention, there is provided a magnetron sputtering apparatus that includes a substrate to be processed, a target installed to face the substrate and a magnet installed at a side opposite to the substrate across the target, and confines plasma on a surface of the target by forming a magnetic field on the target surface by the magnet. On the target surface, a plasma loop is formed around a region on a loop where a vertical magnetic field component perpendicular to the target does not substantially exist while a horizontal magnetic field component parallel to the target mainly exists, and the horizontal magnetic field component at all position on the loop where the horizontal magnetic field mainly exists has a minimum value in a range of about 65% to 100% of a maximum value.

In accordance with a thirteenth aspect of the present invention, there is provided a magnetron sputtering apparatus that includes a substrate to be processed, a target installed to face the substrate and a magnet installed at a side opposite to the substrate across the target, and confines plasma on a surface of the target by forming a magnetic field on the target surface by the magnet. On the target surface, a plasma loop is formed around a region on a loop where a vertical magnetic field component perpendicular to the target does not substantially exist while a horizontal magnetic field component parallel to the target mainly exists, and the horizontal magnetic field component at all position on the loop where the horizontal magnetic field mainly exists has a minimum value in a range of about 75% to 100% of a maximum value.

In accordance with a fourteenth aspect of the present invention, there is provided a magnetron sputtering apparatus as described in any one of the ninth aspect to the thirteenth aspect, wherein the magnet may include a rotary magnet body installed around a column-shaped rotation shaft in a spiral shape; and a stationary outer peripheral body installed in the vicinity of the rotary magnet body in parallel to the target surface. The stationary outer peripheral body may be made of a magnet magnetized in a direction perpendicular to the target surface or a ferromagnetic body which is not previously magnetized. The rotary magnet body may rotate with the column-shaped rotation shaft, so that the plasma loop is generated, moves, and disappears.

In accordance with a fifteenth aspect of the present invention, there is provided a magnetron sputtering apparatus as described in any one of the first aspect to the fourth aspect or any one of the eighth aspect to the fourteenth aspect, wherein the rotary magnet body may include a plurality of spiral bodies formed around the column-shaped rotation shaft, and form a spiral-shaped magnet set in which adjacent spiral bodies in an axial direction of the column-shaped rotation shaft have opposite magnetic poles of an N pole and an S pole on an outer side of the column-shaped rotation shaft in its diametrical direction. The stationary outer peripheral body may be configured to surround the rotary magnet body when viewed from the target, and may form magnetic poles of an N pole or an S pole on a side of the target or it may be not previously magnetized.

In accordance with a sixteenth aspect of the present invention, there is provided a magnetron sputtering apparatus as described in the fifteenth aspect, wherein when the column-shaped rotation shaft and the rotary magnet body are viewed from a direction perpendicular to an axis of the column-shaped rotation shaft, an acute angle between a direction of the magnet forming a spiral and an axial direction of the column-shaped rotation shaft may be in a range of about 35° to 50°.

In accordance with a seventeenth aspect of the present invention, there is provided a magnetron sputtering apparatus as described in the fifteenth aspect, wherein when the column-shaped rotation shaft and the rotary magnet body are viewed from a direction perpendicular to an axis of the column-shaped rotation shaft, an acute angle between a direction of the magnet forming a spiral and an axial direction of the column-shaped rotation shaft may be in a range of about 30° to 70°.

In accordance with an eighteenth aspect of the present invention, there is provided a magnetron sputtering apparatus as described in the fifteenth aspect, wherein when the column-shaped rotation shaft and the rotary magnet body are viewed from a direction perpendicular to an axis of the column-shaped rotation shaft, an acute angle between a direction of the magnet forming a spiral and an axial direction of the column-shaped rotation shaft may be in a range of about 70° to 88°.

In accordance with a nineteenth aspect of the present invention, there is provided a magnetron sputtering apparatus as described in the fifteenth aspect, wherein when the column-shaped rotation shaft and the rotary magnet body are viewed from a direction perpendicular to an axis of the column-shaped rotation shaft, an acute angle between a direction of the magnet forming a spiral and an axial direction of the column-shaped rotation shaft may be in a range of about 75° to 85°.

In accordance with a twentieth aspect of the present invention, there is provided a magnetron sputtering apparatus as described in any one of the fifteenth aspect to the nineteenth aspect, wherein the rotary magnet body may be a spiral-shaped plate magnet set having plate magnets installed on the column-shaped rotation shaft in a spiral shape to form 2 spirals, and adjacent spirals in an axial direction of the column-shaped rotation shaft may have opposite magnetic poles of an N pole and an S pole on the outer side of the column-shaped rotation shaft in its diametrical direction.

In accordance with a twenty first aspect of the present invention, there is provided a magnetron sputtering apparatus as described in any one of the fifteenth aspect to the nineteenth aspect, wherein the rotary magnet body may be a spiral-shaped plate magnet set having plate magnets installed on the column-shaped rotation shaft in a spiral shape to form 4, 6, 8 or 10 spirals, and adjacent spirals in an axial direction of the column-shaped rotation shaft may have opposite magnetic poles of an N pole and an S pole on the outer side of the column-shaped rotation shaft in its diametrical direction.

In accordance with a twenty second aspect of the present invention, there is provided a magnetron sputtering apparatus as described in any one of the fifteenth aspect to the twenty first aspect, wherein a magnet, which freely moves independently of the rotary magnet body and the stationary outer peripheral body, may be installed in the vicinity of the rotary magnet body.

In accordance with a twenty third aspect of the present invention, there is provided a magnetron sputtering apparatus as described in the twenty second aspect, wherein the magnet, which freely moves independently of the rotary magnet body and the stationary outer peripheral body, may be installed in the vicinity of the rotary magnet body, and when the column-shaped rotation shaft is rotated, a torque and a force applied to the column-shaped rotation shaft due to the interaction between the rotary magnet body and the stationary outer peripheral body are always smaller than those in a case where no magnet that freely moves may be provided.

In accordance with a twenty fourth aspect of the present invention, there is provided a magnetron sputtering apparatus as described in any one of the twentieth aspect to the twenty third aspect, wherein at least a part of the column-shaped rotation shaft may be made of a paramagnetic body.

In accordance with a twenty fifth aspect of the present invention, there is provided a magnetron sputtering apparatus as described in any one of the twentieth aspect to the twenty fourth aspect, wherein the column-shaped rotation shaft may be made of a magnetic body having a hollow structure, and a thickness thereof may be set such that a magnetic flux density at an entire region in the magnetic body becomes equal to or less than about 65% of a saturated magnetic flux density of the magnetic body.

In accordance with a twenty sixth aspect of the present invention, there is provided a magnetron sputtering apparatus as described in any one of the twentieth aspect to the twenty fifth aspect, wherein the column-shaped rotation shaft may be made of a magnetic body having a hollow structure, and a thickness thereof may be set such that a magnetic flux density at an entire region in the magnetic body becomes equal to or less than about 60% of a saturated magnetic flux density of the magnetic body and smaller than a residual magnetic flux density of the magnet forming the rotary magnet body.

In accordance with a twenty seventh aspect of the present invention, there is provided a magnetron sputtering apparatus as described in any one of the twentieth aspect to the twenty sixth aspect, wherein the column-shaped rotation shaft may be made of a magnetic body having a hollow structure, and a thickness thereof may be set such that a magnetic flux density at an entire region in the magnetic body becomes smaller than a residual magnetic flux density of the magnet forming the rotary magnet body.

In accordance with a twenty eighth aspect of the present invention, there is provided a magnetron sputtering apparatus as described in any one of the twentieth aspect to the twenty seventh aspect, wherein a stationary outer peripheral paramagnetic body may be installed adjacent to the stationary outer peripheral body at a surface opposite to the target across the stationary outer peripheral body.

In accordance with a twenty ninth aspect of the present invention, there is provided a magnetron sputtering apparatus as described in any one of the twentieth aspect to the twenty eighth aspect, wherein a unit that allows a magnetic flux starting from the stationary outer peripheral body to an outside of the target to be weaker than a magnetic flux starting from the stationary outer peripheral body to an inside of the target may be provided.

In accordance with a thirtieth aspect of the present invention, there is provided a magnetron sputtering apparatus as described in any one of the twentieth aspect to the twenty ninth aspect, wherein the unit may include a paramagnetic member installed to continuously cover an outer lateral surface of the stationary outer peripheral body when viewed from the target and a part of a target-side surface thereof.

In accordance with a thirty first aspect of the present invention, there is provided a magnetron sputtering apparatus as described in any one of the twentieth aspect to the thirtieth aspect, wherein the rotary magnet body and the stationary outer peripheral body may be movable in a direction perpendicular to the target surface.

In accordance with a thirty second aspect of the present invention, there is provided a magnetron sputtering apparatus as described in any one of the twentieth aspect to the thirty first aspect, wherein the rotary magnet body and the stationary outer peripheral body may be installed in a space surrounded by a target member, a backing plate to which the target member is fixed, and a wall extended from the vicinity of the backing plate, and the space may be capable of being depressurized.

In accordance with a thirty third aspect of the present invention, there is provided a magnetron sputtering apparatus as described in the thirty second aspect, wherein a thickness of the backing plate may be thinner than an initial thickness of the target.

In accordance with a thirty fourth aspect of the present invention, there is provided a magnetron sputtering apparatus as described in any one of the twentieth aspect to the thirty third aspect, wherein a unit that relatively moves the substrate in a direction intersecting with the axial direction of the column-shaped rotation shaft may be provided.

In accordance with a thirty fifth aspect of the present invention, there is provided a magnetron sputtering apparatus including a plurality of magnetron sputtering apparatuses as described in any one of the twentieth aspect to the thirty fourth aspect provided in parallel to each other in an axial direction of the column-shaped rotation shaft and a unit that relatively moves the substrate in a direction intersecting with the axial direction of the column-shaped rotation shaft.

In accordance with a thirty sixth aspect of the present invention, there is provided a magnetron sputtering apparatus including a plurality of the magnetron sputtering apparatuses as described in any one of the twentieth aspect to the thirty fourth aspect and a unit that relatively moves the substrate in a direction intersecting with the axial direction of the column-shaped rotation shaft. Each magnetron sputtering apparatus has a target material different to each other, and is provided in parallel to each other in an axial direction of the column-shaped rotation shaft.

In accordance with a thirty seventh aspect of the present invention, there is provided a magnetron sputtering apparatus that includes a substrate to be processed, a target installed to face the substrate and a magnet installed at a side opposite to the substrate across the target, and confines plasma on a surface of the target by forming a magnetic field on the target surface by the magnet. A plurality of plasma loops is formed on the target surface, a distance between the target surface and a surface of the substrate is set to be equal to or less than about 30 mm, and a magnetic field on the substrate surface is set to be equal to or less than about 100 Gauss.

In accordance with a thirty eighth aspect of the present invention, there is provided a magnetron sputtering apparatus that includes a substrate to be processed, a target installed to face the substrate and a magnet installed at a side opposite to the substrate across the target, and confines plasma on a surface of the target by forming a magnetic field on the target surface by the magnet. A plurality of plasma loops is formed on the target surface, a distance between the target surface and a surface of the substrate is set to be equal to or less than about 30 mm, and a magnetic field on the substrate surface is set to be equal to or less than about 20 Gauss.

In accordance with a thirty ninth aspect of the present invention, there is provided a magnetron sputtering apparatus that includes a substrate to be processed, a target installed to face the substrate, a target holding unit installed at a side opposite to the substrate across the target and a magnet installed to face the target via the target holding unit, and confines plasma on a surface of the target by forming a magnetic field on the target surface by the magnet. A plurality of plasma loops is formed on the target surface, and a thickness of the target holding unit is set to be equal to or less than about 30% of an initial thickness of the target.

In accordance with a fortieth aspect of the present invention, there is provided a magnetron sputtering apparatus as described in the thirty ninth aspect, wherein a first space between the substrate and the target may be capable of being depressurized, a second space between the target holding unit and the magnet may be capable of being depressurized, and a pressure in the first space may be substantially the same as that in the second space.

In accordance with a forty first aspect of the present invention, there is provided a magnetron sputtering apparatus as described in the fortieth aspect, wherein a thickness of the backing plate may be thinner than an initial thickness of the target.

In accordance with a forty second aspect of the present invention, there is provided a magnetron sputtering apparatus as described in any one of the thirty ninth aspect to the forty first aspect, wherein a cooling unit may be installed at the target holding unit.

In accordance with a forty third aspect of the present invention, there is provided a magnetron sputtering apparatus as described in the forty second aspect, wherein the cooling unit may be installed in the second space and may be positioned close to both end portions of the target holding unit.

In accordance with a forty fourth aspect of the present invention, there is provided a magnetron sputtering apparatus that includes a substrate to be processed, a target installed to face the substrate and a magnet installed at a side opposite to the substrate across the target, and confines plasma on a surface of the target by forming a magnetic field on the target surface by the magnet. The magnet includes a rotary magnet body installed around a column-shaped rotation shaft in a spiral shape and a stationary outer peripheral body installed in the vicinity of the rotary magnet body in parallel to the target surface. The stationary outer peripheral body is made of a magnet magnetized in a direction perpendicular to the target surface or a ferromagnetic body which is not previously magnetized. The rotary magnet body rotates with the column-shaped rotation shaft, so that a pattern of the magnetic field on the target surface moves as time passes. The target is fixed to a backing plate made of a metal, and the rotary magnet body is surrounded by a metal plate electrically connected with the backing plate. A mechanism that applies at least a high frequency power as a plasma excitation power to the target via the metal plate is Provided, and the high frequency power has a single frequency or a plurality of frequencies. A plurality of power feed points is arranged in a direction of the rotation shaft at a pitch shorter than a distance of about 1/10 of a half-wavelength of the highest frequency of the high frequency power in a vacuum.

In accordance with a forty fifth aspect of the present invention, there is provided a magnetron sputtering apparatus that includes a substrate to be processed, a target installed to face the substrate and a magnet installed at a side opposite to the substrate across the target, and confines plasma on a surface of the target by forming a magnetic field on the target surface by the magnet. The magnet includes a rotary magnet body installed around a column-shaped rotation shaft in a spiral shape and a stationary outer peripheral body installed in the vicinity of the rotary magnet body in parallel to the target surface. The stationary outer peripheral body is made of a magnet magnetized in a direction perpendicular to the target surface or a ferromagnetic body which is not previously magnetized. The rotary magnet body rotates with the column-shaped rotation shaft, so that a pattern of the magnetic field on the target surface moves as time passes, and a mechanism for generating a magnetic field at a side opposite to the target across the substrate is provided.

In accordance with a forty sixth aspect of the present invention, there is provided a magnetron sputtering apparatus as described in the forty fifth aspect, wherein a mounting table that mounts thereon the substrate may be installed at a side opposite to the target across the substrate, and the mechanism for generating the magnetic field may be a magnet installed in the mounting table.

In accordance with a forty seventh aspect of the present invention, there is provided magnetron sputtering apparatus that includes a substrate to be processed, a target installed to face the substrate and a magnet installed at a side opposite to the substrate across the target, and confines plasma on a surface of the target by forming a magnetic field on the target surface by the magnet. The magnet includes a rotary magnet body installed around a column-shaped rotation shaft in a spiral shape and a stationary outer peripheral body installed in the vicinity of the rotary magnet body in parallel to the target surface. The stationary outer peripheral body is made of a ferromagnetic body. The rotary magnet body rotates with the column-shaped rotation shaft, so that a pattern of the magnetic field on the target surface moves as time passes.

In accordance with a forty eighth aspect of the present invention, there is provided a magnetron sputtering apparatus that includes a substrate to be processed, a target installed to face the substrate and a magnet installed at a side opposite to the substrate across the target, and confines plasma on a surface of the target by forming a magnetic field on the target surface by the magnet. The magnet includes a rotary magnet body installed around a column-shaped rotation shaft in a spiral shape; and a stationary outer peripheral body installed in the vicinity of the rotary magnet body in parallel to the target surface. The stationary outer peripheral body is made of a magnet magnetized in a direction perpendicular to the target surface or a ferromagnetic body which is not previously magnetized. The rotary magnet body includes a first spiral body formed by installing a magnet, which is magnetized such that its surface becomes an S pole or an N pole, at the column-shaped rotation shaft in a spiral shape and a second spiral body formed by installing a ferromagnetic body, which is not previously magnetized, at the column-shaped rotation shaft in a spiral shape to be adjacent to and in parallel to the first spiral body. The rotary magnet body rotates with the column-shaped rotation shaft, so that a pattern of the magnetic field on the target surface moves as time passes.

In accordance with a forty ninth aspect of the present invention, there is provided a magnetron sputtering apparatus as described in the forty seventh aspect or the forty eighth aspect, wherein the rotary magnet body may be configured to have a magnet structure featuring a target use efficiency equal to or higher than about 80%, which is determined by a target consumption distribution determined based on a Larmor radius of electrons confined in the horizontal magnetic field and a curvature radius of the magnetic field.

In accordance with a fiftieth aspect of the present invention, there is provided a magnetron sputtering apparatus as described in the forty ninth aspect, wherein the target consumption distribution may be determined by an erosion half-width which is determined based on the Larmor radius and the curvature radius of the magnetic field.

In accordance with a fifty first aspect of the present invention, there is provided a magnetron sputtering apparatus as described in the fiftieth aspect, wherein the Larmor radius may be determined by using the following formula (1):

[Eq. 1]

$$r_c = 34 \frac{\sqrt{|V_{DC}|(V)}}{B(\text{Gauss})} (\text{mm}) \quad (1)$$

Here, $r_C$ is a Larmor radius, B is a magnetic flux density, and $V_{DC}$ is a self-bias voltage.

In accordance with a fifty second aspect of the present invention, there is provided a magnetron sputtering apparatus as described in the fiftieth aspect or the fifty first, wherein the erosion half-width is determined by using the following formula (2):

[Eq. 2]

$$W = 2\sqrt{2Rr_C} (\text{mm}) \quad (2)$$

Here, W is an erosion half-width and R is a curvature radius of the magnetic field.

In accordance with a fifty third aspect of the present invention, there is provided a magnetron sputtering apparatus as described in any one of the fiftieth aspect to the fifty second aspect, wherein the target consumption distribution may be determined based on a phase average of the erosion half-width when the rotary magnet body is rotated.

In accordance with a fifty fourth aspect of the present invention, there is provided a magnetron sputtering apparatus as described in any one of the forty ninth aspect to the fifty third aspect, wherein the target use efficiency may be determined such that the target consumption distribution is substantially uniform across an entire surface of the target.

In accordance with a fifty fifth aspect of the present invention, there is provided a magnetron sputtering apparatus as described in any one of the forty ninth aspect to the fifty fourth aspect, wherein the rotary magnet body may include a plate magnet set having a plurality of plate magnets installed on the column-shaped rotation shaft to form a plurality of spirals, and, in the magnet structure, a distance between the adjacent plate magnets of the plate magnet set may be set such that the target use efficiency is equal to or higher than about 80%.

In accordance with a fifty sixth aspect of the present invention, there is provided a magnetron sputtering apparatus as described in any one of the forty ninth aspect to the fifty fifth aspect, wherein the rotary magnet body may include a plate magnet set having a plurality of plate magnets installed on the column-shaped rotation shaft in a spiral shape, and in the magnet structure, a thickness of the plate magnet may be set such that the target use efficiency is equal to or higher than about 80%.

In accordance with a fifty seventh aspect of the present invention, there is provided a magnetron sputtering apparatus as described in any one of the forty ninth aspect to the fifty sixth aspect, wherein the rotary magnet body may include a plate magnet set having a plurality of plate magnets installed on the column-shaped rotation shaft in a spiral shape, and in the magnet structure, a width of the plate magnet may be set such that the target use efficiency is equal to or higher than about 80%.

In accordance with a fifty eighth aspect of the present invention, there is provided a magnetron sputtering apparatus as described in any one of the forty ninth aspect to the fifty seventh aspect, wherein the rotary magnet body may include a plate magnet set having a plurality of plate magnets installed on the column-shaped rotation shaft in a spiral shape while forming a single loop or multiple loops, and in the magnet structure, the number of loops may be set such that the target use efficiency is equal to or higher than about 80%.

In accordance with a fifty ninth aspect of the present invention, there is provided a magnetron sputtering apparatus as described in any one of the forty ninth aspect to the fifty eighth aspect, wherein the rotary magnet body may include a plate magnet set having a plurality of plate magnets installed on the column-shaped rotation shaft in a spiral shape, and in the magnet structure, an angle formed between an extending direction of the plate magnets extended in the spiral shape and the axial direction of the rotation shaft may be set such that the target use efficiency is equal to or higher than about 80%.

In accordance with a sixtieth aspect of the present invention, there is provided a magnetron sputtering apparatus as described in the fifty ninth aspect, wherein the angle may be in a range of about 57° to 85°.

In accordance with a sixty first aspect of the present invention, there is provided a magnetron sputtering apparatus as described in any one of the forty ninth aspect to the sixtieth aspect, wherein the rotary magnet body may include a plate magnet set including a plate magnet having an N-pole surface installed on the column-shaped rotation shaft in a spiral shape and a plate magnet having an S-pole surface installed on the column-shaped rotation shaft in a spiral shape to be adjacent to the plate magnet having the N-pole surface, and a width of the plate magnet having the N-pole surface may be different from a width of the plate magnet having the S-pole surface.

In accordance with a sixty second aspect of the present invention, there is provided a magnetron sputtering apparatus as described in the sixty first aspect, wherein the width of the plate magnet having the N-pole surface may be smaller than the width of the plate magnet having the S-pole surface.

In accordance with a sixty third aspect of the present invention, there is provided a magnetron sputtering apparatus as described in the fifty eighth aspect, wherein the number of the loops may be 1 or 2.

In accordance with a sixty fourth aspect of the present invention, there is provided a magnetron sputtering apparatus as described in the sixtieth aspect, wherein the angle may be equal to or larger than about 75°.

In accordance with a sixty fifth aspect of the present invention, there is provided a magnetron sputtering apparatus as described in the fifty sixth aspect, wherein the thickness may be in a range of about 5 to 15 mm.

In accordance with a sixty sixth aspect of the present invention, there is provided a magnetron sputtering apparatus as described in the forty eighth aspect, wherein a configuration of the first spiral body and/or a configuration of the second spiral body are/is set such that the target use efficiency, which is expressed by the following formula (3), is equal to or higher than about 80%:

$$\text{Target use efficiency} = \text{cross sectional area of an erosion part} / \text{An initial cross sectional area of the target} \quad (3)$$

Here, the target use efficiency is calculated when a minimum thickness of the target is about 5% of the initial thickness thereof.

In accordance with a sixty seventh aspect of the present invention, there is provided a magnetron sputtering apparatus as described in the sixty sixth aspect, wherein a distance between the first spiral body and the second spiral body may be set such that the target use efficiency is equal to or higher than about 80%.

In accordance with a sixty eighth aspect of the present invention, there is provided a magnetron sputtering apparatus as described in the sixty seventh aspect, wherein the distance may be in a range of about 11 to 17 mm.

In accordance with a sixty ninth aspect of the present invention, there is provided a magnetron sputtering apparatus as described in any one of the sixty sixth aspect to the sixty eighth aspect, wherein plate thicknesses of the first spiral body and the second spiral body may be set such that the target use efficiency is equal to or higher than about 80%.

In accordance with a seventieth aspect of the present invention, there is provided a magnetron sputtering apparatus as described in the sixty ninth aspect, wherein the plate thicknesses may be in a range of about 5 to 15 mm.

In accordance with a seventy first aspect of the present invention, there is provided a magnetron sputtering apparatus as described in any one of the sixty sixth aspect to the seventieth aspect, wherein the number of loops of the first spiral body and the second spiral body may be set such that the target use efficiency is equal to or higher than about 80%.

In accordance with a seventy second aspect of the present invention, there is provided a magnetron sputtering apparatus as described in the seventy first aspect, wherein the number of the loops may be in a range of about 1 to 5.

In accordance with a seventy third aspect of the present invention, there is provided a magnetron sputtering apparatus as described in any one of the sixty sixth aspect to the seventy second aspect, wherein widths of the first spiral body and the second spiral body may be set differently such that the target use efficiency is equal to or higher than about 80%.

In accordance with a seventy fourth aspect of the present invention, there is provided a magnetron sputtering apparatus as described in the seventy third aspect, wherein, of the first spiral body and the second spiral body, the width of the spiral body that forms an N-pole on an outer side in a diametrical direction thereof may be set to be larger than the width of the spiral body that forms an S-pole on an outer side in a diametrical direction thereof.

In accordance with a seventy fifth aspect of the present invention, there is provided a magnetron sputtering apparatus as described in any one of the sixty sixth aspect to the seventy fourth aspect, wherein an angle between an extending direction of the first spiral body and the second spiral body and the axial direction of the rotation shaft may be set such that the target use efficiency is equal to or higher than about 80%.

In accordance with a seventy sixth aspect of the present invention, there is provided a magnetron sputtering apparatus as described in the seventy fifth aspect, wherein the angle may be in a range of about 57° to 84°.

In accordance with a seventy seventh aspect of the present invention, there is provided a magnetron sputtering apparatus as described in the seventy fifth aspect, wherein the angle may be in a range of about 75° to 85°.

In accordance with a seventy eighth aspect of the present invention, there is provided a magnetron sputtering apparatus as described in the forty seventh aspect or the forty eighth aspect, wherein the magnetron sputtering apparatus may further include a holder configured to mount the substrate; and a backing plate installed to face the holder so as to hold the target; and a plasma shielding plate installed between the holder and the backing plate. The shielding plate may be provided with a slit in a space between the substrate and the target, and a difference between a width of the slit and a width of the plasma may be within about 20 mm.

In accordance with a seventy ninth aspect of the present invention, there is provided a magnetron sputtering apparatus as described in the forty seventh aspect or the forty eighth aspect, wherein the magnetron sputtering apparatus may further include a holder configured to mount the substrate; and a backing plate installed to face the holder so as to hold the target; and a plasma shielding plate installed between the holder and the backing plate. The shielding plate may be provided with a slit in a space between the substrate and the target, and a distance between the shielding plate and the target may be in the range of about 3 to 15 mm.

In accordance with an eightieth aspect of the present invention, there is provided a magnetron sputtering apparatus as described in the forty seventh aspect or the forty eighth aspect, wherein the magnetron sputtering apparatus may further include a moving magnet configured to be movable in the apparatus. A strong magnetic field, generated depending on a rotation coordinate of the rotary magnet set, may be weakened by moving the moving magnet along with a rotation of the rotary magnet set.

In accordance with an eighty first aspect of the present invention, there is provided a magnetron sputtering apparatus as described in the eightieth aspect, wherein the moving magnet may be movably installed between the rotary magnet set and the peripheral plate magnet or a stationary outer peripheral ferromagnetic body.

In accordance with an eighty second aspect of the present invention, there is provided a magnetron sputtering apparatus as described in the eighty first aspect, wherein the moving magnet may have a rotation shaft and may be rotatable about the rotation shaft and may be magnetized in a direction perpendicular to a rotation direction. The moving magnet may be installed between an end portion of the column-shaped rotation shaft and the outer peripheral plate magnet or the stationary outer peripheral ferromagnetic body such that the rotation shaft of the moving magnet is perpendicular to the axial direction of the column-shaped rotation shaft. Further, the moving magnet may be rotated so as to weaken a magnetic field generated depending on the rotation coordinate of the rotary magnet set when a polarity of an end portion of the rotary magnet set becomes the same as a polarity of a surface of the stationary outer peripheral magnet or the stationary outer peripheral ferromagnetic body, the surface facing the end portion.

In accordance with an eighty third aspect of the present invention, there is provided a magnetron sputtering apparatus as described in the eighty first aspect, wherein the moving magnet may have a rotation shaft parallel to a rotation axis of the rotary magnet set between a lateral surface of the column-shaped rotation shaft and the stationary outer peripheral plate magnet or the stationary outer peripheral ferromagnetic body, and may be rotatable about the rotation shaft and may be magnetized in a direction perpendicular to a rotation direction. Further, the moving magnet may be rotated so as to weaken a magnetic field generated depending on the rotation coordinate of the rotary magnet set when a polarity of a part of lateral surface of the rotary magnet set becomes the same as a polarity of a surface of the stationary outer peripheral magnet or the stationary outer peripheral ferromagnetic body, the lateral surface facing the surface.

In accordance with an eighty fourth aspect of the present invention, there is provided a magnetron sputtering apparatus as described in any one of the eighty first aspect to the eighty third aspect, wherein the moving magnet may be installed between a lateral surface of the column-shaped rotation shaft and the outer peripheral plate magnet or the stationary outer peripheral ferromagnetic body to be movable in a direction parallel to a rotation axis of the rotary magnet set. Further, the moving magnet may be moved in the direction perpendicular to the rotation axis of the rotary magnet set so as to weaken a magnetic field generated depending on the rotation coordinate of the rotary magnet set when a polarity of a part of lateral surface of the rotary magnet set becomes the same as a polarity of a part of lateral surface of the stationary outer peripheral magnet or the stationary outer peripheral ferromagnetic body, the lateral surface facing the surface.

In accordance with an eighty fifth aspect of the present invention, there is provided a magnetron sputtering apparatus as described in any one of the eighty first aspect to the eighty fourth aspect, wherein the moving magnet may be a rotary magnet configured to be freely rotated.

In accordance with an eighty sixth aspect of the present invention, there is provided a magnetron sputtering apparatus as described in any one of the eightieth aspect to the eighty fifth aspect, wherein a surface of the moving magnet may be covered with a non-magnetic substance.

In accordance with an eighty seventh aspect of the present invention, there is provided a magnetic field control method of a magnetron sputtering apparatus as described in any one of the eightieth aspect to the eighty sixth aspect, the method including: when, depending on a rotation coordinate of the rotary magnet set, a polarity of a facing surface of the rotary magnet set becomes the same as a polarity of a facing surface of the stationary outer peripheral magnet or the stationary outer peripheral ferromagnetic body, moving the moving magnet such that its polarity opposite to the polarity of the facing surfaces faces toward the facing surfaces.

In accordance with an eighty eighth aspect of the present invention, there is provided a magnetron sputtering apparatus as described in the forty seventh aspect or the forty eighth aspect, wherein the magnetron sputtering apparatus may further include a collimator configured to allow travelling directions of sputtered target particles to be uniform.

In accordance with an eighty ninth aspect of the present invention, there is provided a magnetron sputtering apparatus as described in the eighty eighth aspect, wherein the collimator may be installed between the substrate and the target, and the travelling direction of the sputtered target particles may be allowed to be coincident with a thickness direction of a film to be formed.

In accordance with a ninetieth aspect of the present invention, there is provided a magnetron sputtering apparatus as described in the eighty ninth aspect, wherein the collimator may be fixed to be adjacent to the target.

In accordance with a ninety first aspect of the present invention, there is provided a magnetron sputtering apparatus as described in the eighty ninth aspect, wherein the collimator may be configured to be movable according to a movement of the substrate.

In accordance with a ninety second aspect of the present invention, there is provided a magnetron sputtering apparatus as described in any one of the eighty eighth aspect to the ninety first aspect, wherein the magnet may include a rotary magnet set having a plurality of plate magnets installed on the column-shaped rotation shaft in a spiral shape to be rotatable and a stationary outer peripheral plate magnet installed in the vicinity of the rotary magnet set in parallel to the surface of the target and magnetized in a direction perpendicular to the surface of the target.

In accordance with a ninety third aspect of the present invention, there is provided a magnetron sputtering apparatus as described in any one of the eighty eighth aspect to the ninety second aspect, wherein the collimator may be made of at least one of Ti, Ta, Al, and stainless steel.

In accordance with a ninety fourth aspect of the present invention, there is provided a magnetron sputtering apparatus as described in any one of the eighty eighth aspect to the ninety third aspect, wherein the magnetron sputtering apparatus may further include a removing unit which removes sputtered particles of the target material adhered to the collimator.

In accordance with a ninety fifth aspect of the present invention, there is provided a magnetron sputtering apparatus as described in the ninety fourth aspect, wherein the removing unit may remove the sputtered particles of the adhered target material by applying a voltage to the collimator.

In accordance with a ninety sixth aspect of the present invention, there is provided a target collimation apparatus installed in a magnetron sputtering apparatus as described in the forty seventh aspect or the forty eighth aspect and configured to allow travelling directions of sputtered target particles to be uniformed, the apparatus including: a collimator configured to allow the travelling direction of the sputtered target particles to be uniformed.

In accordance with a ninety seventh aspect of the present invention, there is provided a target collimation apparatus as described in the ninety sixth aspect, wherein the collimator may be made of at least one of Ti, Ta, Al, and stainless steel.

In accordance with a ninety eighth aspect of the present invention, there is provided a target collimation apparatus as described in the ninety seventh aspect, wherein the target collimation apparatus may further include a removing unit which removes sputtered particles of the target material adhered to the collimator.

In accordance with a ninety ninth aspect of the present invention, there is provided a target collimation apparatus as described in the ninety eighth aspect, wherein the removing unit may remove sputtered particles of the target material by applying a voltage to the collimator.

In accordance with a hundredth aspect of the present invention, there is provided a magnetron sputtering apparatus as described in any one of the forty fourth aspect to the eighty sixth aspect and the eighty eighth aspect to the ninety ninth aspect, wherein the rotary magnet body and the stationary outer peripheral body may be movable in the direction perpendicular to the surface of the target.

In accordance with a hundred first aspect of the present invention, there is provided a magnetron sputtering apparatus as described in any one of the forty fourth aspect to the eighty sixth aspect and the eighty eighth aspect to the hundredth aspect, wherein the rotary magnet body and the stationary outer peripheral body may be installed in a space surrounded by a target member, a backing plate to which the target member is fixed, and a wall extended from the vicinity of the backing plate, and the space may be capable of being depressurized.

In accordance with a hundred second aspect of the present invention, there is provided a magnetron sputtering apparatus as described in any one of the forty fourth aspect to the eighty sixth aspect and the eighty eighth aspect to the hundred first aspect, wherein the target may be fixed to a backing plate and a thickness of the backing plate may be thinner than an initial thickness of the target.

In accordance with a hundred third aspect of the present invention, there is provided a magnetron sputtering apparatus as described in any one of the fortieth aspect to the eighty sixth aspect and the eighty eighth aspect to the hundred second aspect, wherein a unit that relatively moves the substrate in a direction intersecting with the axial direction of the column-shaped rotation shaft may be provided.

In accordance with a hundred fourth aspect of the present invention, there is provided a magnetron sputtering apparatus including a plurality of magnetron sputtering apparatuses as described in any one of the fortieth aspect to the eighty sixth aspect and the eighty eighth aspect to the hundred second aspect provided in parallel to each other in an axial direction of the column-shaped rotation shaft and a unit that relatively moves the substrate in a direction intersecting with the axial direction of the column-shaped rotation shaft.

In accordance with a hundred fifth aspect of the present invention, there is provided a magnetron sputtering apparatus including a plurality of the magnetron sputtering apparatuses as described in any one of the fortieth aspect to the eighty sixth aspect and the eighty eighth aspect to the hundred second aspect and a unit that relatively moves the substrate in a direction intersecting with the axial direction of the column-shaped rotation shaft. Each magnetron sputtering apparatus has a target material different to each other, and is provided in parallel to each other in an axial direction of the column-shaped rotation shaft.

In accordance with a hundred sixth aspect of the present invention, there is provided a magnetron sputtering method for depositing a material of the target on a substrate to be processed while rotating the column-shaped rotation shaft by using a magnetron sputtering apparatus as described in any one of the first aspect to the eighty sixth aspect and the eighty eighth aspect to the hundred fifth aspect.

In accordance with a hundred seventh aspect of the present invention, there is provided an electronic device manufacturing method including performing a film formation on a substrate to be processed by using a sputtering method as described in the hundred sixth aspect.

In accordance with a hundred eighth aspect of the present invention, there is provided a magnetic recording medium manufacturing method including performing a film formation on a substrate to be processed by using a sputtering method as described in the hundred sixth aspect.

In accordance with a hundred ninth aspect of the present invention, there is provided a product including a thin film formed by a sputtering method as described in the hundred sixth aspect.

Effect of the Invention

In accordance with the present invention, there is provided a magnetron sputtering apparatus capable of increasing a film forming rate and preventing a local abrasion of a target to achieve uniform consumption thereof, thereby increasing a lifetime of the target, and also having a magnet rotating mechanism and a long lifetime without imposing a great burden on a rotation device or a column-shaped rotation shaft.

BRIEF DESCRIPTION OF THE DRAWINGS

FIG. 15A is a schematic configuration view illustrating a magnetron sputtering apparatus in accordance with a fourth embodiment of the present invention, and FIG. 15B is a diagram when viewed from a direction of an arrow X of FIG. 15A;

FIG. 16 is a schematic configuration view illustrating a magnetron sputtering apparatus in accordance with a fifth embodiment of the present invention;

FIG. 17 is a schematic diagram showing a relationship between an erosion half-width and a Larmor radius;

FIGS. 21A and 21B are cross sectional views of a surface of a target 1 perpendicular to a rotation axis of the column-shaped rotation shaft 2 in the sixth embodiment of the present invention, wherein FIG. 21A shows the target 1 before it is used and FIG. 21B shows the target 1 after it is used (consumed);

EXPLANATION OF CODES

Figure 1:
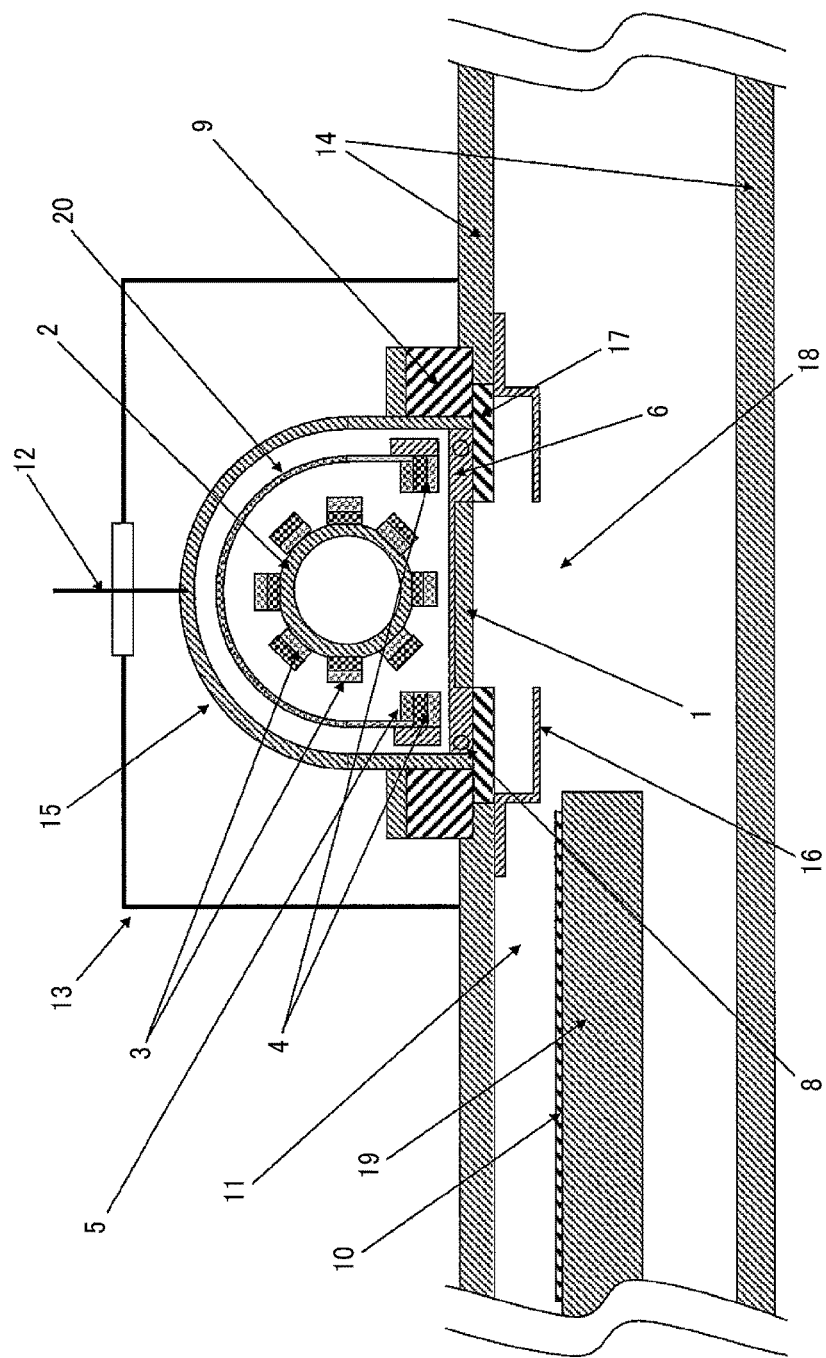
FIG. 1 is a schematic configuration view of a magnetron sputtering apparatus in accordance with a first embodiment of the present invention.

1: Target
2: Column-shaped rotation shaft
3: Spiral-shaped rotary magnet sets
4: Stationary outer peripheral plate magnet
5: Outer peripheral paramagnetic body
6: Backing plate
8: Coolant passage
9: Insulating member
10: Target substrate
11: Space in chamber
12: Feeder line
13: Cover
14: Outer wall
15: Paramagnetic body
16: Plasma shield member
17: Insulating member
18: Slit
19: Mounting table
20: Space

BEST MODE FOR CARRYING OUT THE INVENTION

Hereinafter, embodiments of the present invention will be described with reference to the accompanying drawings.

First Embodiment

A first embodiment of the present invention will be explained in detail with reference to the accompanying drawings.

FIG. 1 is a cross sectional view illustrating a configuration of a magnetron sputtering apparatus (rotary magnet sputtering apparatus) in accordance with the first embodiment of the present invention.

In FIG. 1, a reference numeral 1 denotes a target; 2, a column-shaped rotation shaft; 3, a plurality of plate magnet sets arranged in a spiral shape on a surface of the rotation shaft 2; 4, a stationary outer peripheral plate magnet positioned at an outer periphery; 5, an outer peripheral magnetic body positioned on the stationary outer peripheral plate magnet 4 to be opposite to the target; 6, a backing plate to which the target 1 is fixed; 15, a magnetic body configured to enclose the column-shaped rotation shaft 2 and the spiral-shaped plate magnet sets 3 except their target-facing sides; 8, a passage through which a coolant passes; 9, an insulating member; 10, a substrate to be processed; 19, a mounting table on which the substrate is to be placed; 11, a space in a processing chamber; 12, a feeder line; 13, a cover electrically connected with the processing chamber; 14, an outer wall forming the processing chamber; 16, a plasma shield member electrically connected with the outer wall 14; 17, an insulating member having a high plasma resistance; and 18, a slit provided at the plasma shield member 17.

A DC power supply, a RF power supply and a matching unit are connected to the feeder line 12. A power for plasma excitation is supplied from the DC power supply and the RF power supply to the backing plate 6 and the target 1 via the matching unit, the feeder line 12 and a housing, and plasma is excited on a surface of the target. The plasma excitation may be enabled only by a DC power or a RF power. Since a plasma density is greatly increased if the RF power is applied, it may be possible to apply only the RF power to increase an ion irradiation amount onto the substrate 10 in a film forming process. Further, in order to increase a film forming rate as well as the ion irradiation amount, both the RF power and the DC power can be applied. Meanwhile, the plasma excitation may be carried out only by the DC power when it is required to decrease the ion irradiation amount. In this way, a means for the plasma excitation or a power level may be selected depending on film forming species or film forming conditions. Further, when the target 1 made of an insulating material is used, the plasma is excited by the RF power. Although a frequency of the RF power may be typically selected within a range of several 100 kHz to several 100 MHz, it is desirable to select a high frequency in order to obtain high density and low electron temperature plasma. In the present embodiment, a frequency of about 13.56 MHz is employed.

The plasma shield member 16 also serves as a ground plate for the RF power. The ground plate enables efficient plasma excitation even if the substrate 10 is in an electrically floating state. The magnetic body 15 has a magnetic shield effect against a magnetic field generated from magnets and also has an effect of reducing a variation in the magnetic field due to external factors in the vicinity of the target.

Figure 2:
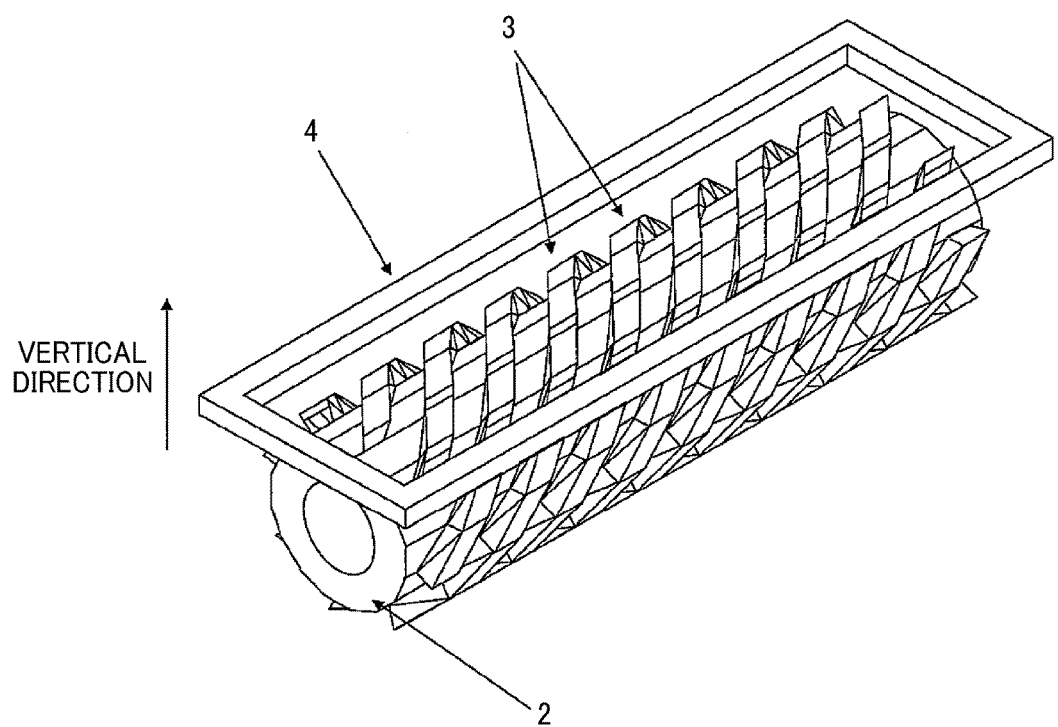
FIG. 2 is a perspective view describing, in more detail, a magnet part of the magnetron sputtering apparatus shown in FIG. 1.

To describe the magnet part in more detail, FIG. 2 provides a perspective view of the column-shaped rotation shaft 2, the plurality of spiral-shaped plate magnet sets 3 and the stationary outer peripheral plate magnet 4. Here, the plurality of spiral-shaped plate magnet sets 3 serves as rotary magnet sets which are rotated as the column-shaped rotation shaft 2 is rotated.

Although the column-shaped rotation shaft 2 may typically be made of a stainless steel, it may be desirable to form the column-shaped rotation shaft 2 partially or entirely with a magnetic material having a low magnetic reluctance, such as a Ni—Fe-based alloy having a high magnetic permeability or a Fe-based material. Further, in order to achieve a strong magnetic flux density on the target surface more efficiently, it is desirable that a saturated magnetic flux density is great. In the present embodiment, the column-shaped rotation shaft 2 is fabricated by using SS400 (having a magnetic permeability equal to or greater than about 100 and a saturated magnetic flux density of about 2 T), which is a rolled steel for structures and contains Fe as a major component. The column-shaped rotation shaft 2 can be rotated by a gear unit and a motor (not shown).

The column-shaped rotation shaft 2 has a cross section of a regular hexadecagon and a length of each side is about 16.7 mm. A number of rhombus-shaped plate magnets are installed on each surface of the column-shaped rotation shaft 2, thus forming the plurality of spiral-shaped plate magnet sets 3. The column-shaped rotation shaft 2 has a configuration in which the magnets are installed at its outer periphery, and it can be made thick easily, and it has a strength enough to endure bending caused by a magnetic force applied to the magnets.

Desirably, each plate magnet constituting the spiral-shaped plate magnet sets 3 has a high residual magnetic flux density, a high coercive force, and a high energy product, such that a strong magnetic field is stably generated. For example, a Sm—Co-based sintered magnet having a residual magnetic flux density of about 1.1 T, more desirably, a Nd—Fe—B-based sintered magnet having a residual magnetic flux density of about 1.3 T may be employed. In the present embodiment, a Nd—Fe—B-based sintered magnet is used.

Each plate magnet of the spiral-shaped plate magnet sets 3 is magnetized in a direction perpendicular to its plate surface, and the plate magnets are fixed to the column-shaped rotation shaft 2 in a spiral shape to form a plurality of spirals. The adjacent spirals in an axial direction of the column-shaped rotation shaft have opposite magnetic poles, i.e., an N pole and an S pole on outer sides of the column-shaped rotation shaft in its diametrical direction.

When viewed from the target 1, the stationary outer peripheral plate magnet 4 surrounds the rotary magnet sets made up of the spiral-shaped plate magnet sets 3, and it is magnetized such that a side facing the target 1 is an S pole. For the same reason as each plate magnet of the spiral-shaped plate magnet sets 3, a Nd—Fe—B-based sintered magnet is used as the stationary outer peripheral plate magnet 4.

Further, in order to prevent a temperature rise of the target, a coolant is circulated through the passage 8 to cool the target. Additionally or alternatively, cooling units may be installed in both spaces which are in the vicinity of upper sides of both ends of the backing plate 6 and below the rotary magnet sets 3. Moreover, for example, by setting pressures in both spaces (depressurized) above and below the backing plate and the target to be substantially same, the backing plate 6 can be set to be thinner than an initial thickness of the target 1 and, desirably, to be about equal to or less than about 30% of the initial thickness of the target.

Figure 3:
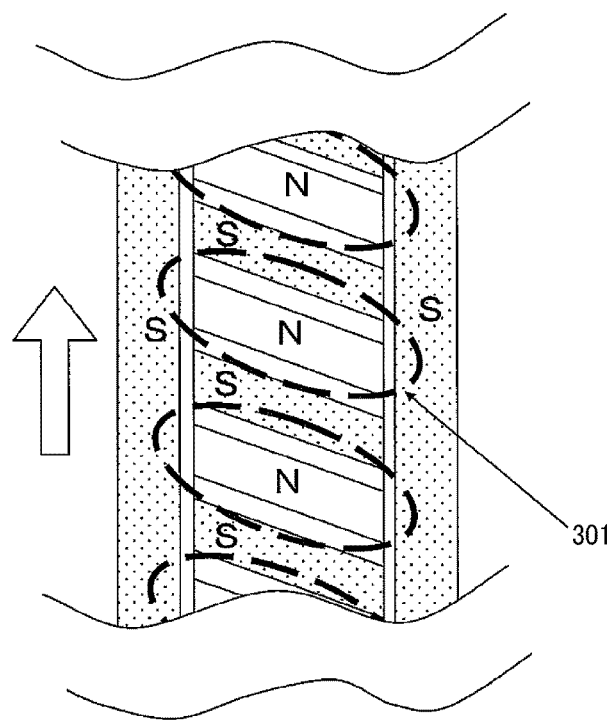
FIG. 3 is a view explaining an erosion formation in the present invention, wherein S poles are indicated by dots.

Now, referring to FIG. 3, an erosion formation in the present embodiment will be explained in detail. As stated above, in case that the spiral-shaped plate magnet sets 3 are formed by arranging the plurality of plate magnets on the column-shaped rotation shaft 2, an N pole of the plate magnet is substantially surrounded by S poles of other plate magnets when the spiral-shaped plate magnet sets 3 are viewed from the target side. FIG. 3 provides a schematic diagram showing such a configuration. In this configuration, magnetic force lines start from the N pole of the plate magnet 3 and end at the surrounding S poles. As a result, a multitude of closed horizontal magnetic field regions (plasma loops) 301 are formed on the target surface spaced apart from a plate magnet surface at a certain distance. Further, the multitude of plasma loops 301 are moved as the column-shaped rotation shaft 2 is rotated. In FIG. 3, the plasma loops 301 move in a direction indicated by an arrow. Moreover, the plasma loops 301 are sequentially generated from one end of the rotary magnet sets 3 and sequentially disappear at the other end thereof.

Further, in the present embodiment, although the cross section of the column-shaped rotation shaft 2 has the regular hexadecagon shape and the plate magnets are fixed to each surface, the cross section thereof may have a regular polygonal shape (e.g., a regular polygon with 32 sides) having a greater number of sides and the plate magnets are more densely fastened thereto to obtain a smoother spiral shape. Alternatively, to cut manufacturing cost, it may be possible to employ a polygonal shape (e.g., a regular octagon shape) having a smaller number of sides as long as horizontal magnetic field loops are formed on the target surface. Alternatively, in order to make the adjacent plate magnets forming the spirals become close to each other, a cross section of the plate magnet may not be a rectangular shape but it may be a trapezoid shape whose outer side is greater in a diametrical direction of the rotation shaft.

Now, referring to FIG. 4, an effect of configuring the column-shaped rotation shaft 2 as a magnetic body will be explained.

Figure 4:
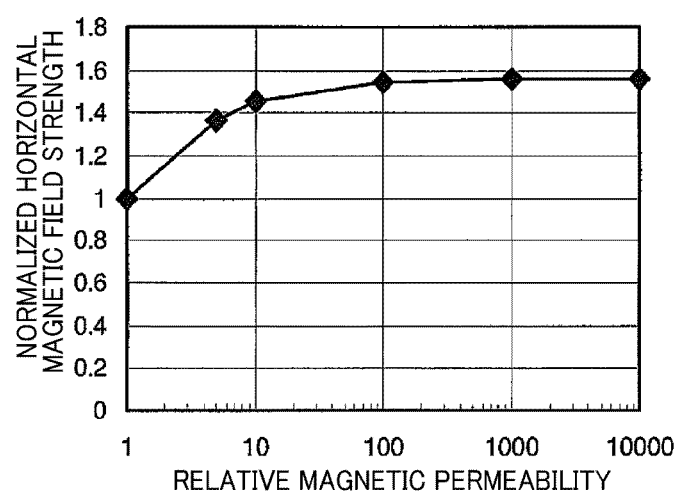
FIG. 4 is a graph showing a relationship between a horizontal magnetic field strength and a relative magnetic permeability of a column-shaped rotation shaft used in the magnetron sputtering apparatus of FIG. 1.

In FIG. 4, a vertical axis and a horizontal axis indicate a horizontal magnetic field strength of the plasma loop 301 and a relative magnetic permeability of the column-shaped rotation shaft 2, respectively, and the graph shows a dependency of the horizontal magnetic field strength upon the relative magnetic permeability of the column-shaped rotation shaft 2. In FIG. 4, it is normalized at a relative magnetic permeability of 1. As can be seen from FIG. 4, the horizontal magnetic field strength increases with a rise of the relative magnetic permeability of the column-shaped rotation shaft 2. Especially, when the relative magnetic permeability is equal to or greater than 100, an increment of the magnetic field strength is about 60%. It is because magnetic force lines can be generated on the target efficiently as a result of reducing a magnetic reluctance of the plate magnets, which form a spiral, on the side of the column-shaped rotation shaft. Thus, a plasma confining effect can be improved when the plasma is excited, and damage inflicted on the substrate can be reduced due to a reduction of an electron temperature of the plasma. Furthermore, as a plasma density increases, a film forming rate can be enhanced.

Figure 5:
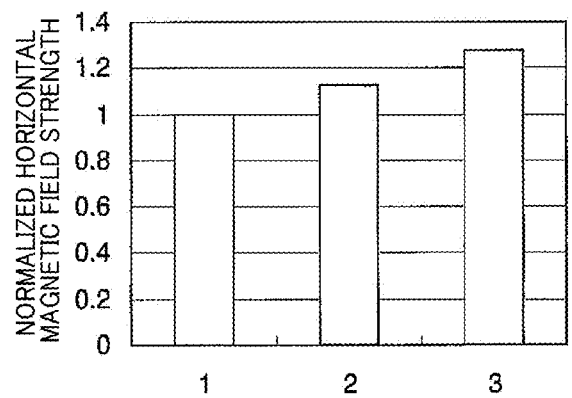
FIG. 5 is a graph showing a variation of a horizontal magnetic field strength in a case where a stationary outer peripheral paramagnetic body, which forms a magnetic circuit with respect to a stationary outer peripheral plate magnet, is installed.

Further, as shown in FIG. 5, in a case where the stationary outer peripheral paramagnetic body 5 is installed below the stationary outer peripheral plate magnet 4, the horizontal magnetic field strength is found to be increased by about 10% as compared to a case where no stationary outer peripheral paramagnetic body 5 is installed. Further, in a case where a magnetic circuit having a low magnetic reluctance is formed between the rotary magnet set and the stationary outer peripheral plate magnet by extending a part of the stationary outer peripheral paramagnetic body 5 to a portion adjacent to the column-shaped rotation shaft 2 to be adjacent to the magnetic body portion of the column-shaped rotation shaft 2 via ferrofluid, it is found that the horizontal magnetic field strength is increased by about 30% and a film forming efficiency is improved.

The column-shaped rotation shaft 2 is desirably configured to be light-weighted with a hollow structure so as to suppress its deformation when the apparatus is scaled-up and to be rotated by a small torque. Here, it was examined how thin the magnetic body may be to achieve a magnetic circuit forming effect.

Figure 10:
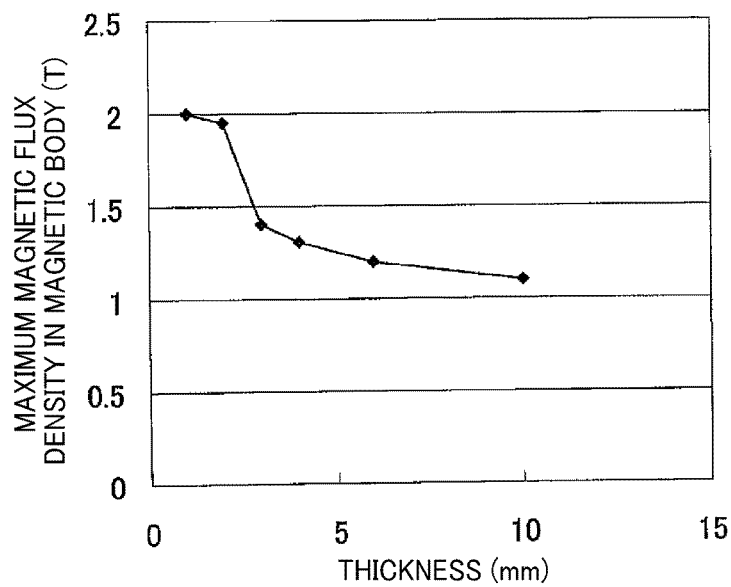
FIG. 10 is a graph showing a relationship between a thickness of a magnetic body and a maximum magnetic flux density generated in the magnetic body.

FIG. 10 shows a relationship between a thickness of the magnetic body and a maximum magnetic flux density generated in the magnetic body. A residual magnetic flux density of the spiral-shaped magnet (Ne—Fe—B-based magnet) is about 1.3 T; a magnetic permeability of the magnetic body (SS400) is about 100; and a saturated magnetic flux density is about 2 T.

The thickness was varied from about 1 mm to 10 mm. As can be seen from the figure, since the magnetic field in the magnetic body is almost saturated within the thickness range of about 1 mm to 2 mm, a magnetic circuit forming effect is not shown in this range. If the thickness is about 4 mm, it is found that the maximum magnetic flux density in the magnetic body becomes about 1.3 T which is equivalent to about 65% of a maximum saturated magnetic flux density, so that the magnetic circuit forming effect is exhibited. If the thickness is about 6 mm, a magnetic flux density in the entire region of the magnetic body becomes about 1.2 T or less, which is equivalent to or less than about 60% of the maximum saturated magnetic flux density of the magnetic body, so that it becomes smaller than the residual magnetic flux density of the magnet. In this case, it is found out that a horizontal magnetic field on the target surface exceeds about 500 Gauss and such an effect does not change even if the thickness is further increased. Thus, by setting a thickness of the magnetic body to be about 6 mm, a light-weight design and a magnetic circuit formation can be achieved at the same time.

In the present experiment example, the spiral magnet structure has 8 spirals, and the adjacent spirals in an axial direction of the column-shaped rotation shaft 2 have opposite magnetic poles, i.e., an N pole and an S pole on outer sides of the column-shaped rotation shaft in its diametrical direction. That is, there are provided 4 spiral plate magnet sets which have the N pole on outer sides in a diametrical direction, and 4 spiral plate magnet sets which have the S pole on outer sides in a diametrical direction. Although at least two spirals are necessary to form opposite magnetic poles, i.e., an N pole and an S pole on outer sides in a diametrical direction, an 8-spiral structure is employed in the present invention. Therefore, when the column-shaped rotation shaft and the spiral plate magnet sets are viewed from a direction perpendicular to an axis of the column-shaped rotation shaft, an acute angle (hereinafter, referred to as a spiral angle) between a direction of a row of magnets forming the spiral and an axial direction of the column-shaped rotation shaft is set to be about 41°, so that a sharply inclined spiral structure is obtained.

Figure 11:
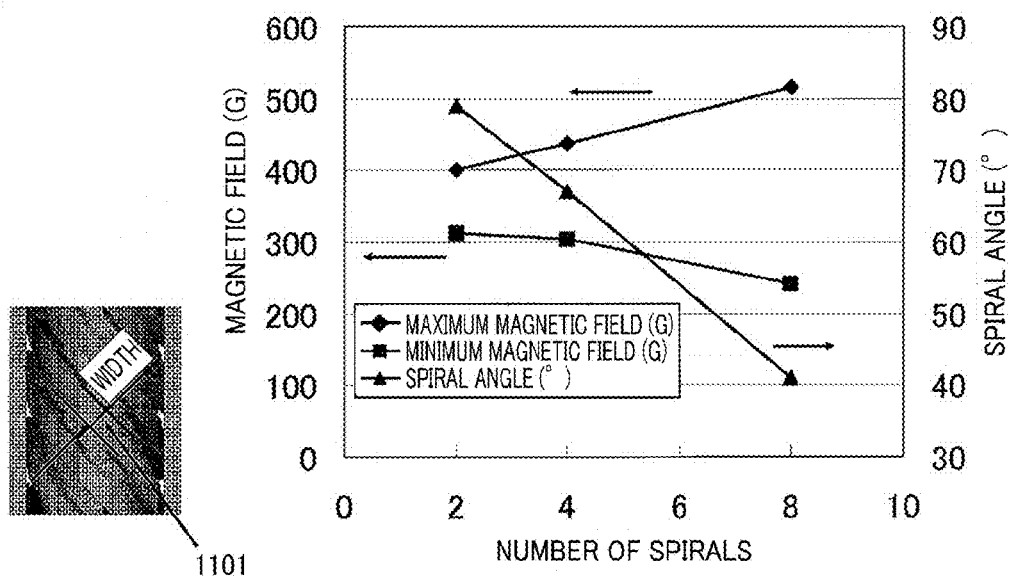
FIG. 11 is a graph showing a relationship between the number of spirals of spiral-shaped magnet sets, and a magnetic field strength, and a spiral angle.

FIG. 11 shows the number of spirals of the spiral magnet sets, and the corresponding spiral angles, and a maximum horizontal magnetic field and a minimum horizontal magnetic field on closed plasma loops. A thickness of the spiral magnet is set to be about 12 mm and a substantial width 1101 shown in FIG. 11 is 11 mm. It can be seen that, if the number of the spirals increases, the spiral angle is reduced while the maximum horizontal magnetic field is increased. It can be seen that, if the 8-spiral structure is employed as in the present embodiment, the spiral angle becomes 41° and, at the same time, the maximum horizontal magnetic field on the plasma loops exceeds 500 Gauss. In this manner, if the thickness and the width of the magnet are once selected, the horizontal magnetic field can be efficiently generated by reducing the spiral angle by increasing the number of the spirals. Such an effect is found to be dominant in case the spiral angle is in the range of about 30° to 70°, desirably, 35° to 50°.

From the above, it can be seen that the horizontal magnetic field of the erosion area 301, i.e., the strength of a magnetic field parallel to the target surface exceeds 500 Gauss, so that strength sufficient enough for confining the plasma can be obtained.

In order to form a closed loop of high-density plasma, it is necessary to install a stationary magnet around a rotary magnet. However, it is also required to reduce a force and a torque generated at the column-shaped rotation shaft 2 due to the stationary magnet so as to operate the apparatus stably for a long period of time.

Figure 8A:
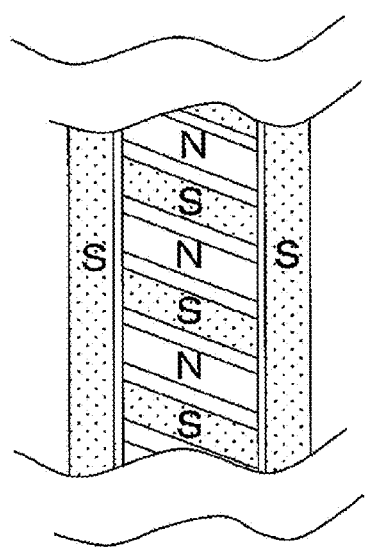
FIG. 8A is a diagram for describing a configuration in which a single spiral-shaped plate magnet set is installed on a column-shaped rotation shaft and a function thereof.
Figure 8B:
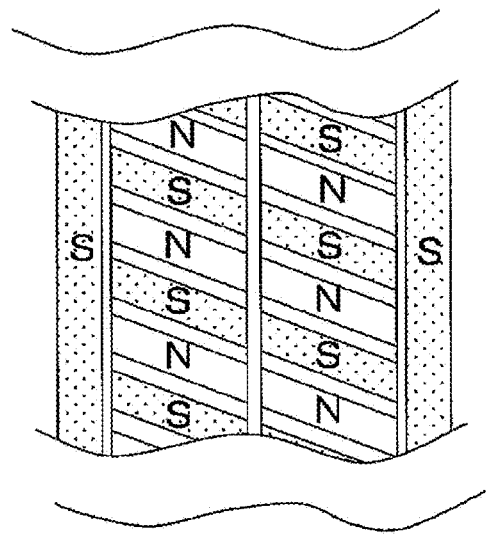
FIG. 8B is a diagram for describing a configuration in which a plurality of spiral-shaped plate magnet sets is installed on the column-shaped rotation shaft and a function thereof, wherein S poles are indicated by dots.

For example, as shown in FIG. 8B, though a configuration, in which a plurality of column-shaped rotation shafts where plate magnets are arranged in a spiral shape, contributes to a throughput improvement by enlarging an erosion area and a film forming area on the target substrate, the adjacent rotation shafts need to have same-polarity magnets to form a closed high-density plasma loop. Accordingly, a repulsive force and a torque generated at the column-shaped rotation shaft increase, which is unsuitable for the purpose of reducing them.

In the present experiment example, as shown in FIG. 8A, spiral structures having opposite polarities are arranged alternately, so that surrounding stationary magnets are magnetized in the same vertical direction. Therefore, when viewed from the surrounding magnets, N poles and S poles of the rotary magnet sets become alternately close, so that a repulsive force and an attractive force are offset, whereby the force and the torque are substantially applied only at both end portions of the rotation shaft. In the present experiment example, the force and the torque applied to the column-shaped rotation shaft was measured, and the force in a vertical direction was about 220 N and the force in a horizontal direction (rotational direction) was about 60 N. Further, a rotation torque was about 0.75 (N·m). Compared to a typical example of a conventional apparatus, both values can be greatly reduced. Thus, the column-shaped rotation shaft 2 can be easily rotated by a small motor.

Figure 6:
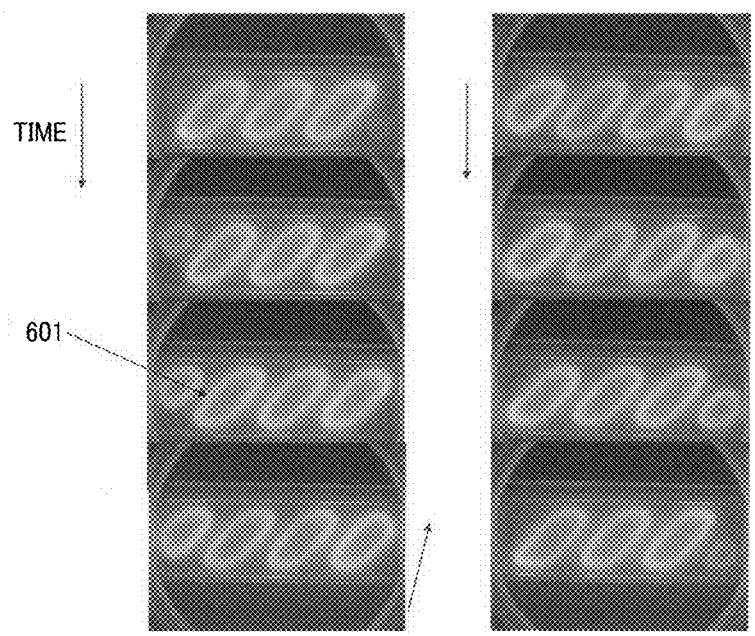
FIG. 6 is a photograph showing a change of plasma on a surface of a target as time passes.
Figure 7:
FIG. 7 is a photograph showing a state where a target is consumed for a long period of time.

FIG. 6 illustrates a state where plasma excitation is performed while rotating the column-shaped rotation shaft 2. FIG. 6 provides photographs showing a change of plasma on the target surface as time passes. As for conditions of the plasma excitation, an argon gas was introduced at a rate of about 1000 cc per minute, and an RF power of about 13.56 MHz was applied at a power level of about 800 W. Further, the column-shaped rotation shaft 2 was rotated at about 1 Hz. Plasma could be stably excited until the column-shaped rotation shaft 2 was rotated up to about 5 Hz. As can be seen from the left photograph of FIG. 6 (which shows, from top to bottom, a state of change as time passes), a plasma loop (erosion loop) 601 is stably generated from a left end of the rotation shaft and is moved with the rotation of the shaft. Further, as can be seen from the right photograph of FIG. 6 (which shows, from top to bottom, a state of change as time passes), the plasma loop 601 disappears stably to a right end of the rotation shaft. Further, FIG. 7 illustrates an image of a consumed state of the target after it has been discharged for a long time. From the figure, it can be seen that the surface of the target 1 is consumed not locally but uniformly.

Meanwhile, if the backing plate 6 becomes thinner, the target 1 becomes closer to the magnets, so that the horizontal magnetic field strength on the surface of the target 1 is further increased. If the horizontal magnetic field strength increases, the plasma confining effect improves, so that the film forming rate increases or the plasma excitation efficiency improves. Thus, by enabling the space 20 to be depressurized and setting the backing plate 6 to have a thickness smaller than the initial thickness of the target 1, the film forming rate can be further improved.

Moreover, since the target 1 is uniformly consumed and the magnets is moved in a vertical direction according to the consumption of the target 1, a horizontal magnetic field having high reproducibility and the same strength can always be formed at all positions on the target surface, so that film formation reproducibility improves when the apparatus is continuously operated for a long period of time.

Second Embodiment

A second embodiment of the present invention will be explained in detail with reference to FIG. 12. Descriptions of the same parts as those of the aforementioned embodiment will be omitted for the simplicity of description. A magnetron sputtering apparatus in accordance with the present invention has two spirals. It can be seen from FIG. 11 that in case of two spirals, a difference between a maximum horizontal magnetic field and a minimum horizontal magnetic field becomes small. If a magnetic field in a loop is uniform, a plasma density in the loop becomes uniform, so that a uniformity of consumption of a target 1 caused by rotation of a magnet is more effectively enhanced. This is because a direction of a peripheral stationary magnet becomes nearly perpendicular to a direction of a spiral magnet. In this case, a spiral angle is about 79°. It can be seen that in order to obtain such a uniformity effectively, a spiral angle is desirably in a range of about 70° to 88° and, more desirable, in a range of about 75° to 85°. As can be seen from FIG. 11, in case of using magnets having substantially the same thickness and the same width, a value of the maximum magnetic field decreases as the number of spirals is reduced. In this case, a plasma density is decreased and a film forming rate is also decreased, resulting in a deterioration of a throughput of the apparatus. Accordingly, in the present embodiment, a thickness of the magnet is increased from about 12 mm to about 20 mm, and strength of a horizontal magnetic field on a target surface is increased. As a result, a maximum horizontal magnetic field in a loop is about 654 Gauss and a minimum horizontal magnetic field is about 510 Gauss and thus it is possible to accomplish a distribution of the horizontal magnetic fields more than about 500 Gauss in all loops. In this case, a minimum value of the horizontal magnetic field reaches about 78% of a maximum value thereof, so that uniformity which is difficult to achieve in case of using eight spirals can be ensured.

Figure 12:
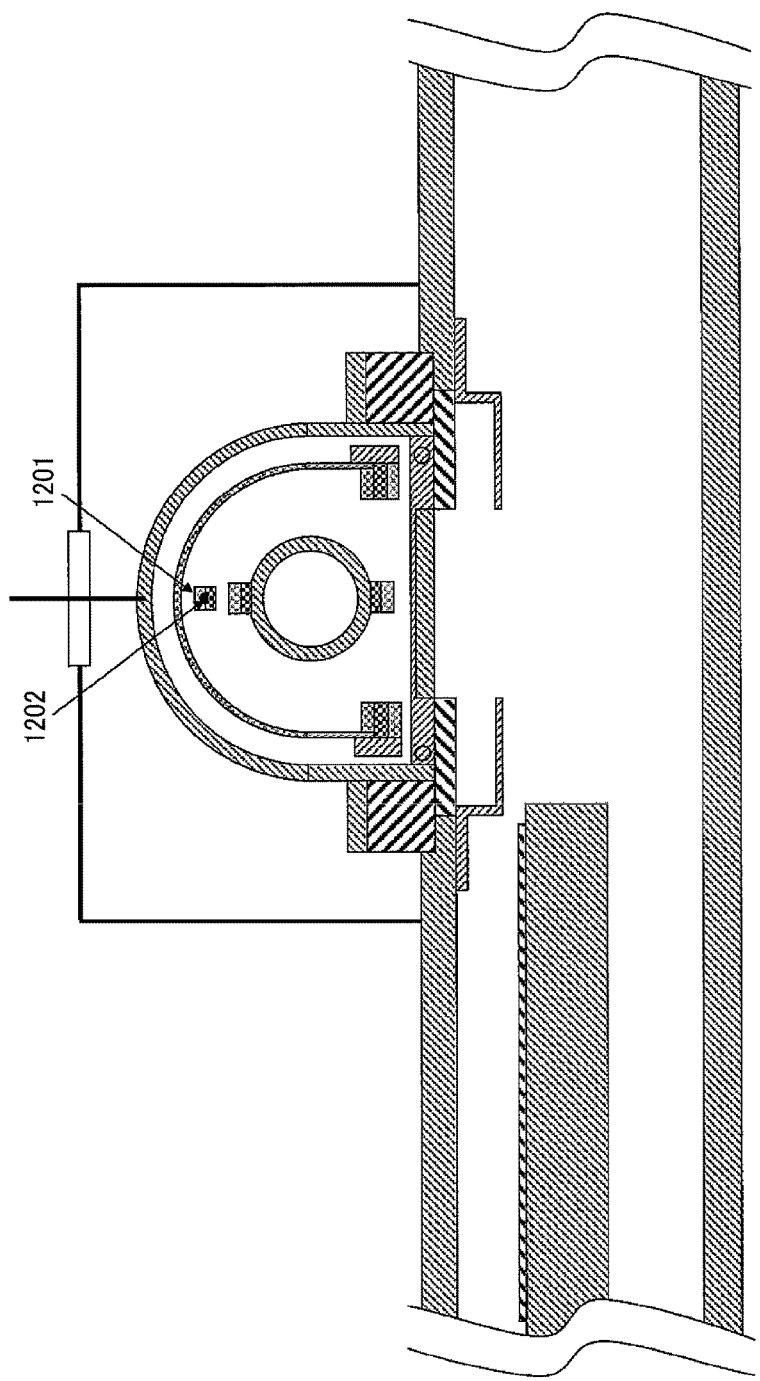
FIG. 12 illustrates a magnetron sputtering apparatus in accordance with a second embodiment of the present invention.

In the present embodiment, such a freely rotatable magnet as denoted by a reference numeral 1201 in FIG. 12 is provided between a magnetic body cover and a rotary magnet. This magnet 1201 is configured to be freely rotatable on a shaft 1202. Accordingly, whenever a spiral magnet is rotated, the magnet 1201 is freely rotated and generates an attraction force with respect to a column-shaped rotation shaft. With this configuration, deformation of the shaft caused by gravity can be prevented, and even if the shaft is elongated, it is not easily deformed.

Figure 13:
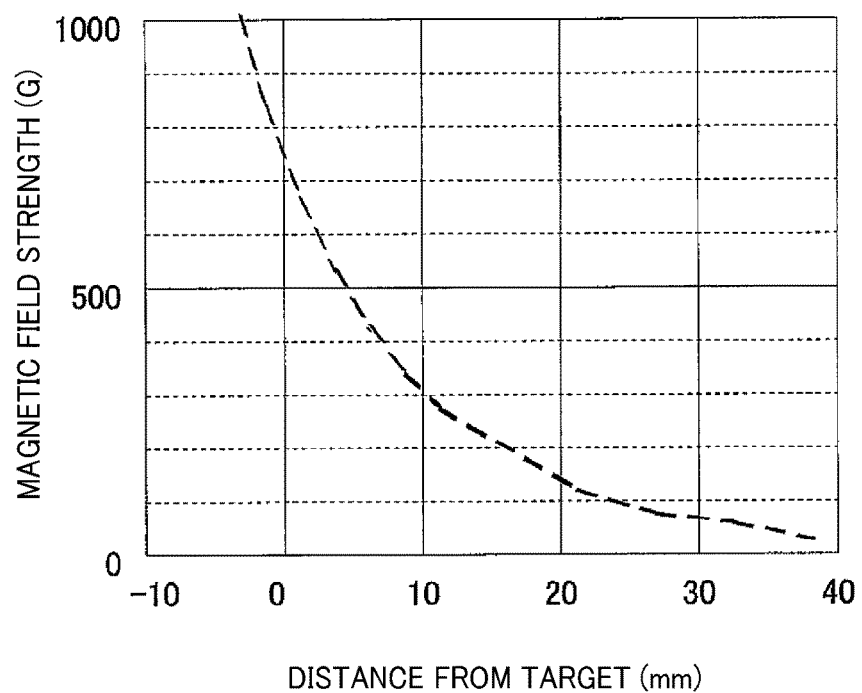
FIG. 13 is a graph showing a relationship between a distance from a surface of a target and a horizontal magnetic field strength.
Figure 14:
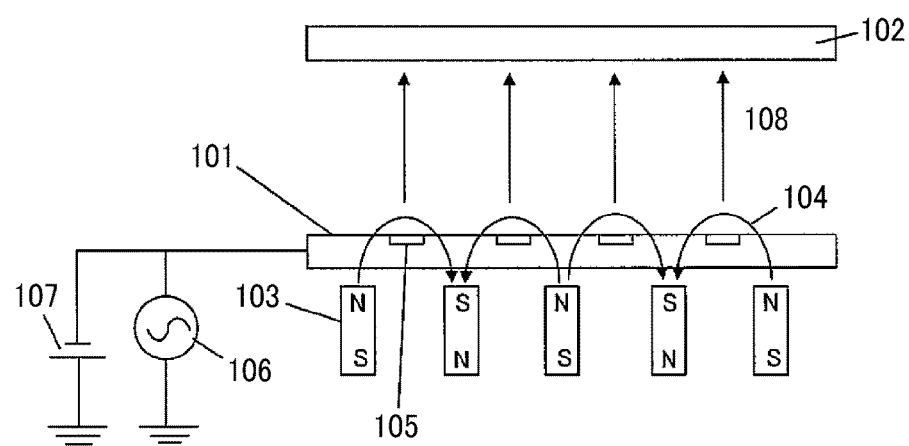
FIG. 14 illustrates a conventional magnetron sputtering apparatus.

Further, in the present embodiment, a distance between a substrate to be processed and a target surface is set to about 25 mm. FIG. 13 illustrates a relationship between a distance from the target surface and a horizontal magnetic field. A negative side on a horizontal axis corresponds to a magnet side and a positive side corresponds to a substrate side. In a sputtering film forming method of the present embodiment, film forming uniformity is good and a strong magnetic field of about 500 Gauss or more is generated on the target surface, so that plasma is excited only in a vicinity of the target surface. As can be seen from FIG. 13, when the distance between the target surface and the substrate is about 25 mm, strength of the magnetic field at that position is about 100 Gauss or less which is about 1/5 or less of the strength of the magnetic field on the target surface, so that plasma excitation is hardly affected. Accordingly, it can be seen that even if the target is brought close to the substrate at a distance of about 30 mm or less or desirably, about 20 mm or less, a uniform film can be formed because the magnet is rotated. Further, by researching a configuration of the magnet, the magnetic field on a surface of the substrate can be set to about 20 Gauss or less. In this way, the substrate to be processed is brought close to the target surface, so that a film forming particle sputtered from the target is scarcely adhered to a wall of a processing chamber or a shield member and is adhered to the substrate to be processed. Accordingly, a film formation can be performed with high target use efficiency.

Third Embodiment

A third embodiment of the present invention will be explained in detail with reference to the drawings. Further, descriptions of the same parts as those of the aforementioned embodiments will be omitted for the simplicity of description. A magnetron sputtering apparatus in accordance with the present invention is especially suitable to be used as a reciprocating film forming apparatus as illustrated in FIG. 9.

Figure 9:
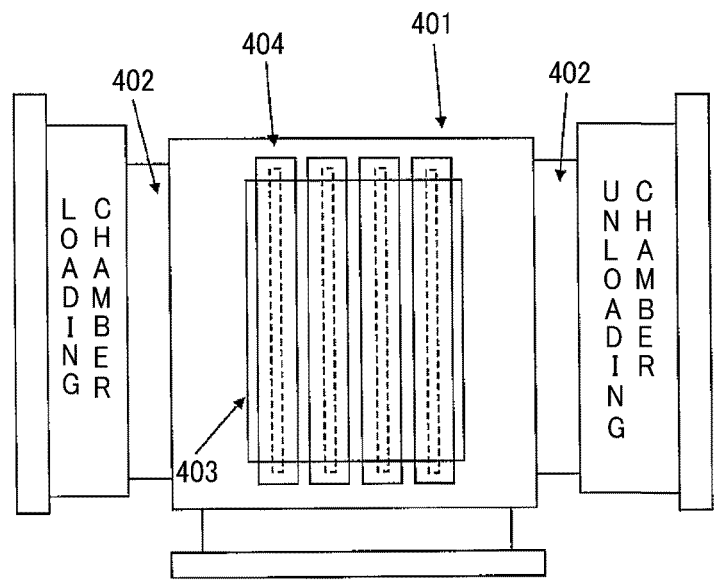
FIG. 9 is a schematic diagram describing a magnetron sputtering apparatus in accordance with a third embodiment of the present invention.

In FIG. 9, a reference numeral 401 denotes a processing chamber; a reference numeral 402 denotes a gate valve; a reference numeral 403 denotes a substrate to be processed; and a reference numeral 404 is a rotary magnet plasma exciting unit of the third embodiment. The length of the spiral in a direction of the axis is set to about 307 mm in the first embodiment, whereas it is set to about 270 mm in this embodiment. A frequency of plasma excitation power is set to about 13.56 MHz. However, the frequency is desirably as high as about 100 MHz in order to achieve a high plasma density and a low temperature electron. A length of the plasma exciting unit is about 2.7 m, while a wavelength at a frequency of about 100 MHz is about 3 m. In this way, if the length of the exciting unit is nearly the same as the wavelength, a standing wave may be excited, resulting in non-uniform plasma. If the frequency is about 13.56 MHz, the wavelength thereof is about 22.1 m. Therefore, the length of the plasma exciting unit is sufficiently shorter than the wavelength and thus the plasma does not become non-uniform due to the standing wave.

In the present embodiment, four rotary magnet plasma exciting units 404 are used. Therefore, it is possible to substantially increase a film forming rate. The number of the exciting units is not limited to four. The substrate 403 is a glass substrate having a size of about 2.2 m×2.5 m. In the present embodiment, the lengthwise side of the substrate is about 2.5 m and the substrate is reciprocated in a direction perpendicular to a column-shaped rotation shaft serving as a rotary magnet plasma exciting unit, so that a substantially uniform film can be formed on the substrate. In order to form a uniform film, the substrate 403 may be moved in one direction instead of being reciprocated, or the rotary magnet plasma exciting unit 404 may be moved. In the present embodiment, by reciprocating the substrate 403, a part of the substrate is consecutively exposed to a plasma region in which the plasma is excited by the rotary magnet plasma exciting unit, so that a uniform thin film can be formed. A rotation speed of the rotary magnet is set to be shorter than a transit time of the substrate, so that it is possible to form a uniform film without instantaneous influence of an erosion pattern. Typically, a transit speed of the substrate is about 60 sec/sheet and a rotation speed of the rotary magnet is about 10 Hz. Moreover, in the present embodiment, the substrate to be processed is reciprocated, but the film forming apparatus may be configured to form a film by passing the substrate through one or more rotary magnet plasma exciting units only once.

Fourth Embodiment

A fourth embodiment of the present invention will be explained in detail with reference to FIG. 15. Descriptions of the same parts as those of the aforementioned embodiments will be omitted for the simplicity of description. In a magnetron sputtering apparatus in accordance with the present invention, a power feed point that supplies a plasma excitation power into a backing plate 6 and a target 1 is divided into plural ones.

Above all, there will be explained a problem of a conventional apparatus having only one power feed point.

In a magnetron sputtering apparatus, as a substrate to be processed is scaled up, a length of a rotation shaft of a rotary magnet is increased. For example, in order to process a large-sized glass substrate having a size of about 2.88 m×3.08 m, a sputtering apparatus having a rotation shaft of about 3.2 m in length is necessitated. The target also has a length equivalent to the rotation shaft. When the target has such a length, a length of the target is equivalent to the wavelength of a high frequency power. Thus, for example, if plasma is excited by feeding a power from only one central point, a standing wave is generated and thus the plasma becomes non-uniform. Furthermore, since high current flows in an axis direction due to high current flowing from the plasma, an unintended voltage is generated due to an inductance effect, resulting in deterioration of uniformity.

Hereinafter, there will be explained a magnetron sputtering apparatus having a power feed point which is divided into plural ones.

FIG. 15 illustrates a schematic view of a magnetron sputtering apparatus in accordance with the present invention. A reference numeral 2 denotes a rotary magnet set (column-shaped rotation shaft); a reference numeral 1 denotes a target; a reference numeral 6 denotes a backing plate; a reference numeral 15a denotes a metal plate surrounding the rotary magnet set 2 and electrically connected with the backing plate; a reference numeral 12a is a power supply for generating a high frequency power by which plasma is excited; and a reference numeral 12b is a power feed point for applying the high frequency power to the target. In the drawings, FIG. 15A is a cross sectional view perpendicular to the rotation shaft and FIG. 15B is a diagram viewed from a lateral side of the rotation shaft (viewed from a direction of an arrow X of FIG. 15A). Since the apparatus processes a substrate of about 3 m×3 m size, a length of the target in the axis direction is about 3.2 m which is longer than the length of the substrate.

A frequency of the high frequency power is about 13.56 MHz. Representative frequencies of powers, half-wavelengths in a vacuum and 1/10 (one tenth) values thereof are provided in Table 1 below.

TABLE 1

| Frequency (MHz) | Half-wavelength(m) in vacuum | Half-wavelength/10 (m) in vacuum |
|---|---|---|
| 13.56 | 11.1 | 1.11 |
| 27 | 5.6 | 0.56 |

TABLE 1-continued

| Frequency (MHz) | Half-wavelength(m) in vacuum | Half-wavelength/10 (m) in vacuum |
|---|---|---|
| 40 | 3.8 | 0.38 |
| 100 | 1.5 | 0.15 |

At a frequency of 13.56 MHz, the half-wavelength in a vacuum is 11.1 m. The plasma is excited via a sheath, i.e., a space charge layer having a thickness of several mm between a target surface and the plasma. That is, the sheath exists between the plasma and the target.

Since the plasma serves as a good conductor, parallel plate lines are formed by the plasma and the target in the axis direction. If an electromagnetic wave is propagated to the parallel plate lines, its wavelength becomes equal to a wavelength in a vacuum. A wavelength is in inverse proportion to a frequency, and at a frequency of 13.56 MHz, the half-wavelength is 11.1 m which can not be neglected in consideration of the target length of about 3.2 m.

A high frequency is more advantageous to obtain high density plasma with low electron temperature which are efficient for improvement in a film forming rate or for decrease in damage. Therefore, it is efficient to use a power with a frequency of about 100 MHz.

In this case, the vacuum half-wavelength is about 1.5 m which is shorter than the target length of about 3.2 m. When the wavelength is substantially equivalent to the target length in this way, if a power is fed at a certain point, a standing wave is generated and thus non-uniform plasma is excited.

Further, a parasitic inductance necessarily exists in the target. When a parasitic inductance per unit length is expressed as L, impedance of $2\pi f \times L$ is generated. If a high current I of several to several tens of ampere flows from the plasma in the axis direction of the target, a voltage of $2\pi f \times L \times I$ is generated, so that there occurs a problem that a power does not reach a distant position from the power feed point.

Since the impedance is proportional to the frequency, the aforementioned effect becomes conspicuous as the frequency increases.

In order to suppress such an effect, by dividing the power feed point into plural ones to set a pitch of the power feed point to be about 1/10 or less of the vacuum half-wavelength, the distant position from the power feed point does not exist and the current flowing into one power feed point is reduced. That is, the present inventor found that uniformity could be obtained by reducing the current flowing in the axis direction of the target.

In the present embodiment, since a high frequency power of about 13.56 MHz is used and 1/10 of the vacuum half-wavelength is 1.11 m, four power feed points are provided at a distance of about 0.8 m shorter than the vacuum half-wavelength. In this way, it is possible to form a film on a large-sized substrate of about 3 m×3 m size without deterioration of plasma uniformity and uniformity of film formation. In the present embodiment, only a high frequency power of about 13.56 MHz is used to excite the plasma, but the frequency is not limited thereto. Therefore, it may be possible to superpose a DC power or a power having a different frequency thereon.

Fifth Embodiment

A fifth embodiment of the present invention will be explained in detail with reference to FIG. 16. Descriptions of the same parts as those of the aforementioned embodiments will be omitted for the simplicity of description. In a magnetron sputtering apparatus in accordance with the present invention, a magnet 19a for generating a magnetic field is provided within a mounting table 19 for mounting a substrate 10 to be processed, i.e., at a side opposite to a target 1 across the substrate.

In FIG. 16 illustrating the embodiment of the present invention, a reference numeral 2 denotes a rotary magnet set (column-shaped rotation shaft); a reference numeral 10 denotes a substrate to be processed; a reference numeral 19 denotes a mounting table for mounting the substrate 10 and provided at a side opposite to a target 1 across the substrate 10; and a reference numeral 19a is an in-stage magnet installed within the mounting table 19, for generating a magnetic field. If there is no magnet installed within the mounting table 19, magnetic force lines generated from an N-pole magnet which is a spiral magnet positioned in a plasma loop illustrated in FIG. 3 and generated by a spiral-shaped rotary magnet reach the substrate 10, so that plasma is simultaneously transported along the magnetic force lines and plasma damage occurs during a film formation. If the in-stage magnet 19a forms an N-pole toward the target 1, it is possible to control the magnetic force lines not to reach the substrate 10 and to detour in a horizontal direction. Accordingly, a film formation can be performed without the plasma reaching the substrate 10, and in particular, the film formation can be performed without damage to the substrate 10 in its early stage. Further, in the present embodiment, in order for the magnetic force lines generated from the N-pole magnet, i.e., the spiral magnet positioned in the plasma loop not to reach the substrate 10, the in-stage magnet also forms an N-pole toward the target. However, depending on a design of the spiral magnet, magnetic force lines generated from a magnet positioned between loops may reach the substrate 10. Therefore, polarity of the in-stage magnet 19a needs to be appropriately changed. Furthermore, the in-stage magnet 19a is installed within the mounting table 19 in the present embodiment but its position is not limited thereto, so that a stationary magnet may be installed under the target 1 or under the mounting table 19 or the magnetic field may be generated by a current.

Sixth Embodiment

A sixth embodiment of the present invention will be explained in detail with reference to FIGS. 17 to 37. Descriptions of the same parts as those of the aforementioned embodiments will be omitted for the simplicity of description. A magnetron sputtering apparatus in accordance with the present invention includes a rotary magnet in accordance with the first embodiment having a magnet configuration in which a target use efficiency that is determined by a target consumption distribution determined based on Larmor radius of electron confined in the horizontal magnetic field and a radius of curvature of the magnetic field is set to be about 80% or more.

A configuration of the magnetron sputtering apparatus is the same as illustrated in FIG. 1. Therefore, description thereof will be omitted.

As shown in FIG. 7, local consumption of a target in the magnetron sputtering apparatus in accordance with the first embodiment is remarkably improved as compared to a conventional sputtering apparatus.

Figure 18:
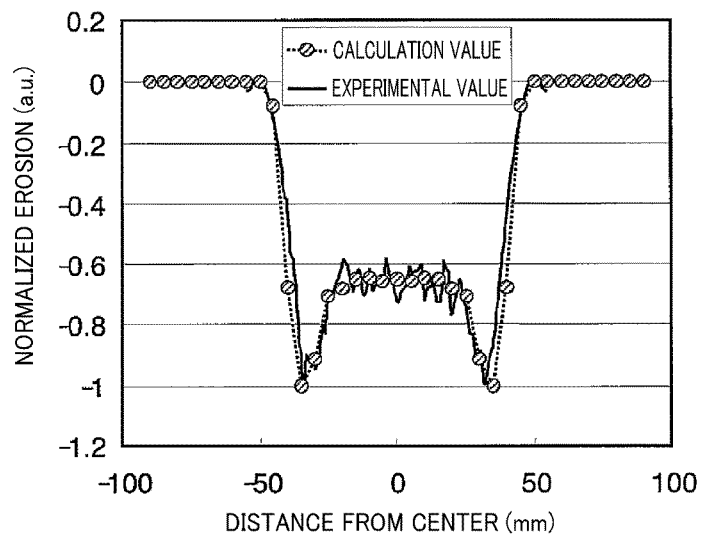
FIG. 18 is a graph showing a comparison between an actual measurement value and a calculation value of an erosion distribution on a surface of a target in a sixth embodiment of the present invention.

It can be seen that an erosion, that is, consumption distribution is uniform in a rotation axis direction of the target, i.e., in a proceeding direction of a plasma loop, whereas the consumption distribution of the target is not uniform in a direction perpendicular to the rotation axis direction (proceeding direction of the plasma loop). In other words, as shown in FIG. 18 with actual measurement values, both end portions of the target (end portions of the plasma loop) are greatly consumed as compared to a central portion of the target.

In order to find a relationship between a consumption distribution of the target surface and a configuration of the apparatus, the present inventors considered the followings.

The present inventors took notice of Larmor radius of electrons confined in the magnetic field.

As illustrated in FIG. 17, the Larmor radius $r_C$ of electrons confined in the magnetic field is a radius of a circle when a charged particle in the magnetic field makes a circular motion by a Lorentz force. If a circular horizontal magnetic loop having a perfect axial symmetry is formed, there is a relationship between an erosion half-width and the Larmor radius as follows.

W: Erosion half-width
R: Radius of curvature of horizontal magnetic field
$r_C$: Larmor radius Here, if the radius of curvature of horizontal magnetic field is sufficiently larger than the Larmor radius, the erosion half-amplitude can be derived from the following Formula b.

[Eq. 3]

$$W \approx 2\sqrt{2Rr_G} \quad \text{Formula b (Formula 2)}$$

The Larmor radius can be expressed as follows.

[Eq. 4]

$$r_c = \frac{m_e v_\perp}{eB} \quad \text{Formula c}$$

$m_e$: Electron mass
$V_\perp$: Electron velocity component perpendicular to the magnetic field
e: Elementary electric charge
B: Magnetic flux density Further, a secondary electron generated from the target is accelerated by a sheath electric field in a direction perpendicular to the horizontal magnetic field. However, since a velocity component of a vertical magnetic field is small in an erosion area, the sheath electric field is approximately orthogonal to the magnet.

Accordingly, a formula is obtained as follows.

[Eq. 5]

$$v_\perp \approx \sqrt{2e|V_{DC}|/m_e} \quad \text{Formula d}$$

$V_{DC}$: Self-bias voltage (DC voltage generated on the target 1 with respect to the ground)

By substituting Formula d into Formula c, a formula is obtained as follows.

[Eq. 6]

$$r_c = 34 \frac{\sqrt{|V_{DC}|(V)}}{B(\text{Gauss})} (\text{mm}) \quad \text{Formula e (Formula 1)}$$

When the self-bias voltage $V_{DC}$ and the magnetic flux density B are varied, Larmor radiuses can be obtained as shown in Table 2. The erosion half-widths W at that time are shown in Table 3. Table 3 provides a case where the radius R of curvature of a magnetic field is 20 mm and another case where the radius R of curvature of a magnetic field is 10 mm.

TABLE 2

$|V_{DC}|$, Larmor radius (mm) in case of varying a magnetic field

| | B(G) | | | |
|---|---|---|---|---|
| $|V_{DC}|$ (V) | 300 | 400 | 500 | 600 |
| 200 | 1.6 | 1.2 | 1.0 | 0.8 |
| 300 | 2.0 | 1.5 | 1.2 | 1.0 |
| 400 | 2.3 | 1.7 | 1.4 | 1.1 |
| 500 | 2.5 | 1.9 | 1.5 | 1.3 |
| 600 | 2.8 | 2.1 | 1.7 | 1.4 |

TABLE 3

| | B(G) | | | |
|---|---|---|---|---|
| $|V_{DC}|$ (V) | 300 | 400 | 500 | 600 |
| Erosion half-width (mm) in case where a radius of curvature of a magnetic field is 20 mm | | | | |
| 200 | 16.0 | 13.9 | 12.4 | 11.3 |
| 300 | 17.7 | 15.3 | 13.7 | 12.5 |
| 400 | 19.0 | 16.5 | 14.8 | 13.5 |
| 500 | 20.1 | 17.4 | 15.6 | 14.2 |
| 600 | 21.1 | 18.3 | 16.3 | 14.9 |
| Erosion half-width (mm) in case where a radius of curvature of a magnetic field is 10 mm | | | | |
| 200 | 11.3 | 9.8 | 8.8 | 8.0 |
| 300 | 12.5 | 10.9 | 9.7 | 8.9 |
| 400 | 13.5 | 11.7 | 10.4 | 9.5 |
| 500 | 14.2 | 12.3 | 11.0 | 10.1 |
| 600 | 14.9 | 12.9 | 11.5 | 10.5 |

However, in the magnetron sputtering apparatus in accordance with the present invention, the horizontal magnetic field loop is not a circle having a perfect axial symmetry, like a plasma loop as illustrated in FIG. 6. Therefore, the horizontal magnetic field (i.e., Larmor radius) and the radius of curvature of a magnetic field are varied depending on a position within the loop.

Accordingly, the erosion half-width is also varied depending on a position within the loop.

In the magnetron sputtering apparatus in accordance with the present invention, it is not obvious that a plasma density is uniform at any position within the horizontal magnetic field loop. However, assuming that the plasma density is uniform at any position within the loop, the present inventors allowed a phase to be varied by rotating the magnet; calculated an erosion half-width for each case and an average phase; and obtained an erosion distribution of the target. Further, as a result of comparing the obtained erosion distribution with an actual erosion distribution (experimental values), it is proved that they almost correspond to each other, as illustrated in FIG. 18. That is, in the magnetron sputtering apparatus in accordance with the present invention, it can be seen that the erosion distribution can be calculated by using a formula that is obtained by using a horizontal magnetic field loop formed into a circle having a perfect axial symmetry as described above.

In other words, it can be seen that the target erosion distribution can be calculated from the radius R of curvature of a magnetic field and the Larmor radius $r_C$ of an electron (defined by the self-bias voltage $V_{DC}$ and the magnetic flux density B).

Therefore, by selecting a configuration of each part of the magnetron sputtering apparatus in accordance with the present invention, it is possible to calculate a consumption distribution of the target and thus to uniformize the target consumption distribution, i.e., to improve a target use efficiency. Accordingly, a target use efficiency of about 80% or more, which can not be accomplished by a conventional technique, can be accomplished by the present invention.

In other words, it is possible to obtain a magnetron sputtering apparatus having a magnet configuration in which a target use efficiency that is determined by a target consumption distribution determined based on Larmor radius defined by the generated self-bias voltage and a radius of curvature of the magnetic field is set to be about 80% or more.

Hereinafter, a method of optimizing, i.e., uniformizing a target consumption distribution based on the above calculation will be explained with reference to the drawings.

The present inventors took notice of a parameter, in particular, a shape of the spiral-shaped plate magnet set 3 of the magnetron sputtering apparatus, and attempted to optimize the target consumption distribution based on the above calculation.

Above all, a use efficiency as an indicator of optimization was defined.

Figure 21A:
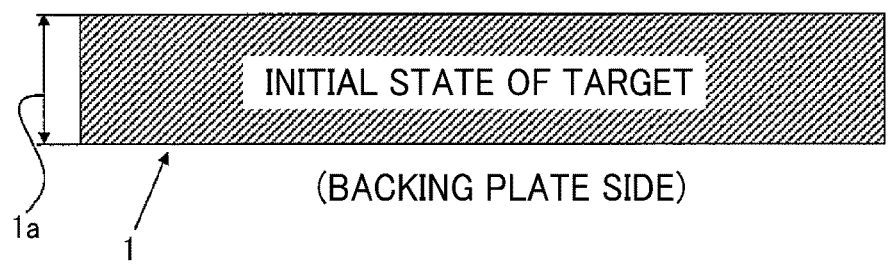
Figure 21B:
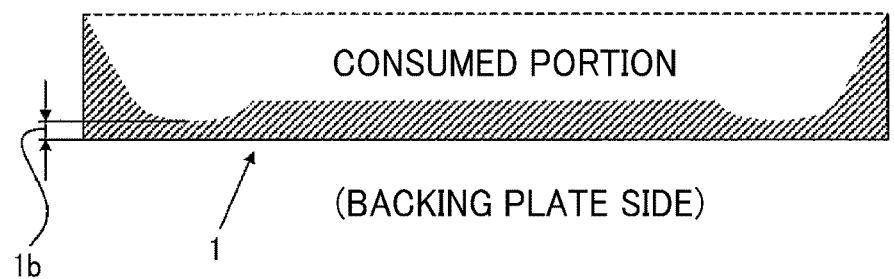

As described above, when the magnetron sputtering apparatus is operated, the target 1 is activated and sputtered by the plasma, thus being consumed to a state illustrated in FIG. 21B from a state illustrated in FIG. 21A.

In this case, when a thickness 1b of a rest of the most deeply consumed portion is about 5% of an initial thickness 1a of the non-consumed target, the target is to be replaced in consideration of a target's life. Assuming that the rotation axis of the rotary magnet set is sufficiently long, the use efficiency can be expressed by the following formula.

Use efficiency=Cross sectional area of consumed portion (plane perpendicular to an axial direction)/ Initial cross sectional area    Formula f The present inventors allowed a shape of the spiral-shaped plate magnet set 3 to be changed and calculated a target consumption distribution and a use efficiency based on Formula f as explained below.

First, a shape parameter of the spiral-shaped plate magnet set 3 used when calculating the target consumption distribution and the use efficiency will be explained with reference to FIGS. 19 and 20.

Figure 19:
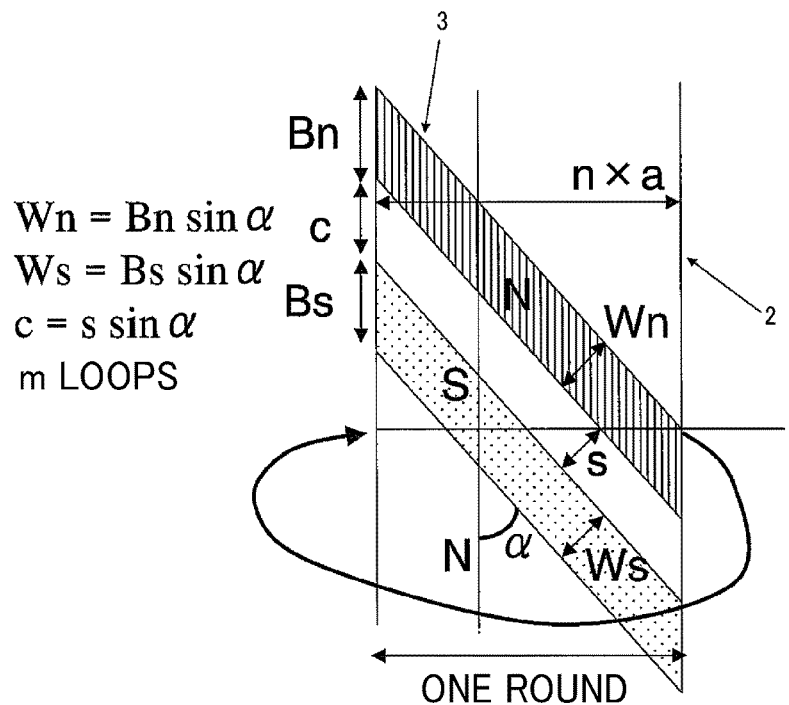
FIG. 19 is a schematic diagram illustrating sizes of a column-shaped rotation shaft 2 and a spiral-shaped plate magnet set 3 in the sixth embodiment of the present invention.

As illustrated in FIG. 19, the spiral-shaped plate magnet set 3 is wound around the column-shaped rotation shaft 2 and the adjacent spiral-shaped plate magnet sets 3 are spaced apart from each other at a distance s.

An extended direction of the spiral-shaped plate magnet set 3 is inclined with respect to the rotation axis of the column-shaped rotation shaft 2. Here, an acute angle therebetween is defined as α.

Figure 27:
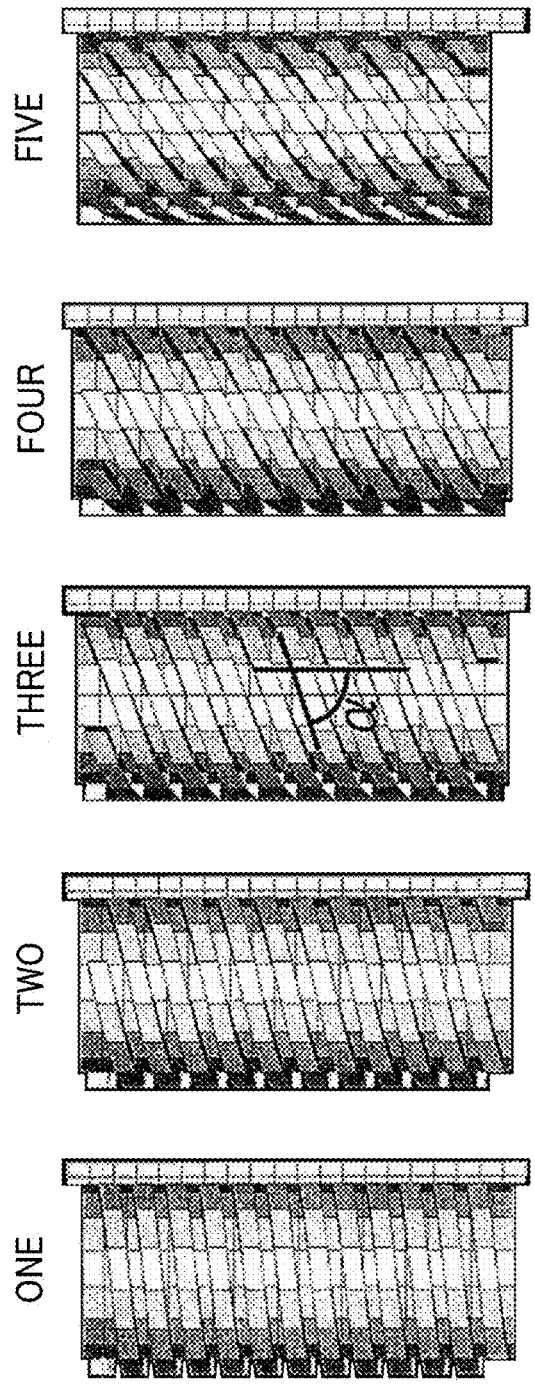
FIG. 27 is a plane view showing a relationship between the number (m) of loops and an angle ($\alpha$) of the spiral-shaped plate magnet set 3 in the sixth embodiment of the present invention.

Further, if the number of the spiral-shaped plate magnet set 3 (the number m of loops) is increased without changing widths Wn and Ws of the magnets, an angle α of the spiral-shaped plate magnet set 3 with respect to the rotation axis is decreased as illustrated in FIG. 27. If a diameter Da of the rotary magnet, the widths Wn and Ws of the magnet, the distance s between the magnets and the number m of the loops are set, the angle α is automatically determined.

Furthermore, as illustrated in FIG. 19, the adjacent spiral-shaped plate magnet sets 3 have an N-pole and an S-pole respectively at the outside of the column-shaped rotation shaft 2 in a diametrical direction, and the spiral-shaped plate magnet set 3 has predetermined widths Wn and Ws.

In FIG. 19, the width of the spiral-shaped plate magnet set 3 having the N-pole at the outside of the column-shaped rotation shaft 2 in a diametrical direction is denoted as Wn, while the width o the spiral-shaped plate magnet set 3 having the S-pole at the outside of the column-shaped rotation shaft 2 in a diametrical direction is denoted as Ws.

Figure 20:
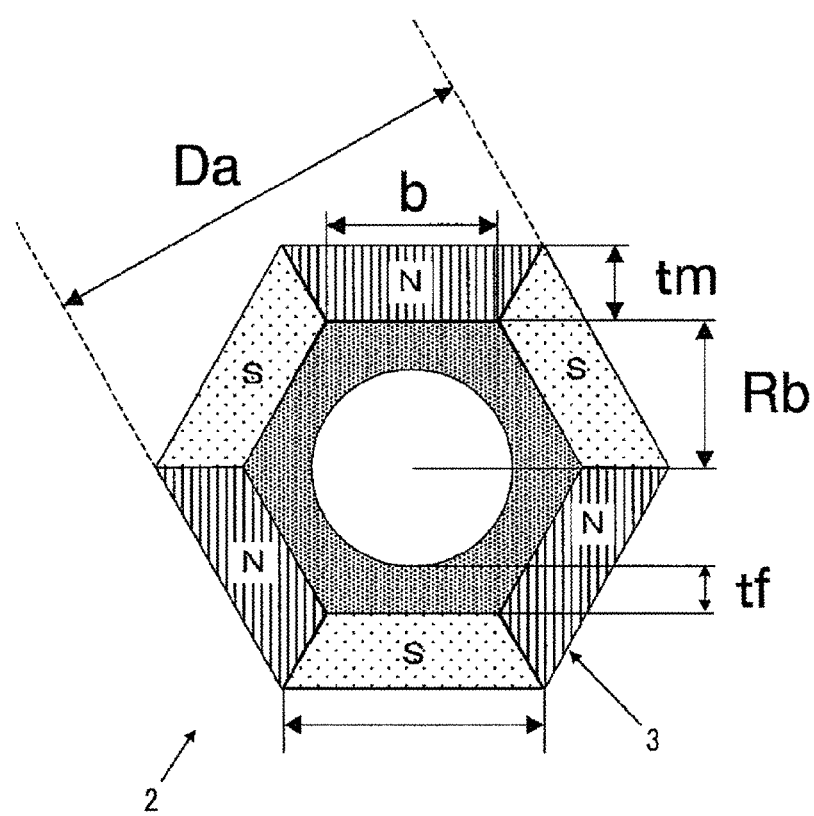
FIG. 20 is a schematic diagram illustrating sizes of the column-shaped rotation shaft 2 and the spiral-shaped plate magnet set 3 in the sixth embodiment of the present invention.

Further, as illustrated in FIG. 20, the spiral-shaped plate magnet set 3 has a thickness tm in a diametrical direction of the column-shaped rotation shaft 2.

Hereinafter, a result of optimizing the consumption distribution based on the above-described parameter will be explained.

The present inventors took notice of the distance s between the magnets of the spiral-shaped plate magnet set 3 illustrated in FIG. 19.

A target consumption distribution and a use efficiency are calculated while varying the distance s between the magnets of the spiral-shaped plate magnet set 3 from about 8 mm to about 17 mm.

Figure 22:
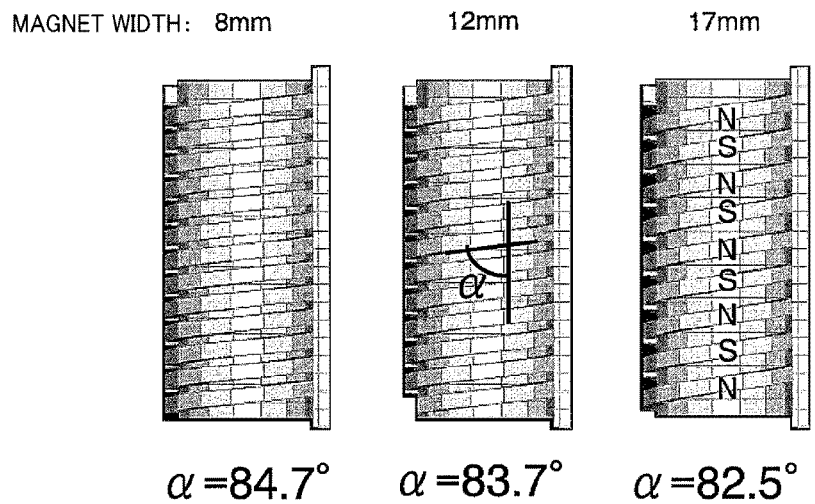
FIG. 22 is a plane view showing a shape of the spiral-shaped plate magnet set 3 in respective cases that a distance between magnets is about 8 mm, 12 mm and 17 mm in the sixth embodiment of the present invention.
Figure 23:
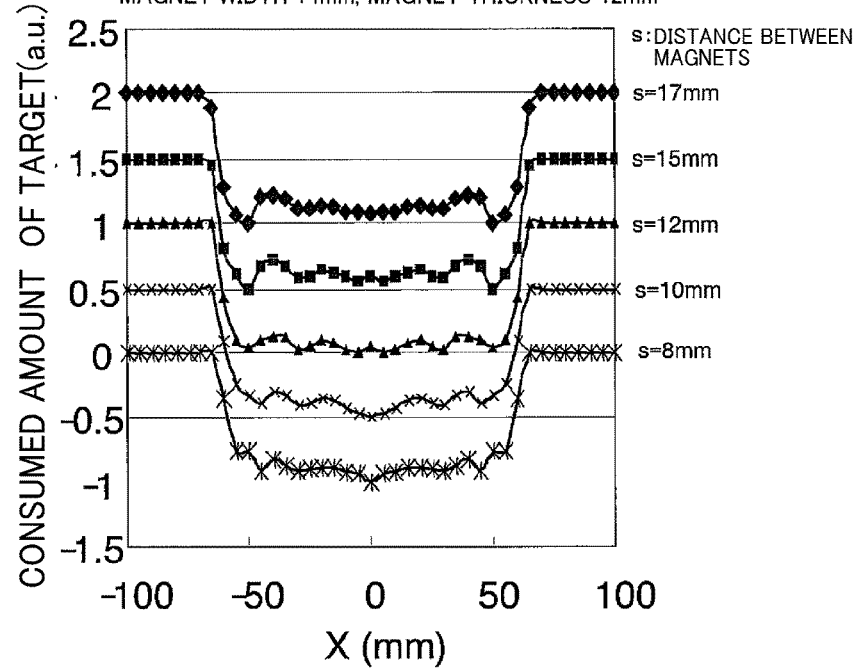
FIG. 23 is a diagram showing an erosion distribution when a distance between magnets of the spiral-shaped plate magnet set 3 is varied in the sixth embodiment of the present invention.

Further, the present inventors set the number of loops of the spiral-shaped plate magnet set 3 to 1; the diameter Da of the magnet to about 150 mm; the widths Wn and Ws of the magnets to about 14 mm; and the thickness tm of the magnet to about 12 mm. FIG. 22 illustrates a case where a distance s between magnets is set to be about 8 mm, about 12 mm and about 17, respectively. A relationship between the distance s between magnets and a consumption distribution is shown in FIG. 23, and a relationship between use efficiency, a horizontal magnetic field and a distance between magnets is shown in FIG. 24.

Figure 24:
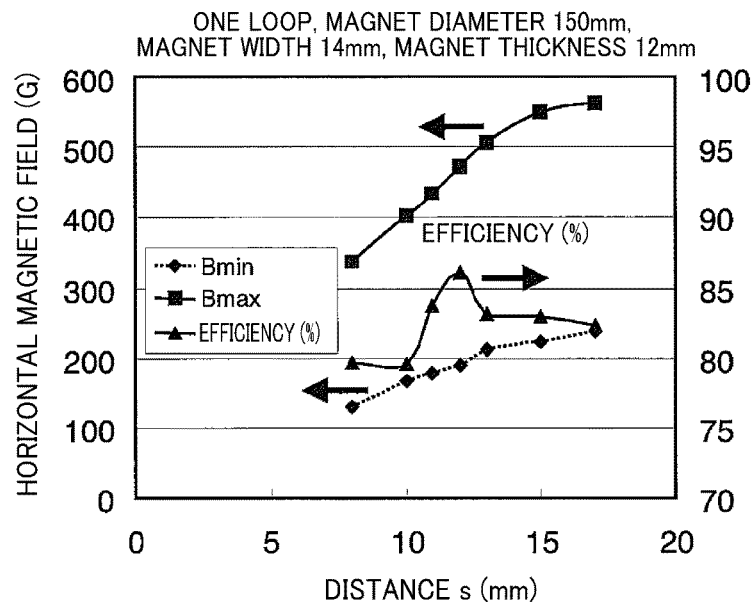
FIG. 24 is a diagram showing a relationship between a distance between magnets, a use efficiency and a horizontal magnetic field in the sixth embodiment of the present invention.

It can be seen from FIG. 24 that when the magnet distance s is about 11 mm or more, the stable use efficiency exceeding about 80% is obtained and when the magnet distance s is about 12 mm, a highest use efficiency is obtained.

Further, it is found that strength of the horizontal magnet field becomes strong as the distance s between magnets is increased.

Thereafter, the present inventors took notice of a plate thickness tm of the spiral-shaped plate magnet set 3 illustrated in FIG. 20.

A target consumption distribution and a use efficiency are calculated while varying the plate thickness tm of the spiral-shaped plate magnet set 3 from about 5 mm to about 15 mm.

Further, a diameter of the column-shaped rotation magnet is set to be about 150 mm, a width of the magnet to about 14 mm and a distance between magnets to about 12 mm.

Figure 25:
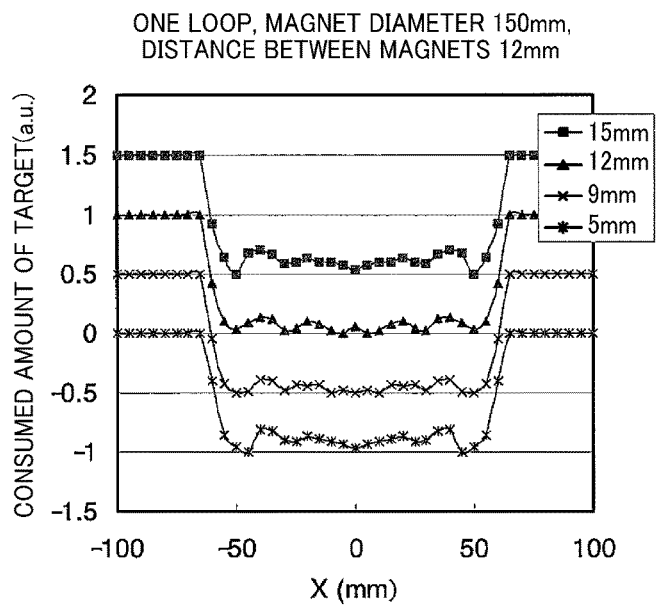
FIG. 25 is a diagram showing a relationship between a plate thickness tm and a consumption distribution in the sixth embodiment of the present invention.
Figure 26:
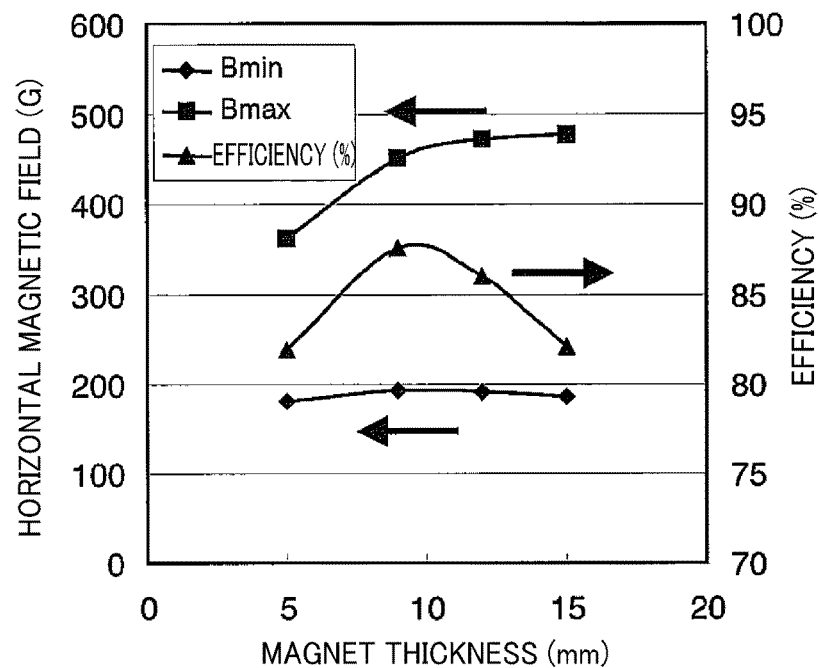
FIG. 26 is a diagram showing a relationship between a plate thickness tm and a use efficiency in the sixth embodiment of the present invention.

In this case, a relationship between a plate thickness tm and a consumption distribution is shown in FIG. 25, and a relationship between a use efficiency, strength of a magnetic field and a plate thickness is shown in FIG. 26.

As illustrated in FIG. 26, it can seen that if the plate thickness tm is in a range from about 5 mm to about 15 mm, the use efficiency exceeds about 80%, and if the plate thickness tm is in a range from about 9 mm to about 12 mm, the use efficiency exceeds about 85%, so that a highest use efficiency is obtained in this range.

Subsequently, the present inventors took notice of the number m of loops of the spiral-shaped plate magnet set 3 illustrated in FIG. 19.

A target consumption distribution and a use efficiency are calculated while varying the number m of loops of the spiral-shaped plate magnet set 3 from about 1 to about 5.

Further, a diameter of the column-shaped rotation magnet is set to be about 150 mm, a width of the magnet to about 14 mm and a distance between magnets to about 12 mm.

Figure 28:
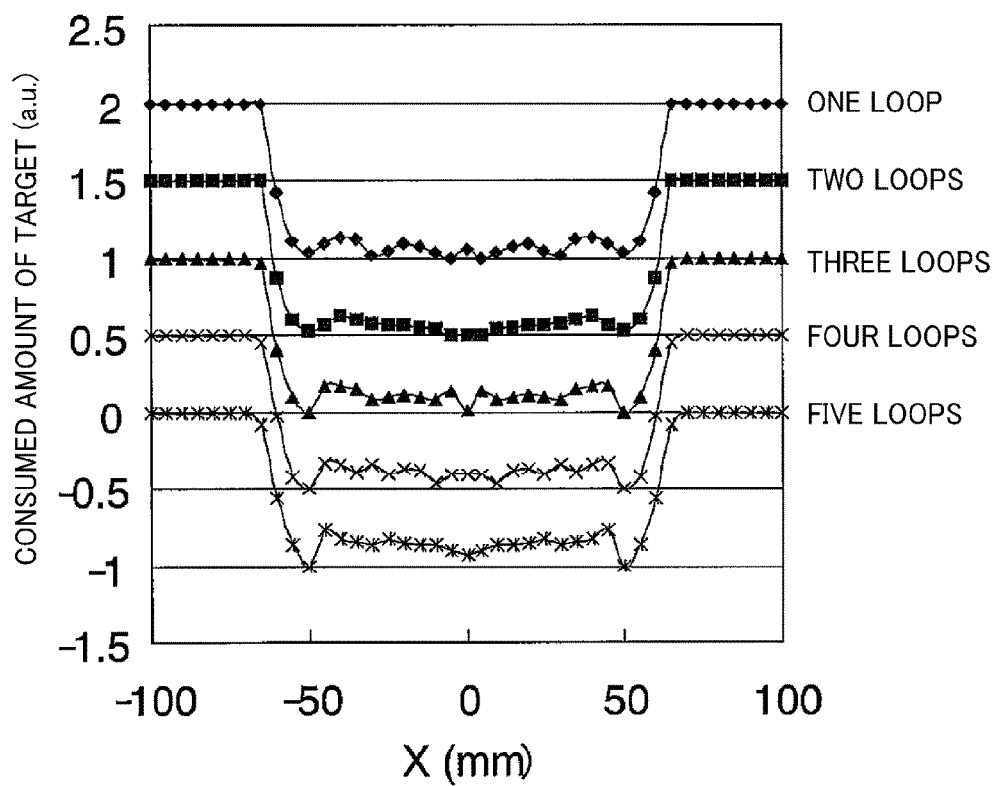
FIG. 28 is a diagram showing a relationship between the number m of loops of the spiral-shaped plate magnet set 3 and a consumption distribution in the sixth embodiment of the present invention.

In this case, a relationship between the number m of loops and an angle α is shown in FIG. 27, and a relationship between the number m of loops and a consumption distribution is shown in FIG. 28. A relationship between a use efficiency, strength of a magnetic field and the number m of loops is shown in FIG. 29.

Figure 29:
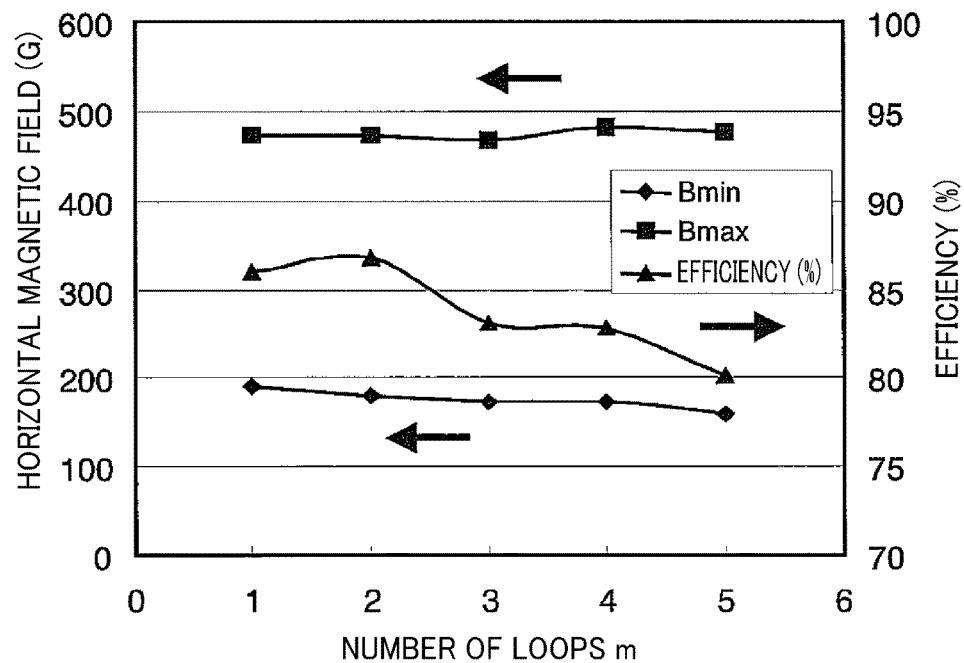
FIG. 29 is a diagram showing a relationship between the number (m) of loops, a use efficiency and a magnetic field strength in the sixth embodiment of the present invention.

As illustrated in FIG. 29, the use efficiency exceeds about 80% regardless of the number m of loops, but as the number m of loops is increased, the use efficiency tends to decrease.

Figure 30:
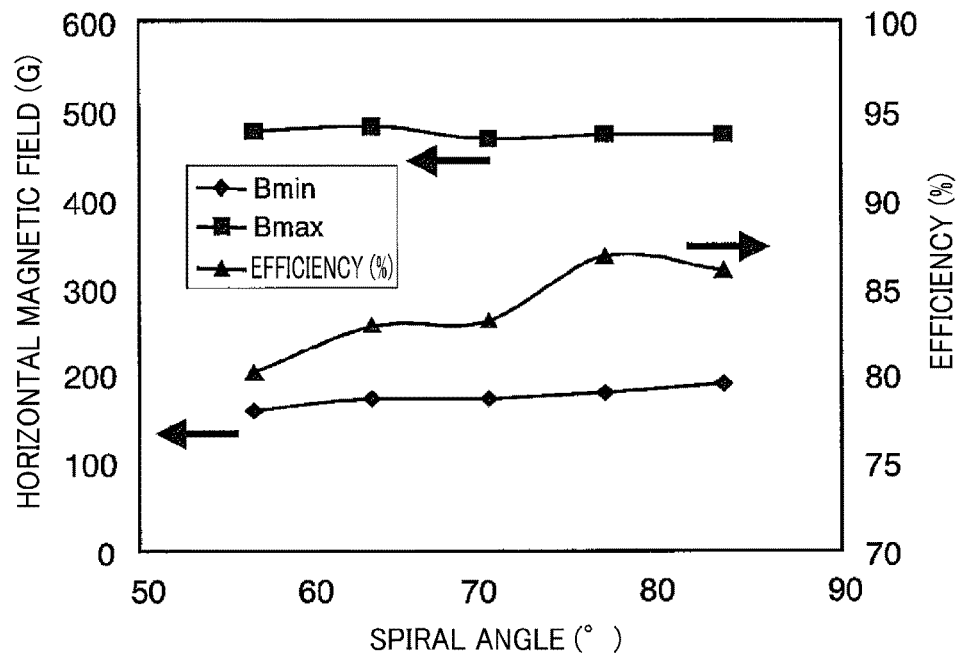
FIG. 30 is a diagram showing a relationship between an angle (spiral angle) ($\alpha$), a use efficiency and a magnetic field strength.

Further, it can be seen that the highest use efficiency can be obtained when the number m of loops is 2, and a single loop or double loops are desirable. A relationship between a use efficiency, strength of a magnetic field and an angle α is shown in FIG. 30 and the efficiency exceeds about 80% in an angle range from about 57° to about 84°, desirably, from about 75° to about 85°. An inclined angle is desirably close to about 90° because the plasma loops move more uniformly with respect to the target at this angle. An inclined angle in a conventional magnetron sputtering apparatus is about 49°, which may cause the conventional magnetron sputtering apparatus to have a target use efficiency of about 50%.

Then, the present inventors took notice of the width Wn of the magnet with the N-pole facing a surface and the width Ws of the magnet with the S-pole facing the surface in the spiral-shaped plate magnet set 3 illustrated in FIG. 19.

To be specific, the width Ws of the magnet with the S-pole facing the surface is set to about 14 mm and the width Wn of the magnet with the N-pole facing the surface is set to about 14 mm and about 18 mm, and then a target consumption distribution and a use efficiency are calculated. In this case, a diameter of the magnet is set to about 150 mm and a distance between magnets is set to about 12 mm.

Figure 31:
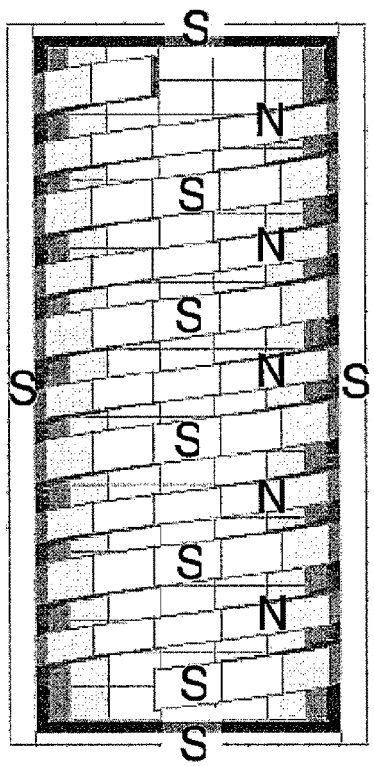
FIG. 31 is a diagram viewed from the target in case that an S-pole magnet width is set to be larger than an N-pole magnet width in the spiral-shaped plate magnet set 3 in the sixth embodiment of the present invention.
Figure 32:
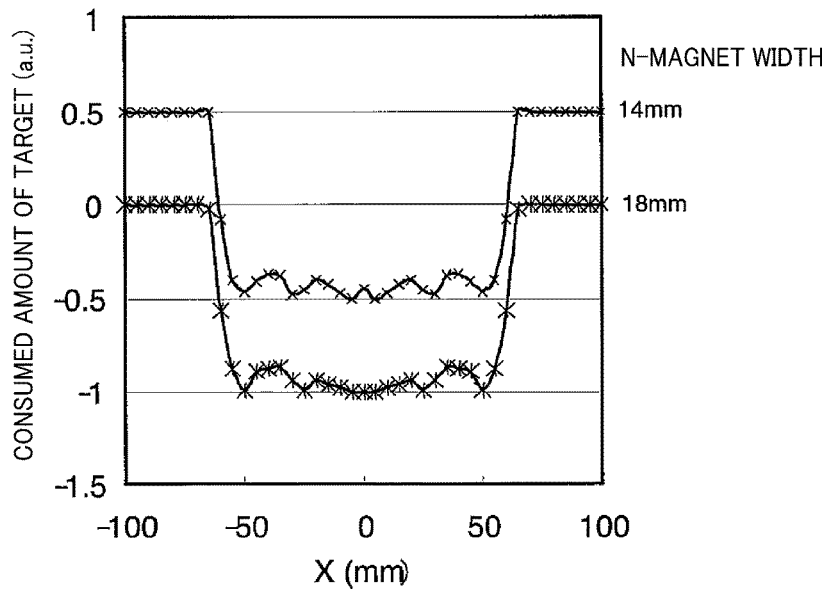
FIG. 32 is a diagram showing a relationship between the S-pole magnet width and a consumption distribution in FIG. 31.

FIG. 31 illustrates a diagram viewed from a target in a case where a width Ws of an S-pole magnet is set to about 18 mm which is wider than a width of an N-pole magnet and a loop shape is not much changed and only a horizontal magnetic field is increased. FIG. 32 shows a relationship between a width of the S-pole magnet and an consumption distribution, and FIG. 33 shows a relationship between a use efficiency and strength of a horizontal magnetic field.

Figure 33:
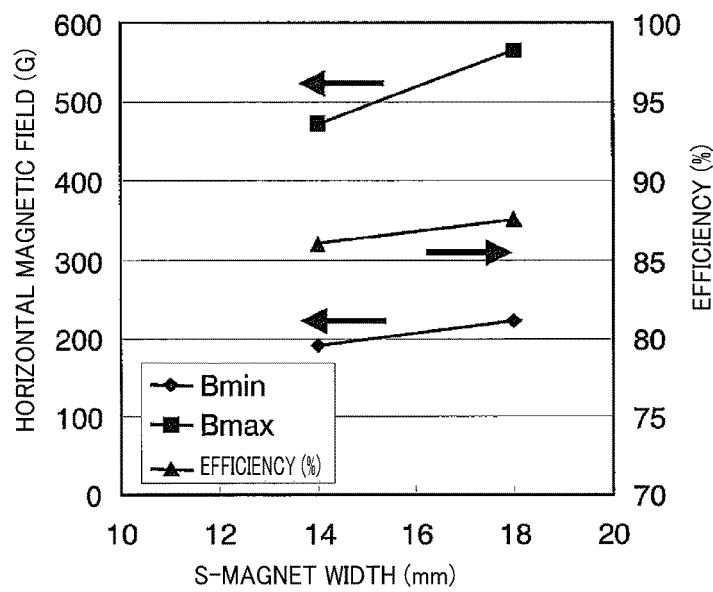
FIG. 33 is a diagram showing a relationship between a use efficiency and a horizontal magnetic field strength when the S-pole and N-pole magnet widths are varied in the sixth embodiment of the present invention.

As shown in FIGS. 32 and 33, when the width Ws is about 18 mm, it is possible to obtain the horizontal magnetic field strength of about 500 Gauss or more, a consumption width of about 12 cm and the use efficiency of about 87.6%. Therefore, it can be seen that the width of the S-pole magnet is desirably wider than that of the N-pole magnet.

Figure 34:
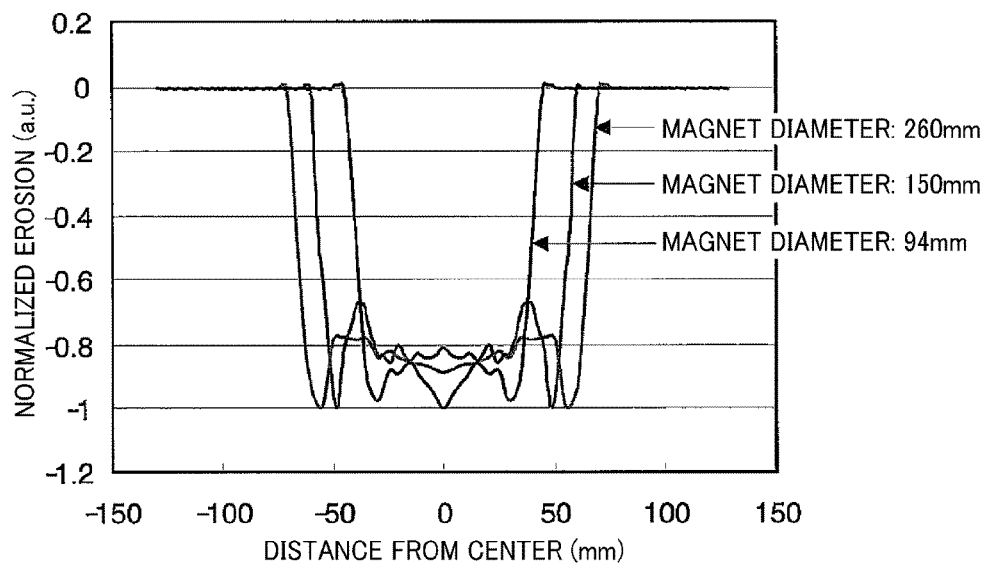
FIG. 34 is a diagram showing an erosion distribution when a magnet diameter is varied in the sixth embodiment of the present invention.
Figure 35:
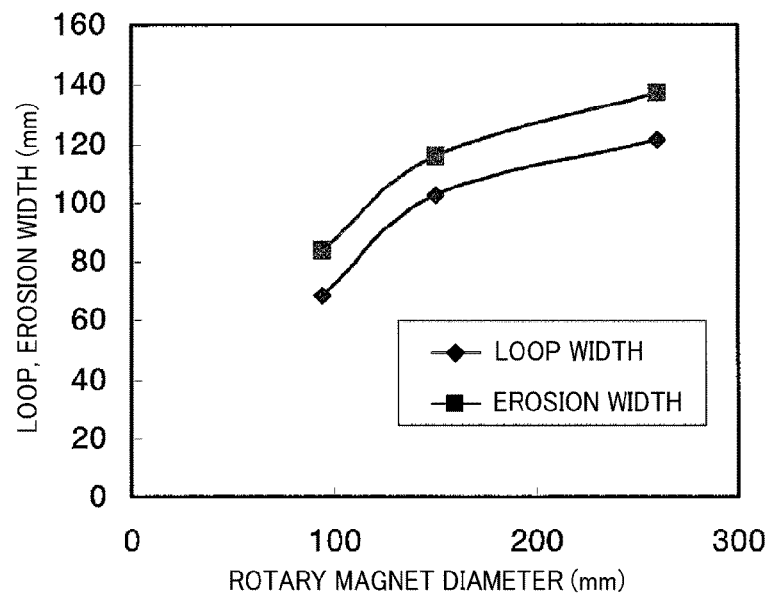
FIG. 35 is a diagram showing a relationship between a plasma loop width and an erosion width when the magnet diameter is varied in the sixth embodiment of the present invention.

Thereafter, a scale-up of the magnet was considered. FIG. 34 illustrates erosion distribution when a magnet diameter is set to about 94 mm (here, a width of a plasma loop was about 76 mm and a width of a magnetic field exceeding about 500 G was about 42 mm), 150 mm and 260 mm (here, a width of a plasma loop was about 118 mm and a width of a magnetic field exceeding about 500 G was about 50 mm). FIG. 35 illustrates a relationship between a width of a plasma loop and a width of erosion. In this case, one loop was used. As illustrated in FIG. 35, it can be seen that even though the magnet diameter is increased, the width of erosion is not much increased, and it is desirable to use more than one magnet having a diameter of about 150 mm. In particular, in order to perform a high speed film formation on a large-sized substrate, it is desirable to arrange more than one rotary magnet plasma excitation unit in a moving direction of the substrate such that a rotation axis is orthogonal to the moving direction of the substrate.

Further, there is no limitation on a parameter for obtaining a use efficiency of about 80%, and various kinds of parameters can be selected. However, it can be seen that variation of the self-bias voltage in a range from about 100 V to about 700 V does not much affect the target use efficiency. Therefore, each parameter of a magnet configuration is important.

As described above, in accordance with the sixth embodiment, it can be seen that the consumption distribution of the target is simulated with the radius of curvature of the magnetic field and the Larmor radius of the electron and in this simulation, the target use efficiency of about 80% or more is obtained by adjusting parameters such as the distance s between the magnets of the spiral-shaped plate magnet set 3, the number m of the loops of the spiral-shaped plate magnet set 3, the magnet plate thickness tm, a difference between the width Wn of magnet with the N-pole facing the surface and the width Ws of the magnet with the S-pole facing the surface and the diameter of the rotary magnet.

Figure 36:
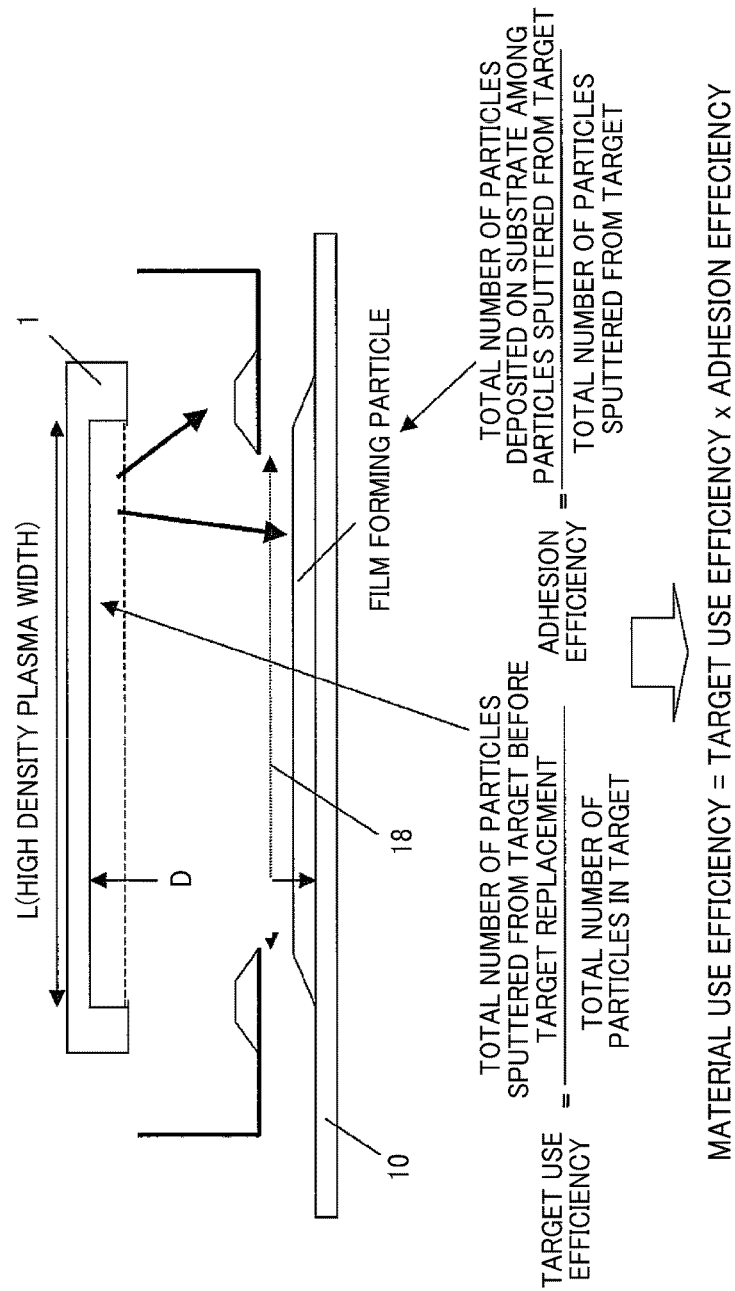
FIG. 36 is a diagram showing a positional relationship between the target 1, a substrate 10 to be processed, a plasma shield member 16 and a slit 18 in the sixth embodiment of the present invention.
Figure 37:
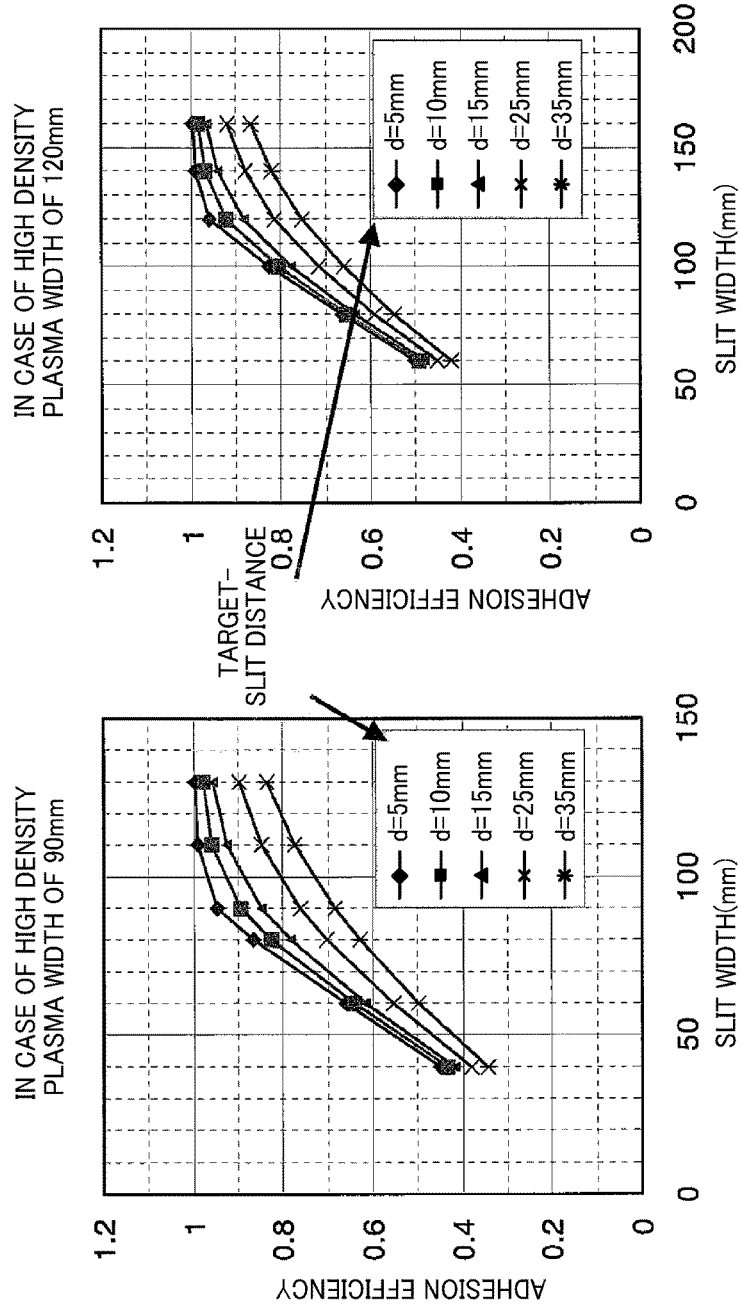
FIG. 37 is a diagram showing a width of the slit 18 and a deposit efficiency when a target-slit distance is varied in the sixth embodiment of the present invention.

Hereinafter, a method for improving a material use efficiency by consuming a material of the target without waste will be discussed. Referring to FIG. 36, some material particles sputtered from the target 1 are adhered on the plasma shield member 16. Assuming that a deposit efficiency is calculated by dividing the total amount of the material particles sputtered from the target 1 by the total amount of the material particles deposited on the substrate 10, the material use efficiency can be obtained by multiplying the target use efficiency by the deposit efficiency. Accordingly, in order to improve the material use efficiency, it is necessary to increase the target use efficiency and also to increase the deposit efficiency, as described above. In order to do so, as illustrated in FIG. 37, it is desirable to adjust a width of a slit 18 to be approximated to the width of the plasma to make a difference therebetween less than about 20 mm, desirably, about 10 mm. Further, the slit 18 and the plasma shield member 16 are positioned as closely as possible to the target (a distance therebetween is desirably in a range of about 15 mm to 3 mm).

A relationship between each parameter and a material use efficiency is shown in Table 4. In order to improve the material use efficiency, it is necessary to improve the target use efficiency, increase the width of the plasma, approximate the width of the slit to the width of the plasma and position the slit as closely as possible to the target, as described above.

TABLE 4

| Width of high density plasma: 120 mm, Distance between target and slit: 15 mm | | | |
|---|---|---|---|
| Total material use efficiency (%) | Target use efficiency (%) | Deposit efficiency on substrate (%) | Silt width (mm) |
| 24 | 50 | 48 | 60 |
| 32 | 50 | 63 | 80 |
| 44 | 50 | 88 | 120 |
| 53 | 60 | 88 | 120 |
| 82 | 85 | 96 | 120 |
| 91 | 95 | 96 | 120 |

The size of the magnet and the size of the substrate are not limited to the above-described embodiments. Further, in the above embodiments, though the surface magnetic pole of the peripheral stationary magnet is set to be an S-pole, it may be set to be an N-pole. In this case, the width of the spiral-shaped plate magnet with an N-pole is needed to be wider than that of the spiral-shaped plate magnet with an S-pole.

Further, in the sixth embodiment, each plate magnet of the spiral-shaped plate magnet sets 3 is magnetized in a direction perpendicular to its plate surface, and the plate magnets are fixed to the column-shaped rotation shaft 2 in a spiral shape to form plural spirals. The spirals adjacent to each other in the axis direction of the column-shaped rotation shaft 2 have different magnetic poles, i.e., an N-pole and an S-pole on outer sides of the column-shaped rotation shaft 2 in its diametrical direction, in the same manner as the first embodiment.

Furthermore, in the sixth embodiment, a stationary outer peripheral plate magnet 4 is configured to surround the rotary magnet set serving as a spiral-shaped plate magnet set 3 when viewed from the target 1 and the stationary outer peripheral plate magnet 4 is magnetized such that its side facing the target 1 has an S-pole.

However, if the stationary outer peripheral plate magnet 4 is made of a ferromagnetic body, it does not have to be magnetized in advance.

Further, as for the plate magnets of the spiral-shaped plate magnet set 3, if one (first spiral) of the adjacent spirals is magnetized in advance, the other (second spiral) may be made of a non-magnetized ferromagnetic body.

Even in this configuration, since the magnetized spiral magnetizes another ferromagnetic body, a loop-shaped plane magnetic field surrounding the N-pole (or S-pole) on its surface in a loop shape can be formed. Therefore, loop-shaped plasma in the same shape as a conventional one can be obtained.

Seventh Embodiment

A seventh embodiment of the present invention will be explained in detail with reference to FIGS. 38 and 39. Further, descriptions of the same parts as those of the aforementioned embodiments will be omitted for the simplicity of description. A magnetron sputtering apparatus in accordance with the present invention is provided with a free rotary magnet (moving magnet) 21 between an end portion of a spiral-shaped stationary magnet set 3 illustrated in the first embodiment and a short side of a stationary outer peripheral plate magnet 4 orthogonal to the rotation axis direction.

Figure 38:
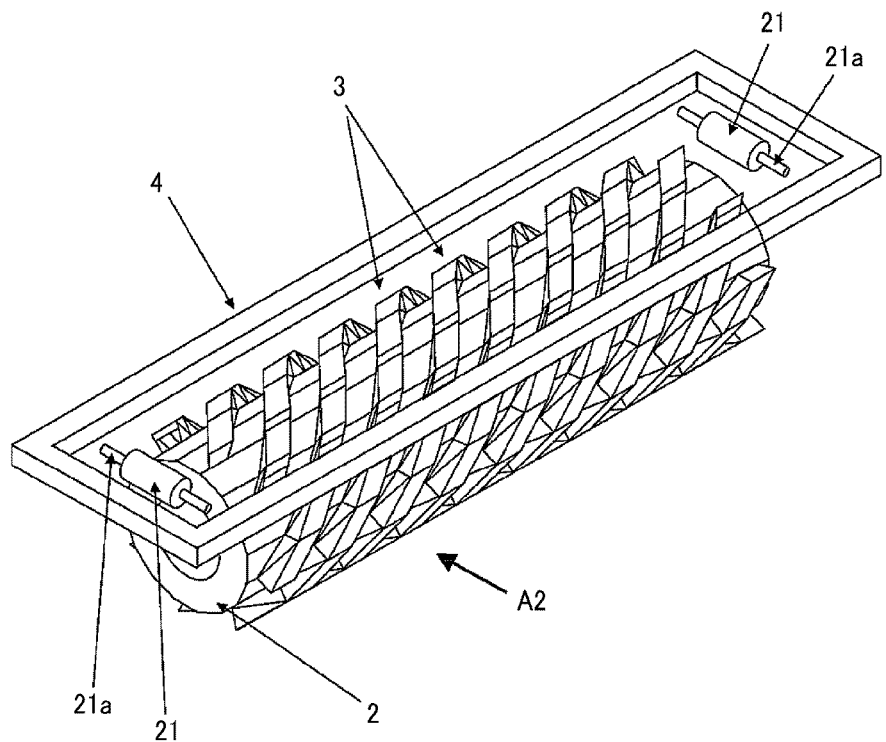
FIG. 38 depicts a (bottom) perspective view to describe a magnet part of a magnetron sputtering apparatus in more detail in accordance with a seventh embodiment of the present invention.
Figure 39:
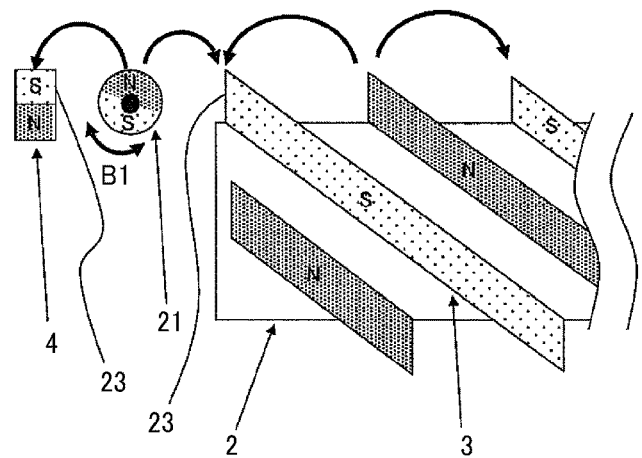
FIG. 39 is a diagram viewed from a direction of an arrow A2 of FIG. 38.

As illustrated in FIGS. 38 and 39, the free rotary magnet (moving magnet) 21 is installed between the end portion of the spiral-shaped stationary magnet set 3 and the short side of the stationary outer peripheral plate magnet 4 orthogonal to the rotation axis direction.

The moving magnet 21 is formed in a column shape and includes a rotation shaft 21a parallel to the short side of the stationary outer peripheral plate magnet 4. The moving magnet 21 can be freely rotated on the rotation shaft 21a in a direction of B1 as indicated in FIG. 39.

Further, the moving magnet 21 is magnetized in a direction perpendicular to the rotation shaft 21a.

The moving magnet 21 is desirably made of a magnet having a high residual magnetic flux density, a high coercive force and high energy product in order to weaken a strong magnetic field. In the present embodiment, SS400 containing Fe as a major component is used for the moving magnet 21.

Furthermore, a surface of the moving magnet is desirably covered with a non-magnetic substance having a corrosion resistance to the plasma.

If the surface of the moving magnet 21 is covered with the non-magnetic substance (not illustrated), it is possible to prevent the surface of the moving magnet 21 from being corroded by the plasma and also prevent particles of the magnetic substance from being adhered on the surface f the moving magnet 21. Accordingly, the inside of the apparatus is prevented from being contaminated.

The non-magnetic substance is desirably made of a material such as stainless or aluminum alloy having a corrosion resistance to the plasma.

Further, in the magnetron sputtering apparatus in accordance with the present invention, in order to prevent a temperature rise of the target, a coolant is circulated through a passage 8 to cool the target. Additionally or alternatively, cooling units may be installed in both spaces which are in the vicinity of upper sides of both ends of the backing plate 6 and below the spiral-shaped plate magnet sets 3.

Moreover, for example, by setting pressures in both spaces (depressurized) above and below the backing plate provided with the target to be substantially same, the backing plate can be thinner and, desirably, the backing plate can have a thickness equal to or less than about 30% of the initial thickness of the target.

Hereinafter, an erosion formation and an operation of the moving magnet 21 during the erosion formation in accordance with the seventh embodiment will be explained in detail. In the same manner as the first embodiment, in case that the spiral-shaped plate magnet sets 3 are formed by arranging a plurality of plate magnets on a column-shaped rotation shaft 2, an N-pole of the plate magnet is approximately surrounded by two S-poles adjacent to the N-pole and a S-pole of outer peripheral stationary magnet when the spiral-shaped plate magnet sets 3 are viewed from the target side, as illustrated in FIG. 3. In this configuration, magnetic force lines start from the N-pole of the spiral-shaped plate magnet sets 3 and end at the surrounding S-poles. As a result, a multitude of closed plasma loops 301 are formed on the target surface spaced apart from a plate magnet surface at a certain distance. Further, as the column-shaped rotation shaft 2 is rotated, the multitude of plasma loops 301 are moved in a rotation axis direction. In FIG. 3, the plasma loops 301 move in a direction indicated by an arrow. Besides, the plasma loops 301 are generated in sequence from one end of the spiral-shaped plate magnet set 3 and disappear in sequence at the other end thereof.

In the seventh embodiment like the first embodiment, if an argon gas is introduced and plasma excitation is performed while rotating the column-shaped rotation shaft 2, a plasma loop 601 is stably generated from a left end of the rotation shaft and is moved with the rotation of the shaft, as illustrated in FIG. 6. Then, the plasma loop 601 disappears stably to a right end of the rotation shaft, as can be seen from a right photograph of FIG. 6 (which shows, from top to bottom, a state of change as time passes).

In this condition, a target 1 is activated and sputtered by the gas excited into plasma and a mounting table 19 is moved such that a substrate 10 to be processed faces the target 1. Thus, the sputtered target 1 is deposited on a surface of the substrate 10, thereby forming a thin film thereon.

In this case, since a direction of a polarity of the spiral-shaped plate magnet set 3 changes as time passes, a polarity of a short side of the stationary outer peripheral plate magnet 4 becomes the same as a polarity of a facing surface of the spiral-shaped magnet depending on a rotation coordinate, thereby forming a strong magnetic field.

For example, as illustrated in FIG. 39, when an end surface of the spiral-shaped plate magnet set 3 with an S-pole facing toward the surface is positioned to face the short side of the stationary outer peripheral plate magnet 4, a part of facing surfaces 23 may have the same polarity of the S-poles. Accordingly, a strong magnetic field is formed due to repulsion between the same polarities.

At a region where the strong magnetic field is formed, a consumption rate of the target 1 is relatively increased, so that an erosion distribution becomes non-uniform.

If the erosion distribution is not uniform, target use efficiency is deteriorated and a thickness of the formed thin film also becomes non-uniform.

In the seventh embodiment, the moving magnet 21 which is freely rotatable is installed between the facing surfaces of the spiral-shaped plate magnet set 3 and the stationary outer peripheral plate magnet 4, so that the magnet 21 freely rotates to face the facing surfaces 23 each having an opposite polarity to that of the moving magnet 21, thereby weakening the strong magnetic field as illustrated in FIG. 39. Alternatively, by using a non-freely rotatable and non-illustrated actuator or the like, the moving magnet 21 may be synchronized with rotation of the spiral magnet and rotated in a direction of B1 as indicated in FIG. 39 so as to face the facing surfaces 23 each having an opposite polarity to that of the moving magnet 21.

In accordance with the seventh embodiment, the magnetron sputtering apparatus includes the moving magnet 21 installed between the facing surfaces 23 of the spiral-shaped plate magnet set 3 and the stationary outer peripheral plate magnet 4, and the generated strong magnetic field is reduced by rotating the moving magnet 21 to face the facing surfaces 23 each having an opposite polarity to that of the moving magnet 21.

As a result, the strong magnetic field generated from the end portion of the spiral magnet can be reduced from about 700 G or more to about 600 G. Accordingly, a local consumption of the target 1 can be prevented and an erosion distribution becomes uniform, thereby improving a target use efficiency.

Further, in the seventh embodiment, each plate magnet of the spiral-shaped plate magnet set 3 is magnetized in a direction perpendicular to its surface, and the plate magnets are fixed to the column-shaped rotation shaft 2 in a spiral shape to form plural spirals. The spirals adjacent to each other in the axis direction of the column-shaped rotation shaft 2 have different magnetic poles, i.e., an N-pole and an S-pole on outer sides of the column-shaped rotation shaft in its diametrical direction, in the same manner as the first embodiment.

Furthermore, in the seventh embodiment, a stationary outer peripheral plate magnet 4 is configured to surround the rotary magnet set serving as a spiral-shaped plate magnet set 3 when viewed from the target 1 and the stationary outer peripheral plate magnet 4 is magnetized such that its side facing the target 1 has an S-pole.

However, if the stationary outer peripheral plate magnet 4 is made of a ferromagnetic body, it does not have to be magnetized in advance.

Further, as for the plate magnets of the spiral-shaped plate magnet set 3, if one (first spiral) of the adjacent spirals is magnetized in advance, the other (second spiral) may be made of a non-magnetized ferromagnetic body.

Even in this configuration, since the magnetized spiral magnetizes another ferromagnetic body, a loop-shaped plane magnetic field surrounding the N-pole (or S-pole) on its surface in a loop shape can be formed. Therefore, loop-shaped plasma in the same shape as a conventional one can be obtained.

Eighth Embodiment

An eighth embodiment of the present invention will be explained in detail with reference to FIGS. 40 to 42. Further, descriptions of the same parts as those of the aforementioned embodiments will be omitted for the simplicity of description.

Figure 40:
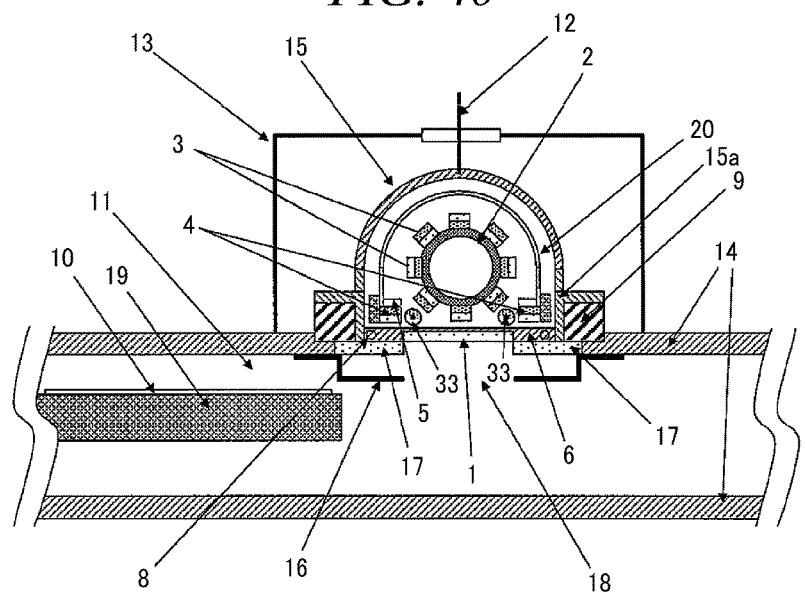
FIG. 40 is a schematic configuration view illustrating a magnetron sputtering apparatus in accordance with an eighth embodiment of the present invention.
Figure 41:
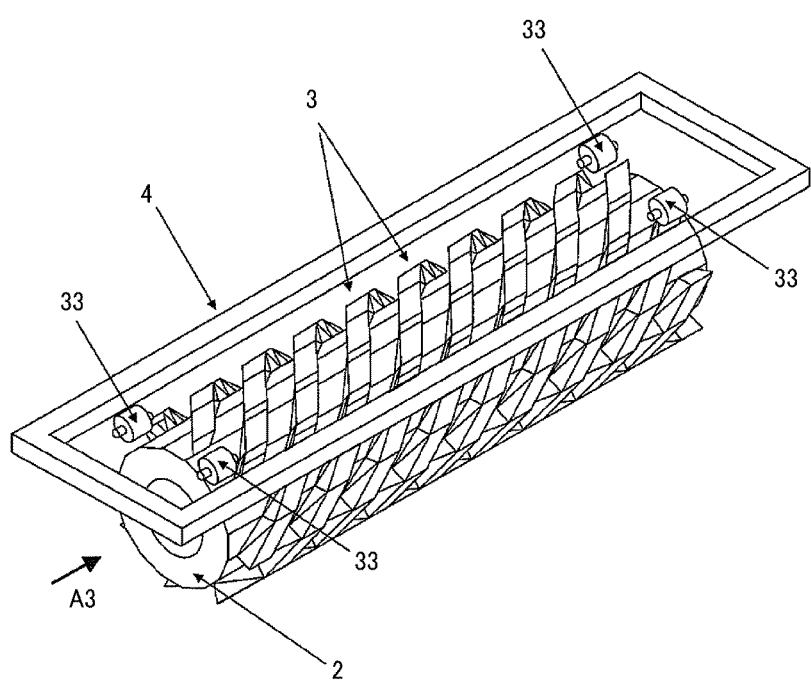
FIG. 41 presents a perspective view (when viewed from the bottom) to a magnet part of the magnetron sputtering apparatus shown in FIG. 40 in more detail.
Figure 42:
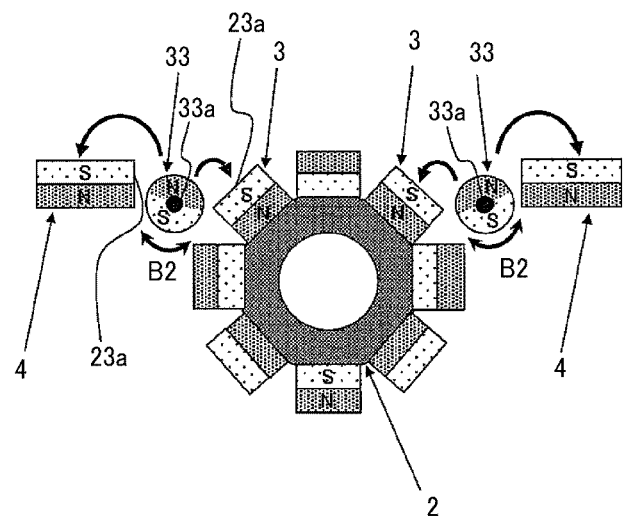
FIG. 42 is a diagram viewed from a direction of an arrow A3 of FIG. 41.

As illustrated in FIGS. 40 to 42, in a magnetron sputtering apparatus in accordance with the present invention, moving magnets 33 are installed at both end portions of the spiral-shaped magnet between a lateral surface of a column-shaped rotation shaft 2 and a long side of a stationary outer peripheral plate magnet 4.

The moving magnets 33 are formed in a column shape and include a rotation shaft 33a parallel to the rotation axis of the column-shaped rotation shaft 2. The moving magnets 33 can be rotated on the rotation shaft 33a in a direction of B2 as indicated in FIG. 42 by using non-illustrated actuators.

Further, the moving magnets 33 are magnetized in a direction perpendicular to its rotation direction.

Hereinafter, operations of the moving magnets 33 will be explained.

As described above, the magnetron sputtering apparatus in accordance with the present invention performs a film formation while rotating the spiral-shaped plate magnet set 3, so that a direction of a polarity of the spiral-shaped plate magnet set 3 changes as time passes.

Therefore, a polarity of a long side of the stationary outer peripheral plate magnet 4 becomes the same as a polarity of a facing surface of the spiral-shaped magnet depending on a rotation coordinate, whereby a strong magnetic field may be formed.

For example, as illustrated in FIG. 42, when a lateral surface of the spiral-shaped plate magnet set 3 with an S-pole facing toward the surface is positioned to face the long side of the stationary outer peripheral plate magnet 4, a part of facing surfaces 23a may have the same polarity of the S-poles. Accordingly, a strong magnetic field is formed due to repulsion between the same polarities.

At a region where the strong magnetic field is formed, a consumption rate of the target 1 is relatively increased, so that an erosion distribution becomes non-uniform.

If the erosion distribution is not uniform, target use efficiency is deteriorated.

In the eighth embodiment, the moving magnet 33 is installed between the facing surfaces 23a of the spiral-shaped plate magnet set 3 and the stationary outer peripheral plate magnet 4. By using a non-illustrated actuator or the like, the moving magnet 33 may be rotated in a direction of B2 as indicated in FIG. 42 so as to face the facing surfaces 23a each having an opposite polarity to that of the moving magnet 33, thereby weakening the generated strong magnetic field as illustrated in FIG. 42. The moving magnet 33 may be freely rotated.

That is, the magnetic field is controlled by using the moving magnet 33, so that an erosion distribution can be uniform and consumption of the target 1 and a thickness of the formed thin film can be uniform, thereby improving a target use efficiency.

In accordance with the eighth embodiment, the magnetron sputtering apparatus includes the moving magnet 33 installed between the lateral surface of the column-shaped rotation shaft 2 and the long side of the stationary outer peripheral plate magnet 4, and the generated strong magnetic field is reduced by rotating the moving magnet 33 to face the facing surfaces 23a each having an opposite polarity to that of the moving magnet 33.

Accordingly, the eighth embodiment has the same effect as the seventh embodiment.

Further, in the eighth embodiment, each plate magnet of the spiral-shaped plate magnet set 3 is magnetized in a direction perpendicular to its surface, and the plate magnets are fixed to the column-shaped rotation shaft 2 in a spiral shape to form plural spirals. The adjacent spirals in the axis direction of the column-shaped rotation shaft 2 have opposite magnetic poles, i.e., an N-pole and an S-pole on outer sides of the column-shaped rotation shaft 2 in its diametrical direction, in the same manner as the first embodiment.

Furthermore, in the eighth embodiment, a stationary outer peripheral plate magnet 4 is configured to surround the rotary magnet set serving as spiral-shaped plate magnet set 3 when viewed from the target 1 and the stationary outer peripheral plate magnet 4 is magnetized such that its side facing the target 1 has an S-pole.

However, if the stationary outer peripheral plate magnet 4 is made of a ferromagnetic body, it does not have to be magnetized in advance.

Further, as for the plate magnets of the spiral-shaped plate magnet set 3, if one (first spiral) of the adjacent spirals is magnetized in advance, the other (second spiral) may be made of a non-magnetized ferromagnetic body.

Even in this configuration, since the magnetized spiral magnetizes another ferromagnetic body, a loop-shaped plane magnetic field surrounding the N-pole (or S-pole) can be formed on its surface in a loop shape. Therefore, loop-shaped plasma in the same shape as a conventional one can be obtained.

Ninth Embodiment

A ninth embodiment of the present invention will be explained in detail with reference to FIGS. 43 and 44. Further, descriptions of the same parts as those of the aforementioned embodiments will be omitted for the simplicity of description.

Figure 43:
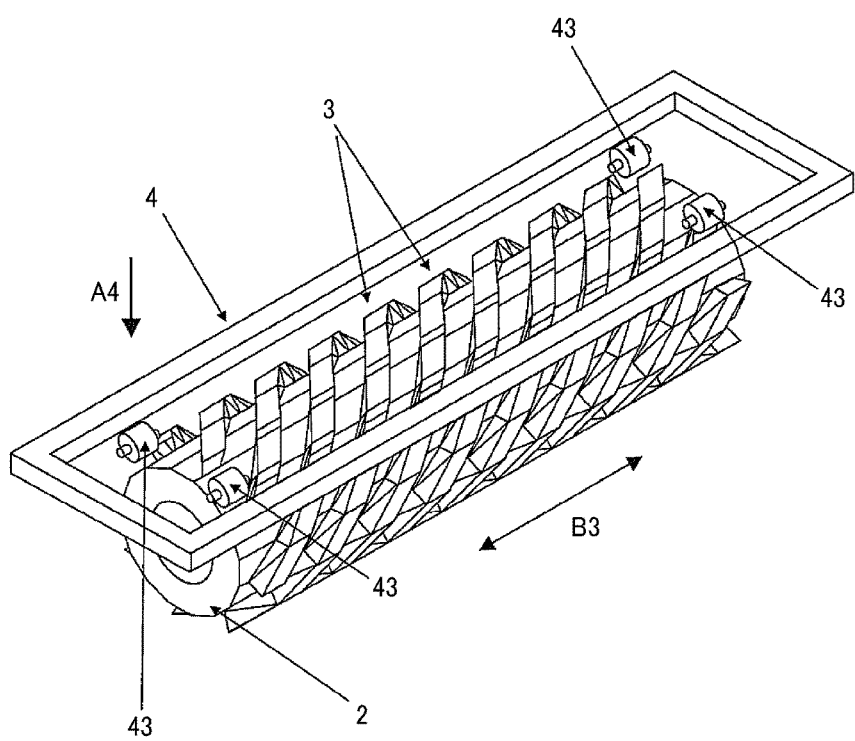
FIG. 43 sets forth a perspective view (viewed from bottom) describing a magnet part of a magnetron sputtering apparatus in accordance with a ninth embodiment of the present invention.
Figure 44:
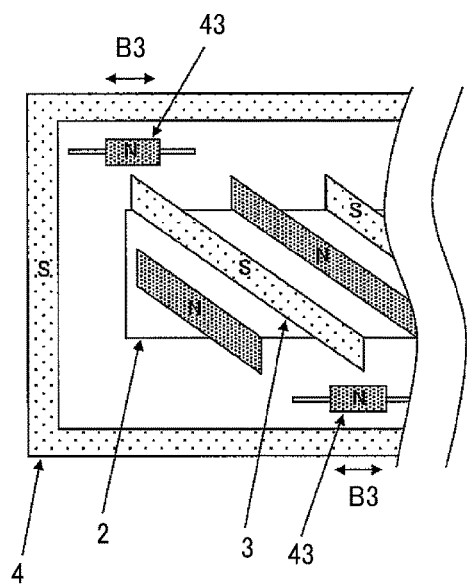
FIG. 44 is a plane view viewed from a direction of an arrow A4 of FIG. 43.

As illustrated in FIGS. 43 and 44, in a magnetron sputtering apparatus, moving magnets 43 are respectively installed between the lateral surface of a column-shaped rotation shaft 2 and the long side of the stationary outer peripheral plate magnet 2 and can be moved in an axis direction of the column-shape rotation shaft 2.

The moving magnet 43 is formed in a column shape and can be moved in a direction of B3 as indicated in FIG. 44, i.e., in the axis direction of column-shape rotation shaft 2 by using a non-illustrated actuator.

Further, the moving magnets 43 are magnetized in a direction perpendicular to its moving direction.

Hereinafter, an operation of the moving magnet 43 will be explained.

As described above, since a direction of a polarity of a spiral-shaped plate magnet set 3 changes as time passes, a polarity of the stationary outer peripheral plate magnet 4 becomes the same as a polarity of a facing surface of the spiral-shaped plate magnet set 3 depending on a rotation coordinate, whereby a strong magnetic field may be formed.

For example, as illustrated in FIG. 44, when a part of a lateral surface of the spiral-shaped plate magnet set 3 with an S-pole facing the surface is positioned to face the long side of the stationary outer peripheral plate magnet 4, a part of facing surfaces may have the same polarity of the S-poles. Accordingly, a strong magnetic field is formed due to repulsion between the same polarities.

At a region where the strong magnetic field is formed, a consumption rate of the target 1 is relatively increased, so that an erosion distribution becomes non-uniform.

If the erosion distribution is not uniform, a consumption of the target 1 is not uniform and target use efficiency is deteriorated.

In the ninth embodiment, the moving magnets 43 are installed between the facing surfaces of the spiral-shaped plate magnet set 3 and the stationary outer peripheral plate magnet 4. By using a non-illustrated actuator or the like, the moving magnet 43 may be moved in a direction of B3 as indicated in FIG. 44 so as to face the facing surfaces each having an opposite polarity to that of the moving magnet 43, thereby reducing the generated strong magnetic field.

That is, the magnetic field is controlled by using the moving magnet 43, so that an erosion distribution can be uniform and consumption of the target 1 and a thickness of the formed thin film can be uniform, thereby improving a target use efficiency.

Further, the moving magnet 43 may be configured to be rotated in the axis direction of the column-shaped rotation shaft 2.

With this configuration, the ninth embodiment has the same effect as the eighth embodiment.

In accordance with the ninth embodiment, the magnetron sputtering apparatus includes the moving magnet 43 installed between the lateral surface of the column-shaped rotation shaft 2 and the stationary outer peripheral plate magnet 4, and the generated strong magnetic field is weakened by moving the moving magnet 43 to face the facing surfaces each having an opposite polarity to that of the moving magnet 43.

Accordingly, the ninth embodiment has the same effect as the eighth embodiment.

Further, in the ninth embodiment, each plate magnet of the spiral-shaped plate magnet set 3 is magnetized in a direction perpendicular to its surface, and the plate magnets are fixed to the column-shaped rotation shaft 2 in a spiral shape to form plural spirals. The spirals adjacent to each other in the axis direction of the column-shaped rotation shaft 2 have different magnetic poles, i.e., an N-pole and an S-pole on outer sides of the column-shaped rotation shaft 2 in its diametrical direction, in the same manner as the first embodiment.

Furthermore, in the ninth embodiment, a stationary outer peripheral plate magnet 4 is configured to surround the rotary magnet set serving as spiral-shaped plate magnet set 3 when viewed from the target 1 and the stationary outer peripheral plate magnet 4 is magnetized such that its side facing the target 1 has an S-pole.

However, if the stationary outer peripheral plate magnet 4 is made of a ferromagnetic body, it does not have to be magnetized in advance.

Further, as for the plate magnets of the spiral-shaped plate magnet set 3, if one of the adjacent spirals is magnetized in advance (i.e., it is a magnet), the other may be made of a non-magnetized ferromagnetic body.

Even in this configuration, since the magnetized spiral magnetizes another ferromagnetic body, a loop-shaped plane magnetic field surrounding the N-pole (or S-pole) can be formed on its surface in a loop shape. Therefore, loop-shaped plasma in the same shape as a conventional one can be obtained.

Tenth Embodiment

A tenth embodiment of the present invention will be explained in detail with reference to FIG. 45. Further, descriptions of the same parts as those of the aforementioned embodiments will be omitted for the simplicity of description.

Figure 45:
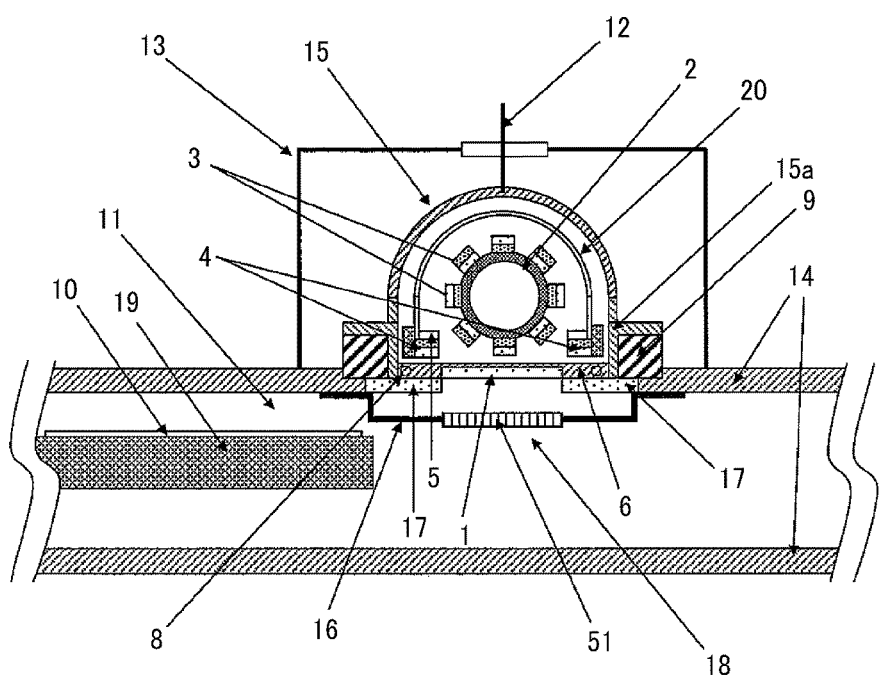
FIG. 45 is a schematic configuration view illustrating a magnetron sputtering apparatus in accordance with a tenth embodiment of the present invention.

As illustrated in FIG. 45, a collimator 51 is installed in a slit 18 in a plasma shield member 16 and the slit 18 is positioned to face the target 1.

The collimator 51 is fixed to the plasma shield member 16.

The collimator 51 is made of, e.g., Ti, Ta, Al, stainless steel or metal containing these materials.

Further, the collimator 51 is connected with a non-illustrated power supply circuit that applies a voltage to the collimator 51 and serves as a removal unit. A target alignment mechanism is made up of the collimator 51 and the power supply circuit.

When the magnetron sputtering apparatus is operated, sputtered target materials reach the collimator 51 and target materials having different directions and angles from those of the collimator 51 are reflected by the collimator 51 or adhered to the collimator 51.

Accordingly, angles of the target materials reaching a substrate 10 to be processed (which is moved to right side in the drawing to be positioned right below the slit 18) can be adjusted to be identical with each other.

The target materials adhered to the collimator 51 can be removed by the non-illustrated power supply circuit as the removal unit for applying a voltage to the collimator 51.

Further, in the tenth embodiment, each plate magnet of the spiral-shaped plate magnet set 3 is magnetized in a direction perpendicular to its surface, and the plate magnets are fixed to the column-shaped rotation shaft 2 in a spiral shape to form plural spirals. The adjacent spirals in the axis direction of the column-shaped rotation shaft have opposite magnetic poles, i.e., an N-pole and an S-pole on outer sides of the column-shaped rotation shaft 2 in its diametrical direction, in the same manner as the first embodiment.

Furthermore, in the tenth embodiment, a stationary outer peripheral plate magnet 4 is configured to surround the rotary magnet set serving as spiral-shaped plate magnet set 3 when viewed from the target 1 and the stationary outer peripheral plate magnet 4 is magnetized such that its side facing the target 1 has an S-pole.

However, if the stationary outer peripheral plate magnet 4 is made of a ferromagnetic body, it does not have to be magnetized in advance.

Further, as for the plate magnets of the spiral-shaped plate magnet set 3, if one (first spiral) of the adjacent spirals is magnetized in advance, the other (second spiral) may be made of a non-magnetized ferromagnetic body.

Even in this configuration, since the magnetized spiral magnetizes another ferromagnetic body, a loop-shaped plane magnetic field surrounding the N-pole (or S-pole) can be formed on its surface in a loop shape. Therefore, loop-shaped plasma in the same shape as a conventional one can be obtained.

Eleventh Embodiment

Figure 46:
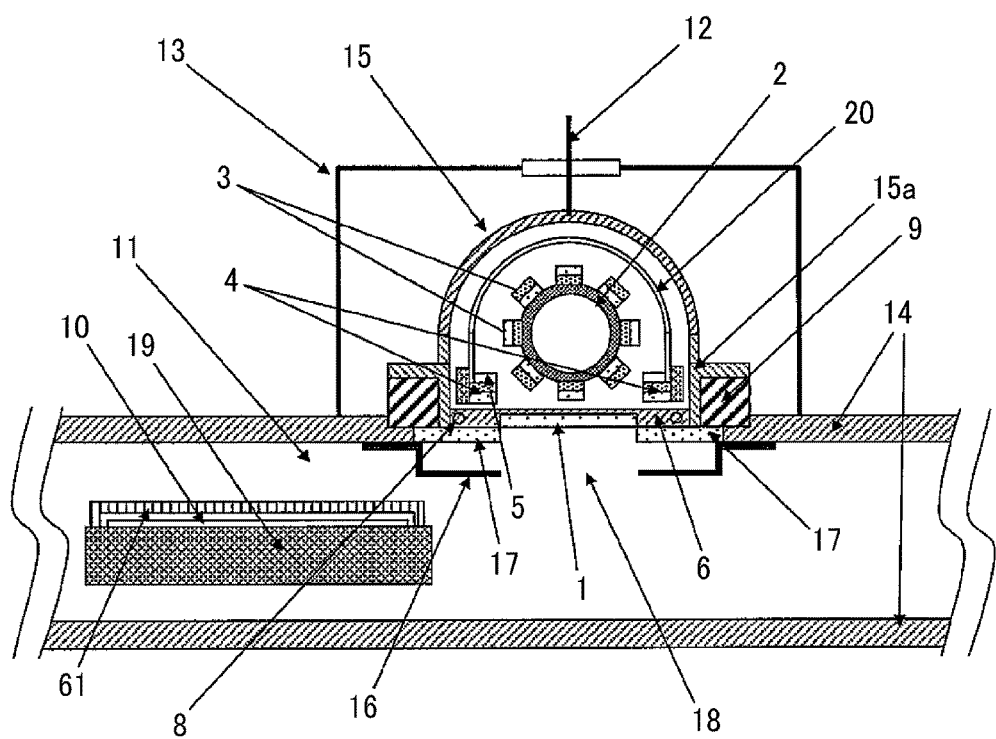
FIG. 46 is a schematic configuration view illustrating a magnetron sputtering apparatus in accordance with an eleventh embodiment of the present invention.

An eleventh embodiment of the present invention will be explained in detail with reference to FIG. 46. Further, descriptions of the same parts as those of the aforementioned embodiments will be omitted for the simplicity of description. In the present embodiment, a collimator 61 is installed to cover a substrate 10 to be processed instead of being installed in a slit 18 and the collimator 61 and the substrate 10 are transferred together.

The collimator 61 covers an upper surface of the substrate 10 but is not fixed to a main body of the sputtering apparatus.

With this configuration, the collimator 61 moves together with the substrate 10.

In this way, since the collimator 10 is configured to cover the substrate 10 and move with the substrate 10 as described above, an amount of target material to be adhered to the collimator 61 is reduced as compared to the tenth embodiment.

Further, in the eleventh embodiment, each plate magnet of the spiral-shaped plate magnet set 3 is magnetized in a direction perpendicular to its surface, the plate magnets are fixed to the column-shaped rotation shaft 2 in a spiral shape to form plural spirals. The spirals adjacent to each other in the axis direction of the column-shaped rotation shaft 2 have different magnetic poles, i.e., an N-pole and an S-pole on outer sides of the column-shaped rotation shaft 2 in its diametrical direction, in the same manner as the first embodiment.

Furthermore, in the eleventh embodiment, a stationary outer peripheral plate magnet 4 is configured to surround the rotary magnet set serving as spiral-shaped plate magnet set 3 when viewed from the target 1 and the stationary outer peripheral plate magnet 4 is magnetized such that its side facing the target 1 has an S-pole.

However, if the stationary outer peripheral plate magnet 4 is made of a ferromagnetic body, it does not have to be magnetized in advance.

Further, as for the plate magnets of the spiral-shaped plate magnet set 3, if one (first spiral) of the adjacent spirals is magnetized in advance, the other may be made of a non-magnetized ferromagnetic body.

Even in this configuration, since the magnetized spiral magnetizes another ferromagnetic body, a loop-shaped plane magnetic field surrounding the N-pole (or S-pole) can be formed on its surface in a loop shape. Therefore, loop-shaped plasma in the same shape as a conventional one can be obtained.

Though the present invention has been explained with respect to the above-described embodiments, a size of the magnet, a size of the substrate, and the like are not limited to the mentioned examples.

INDUSTRIAL APPLICABILITY

A magnetron sputtering apparatus in accordance with the present invention can be used not only for forming a thin film such as an insulating film, a conductive film on a semiconductor wafer or the like, but also for forming various kinds of films on a substrate such as a glass substrate in a flat display device and for performing sputtering film formation in fabricating a memory device, a magnetic recording device and other electronic devices.

Further, this application claims priority to Japanese Patent Application No. 2007-101159, field on Apr. 6, 2007, Japanese Patent Application No. 2008-053981, filed on Mar. 4, 2008, Japanese Patent Application No. 2008-052934, filed on Mar. 4, 2008 and Japanese Patent Application No. 2008-052891, filed on Mar. 4, 2008, which are incorporated herein by reference in its entirety.

What is claimed is:

1. A magnetron sputtering apparatus for processing a substrate, the apparatus comprising:
   a target holding member for holding a target that is arranged to face the substrate when processing the substrate; and
   a magnet installed at a side opposite to the substrate across the target, wherein the magnet comprises:
   a rotary magnet body installed around a column-shaped rotation shaft in a spiral shape; and
   a stationary outer peripheral body installed in a vicinity of the rotary magnet body in parallel to a surface of the target,
   wherein
   the rotary magnet body comprises a plurality of spiral bodies each formed from a plurality of plate magnets around and without penetrating the column-shaped rotation shaft along an entire length of the column-shaped rotation shaft, and forms a spiral-shaped magnet set in which adjacent spiral bodies in an axial direction of the column-shaped rotation shaft have opposite magnetic poles of an N pole and an S pole on a diametrical side of the column-shaped rotation shaft, the plurality of spiral bodies are parallel with and separated from each other, an entirety of each of the spiral bodies is either an N pole or an S pole along the entire length of the column-shaped rotation shaft, plasma is confined on the surface of the target by forming a magnetic field on the surface of the target by the magnet, and the rotary magnet body rotates with the column-shaped rotation shaft, so that a pattern of the magnetic field on the surface of the target moves as time passes.

2. The magnetron sputtering apparatus of claim 1, wherein a torque applied to the column-shaped rotation shaft due to an interaction between the rotary magnet body and the stationary outer peripheral body is in a range of about 0.1 N·m to 100 N·m.

3. The magnetron sputtering apparatus of claim 2, wherein the stationary outer peripheral body is configured to surround the rotary magnet body, and forms magnetic poles of an N pole or an S pole on a side facing the target or it is not previously magnetized.

4. The magnetron sputtering apparatus of claim 3, wherein, when the column-shaped rotation shaft and the rotary magnet body are viewed from a direction perpendicular to an axis of the column-shaped rotation shaft, an acute angle between a direction of the magnet forming a spiral and an axial direction of the column-shaped rotation shaft is in a range of about 70° to 88°.

5. The magnetron sputtering apparatus of claim 3, wherein the rotary magnet body is a spiral-shaped plate magnet set having plate magnets installed on the column-shaped rotation shaft in a spiral shape to form 2 spirals, and adjacent spirals in an axial direction of the column-shaped rotation shaft have opposite magnetic poles of an N pole and an S pole on the outer side of the column-shaped rotation shaft in a diametrical direction of the column-shaped rotation shaft.

6. The magnetron sputtering apparatus of claim 3, wherein the rotary magnet body is a spiral-shaped plate magnet set having plate magnets installed on the column-shaped rotation shaft in a spiral shape to form 4, 6, 8 or 10 spirals, and adjacent spirals in an axial direction of the column-shaped rotation shaft have opposite magnetic poles of an N pole and an S pole on the outer side of the column-shaped rotation shaft in a diametrical direction of the column-shaped rotation shaft.

7. The magnetron sputtering apparatus of claim 5, wherein a stationary outer peripheral paramagnetic body is installed adjacent to the stationary outer peripheral body at a surface opposite to the target across the stationary outer peripheral body.

8. The magnetron sputtering apparatus of claim 5, wherein, provided is a unit that allows a magnetic flux starting from the stationary outer peripheral body to an outside of the target to be weaker than a magnetic flux starting from the stationary outer peripheral body to an inside of the target.

9. The magnetron sputtering apparatus of claim 5, further comprising:

a backing plate whose a thickness is thinner than an initial thickness of the target.

10. The magnetron sputtering apparatus of claim 1, wherein the rotary magnet body includes a first spiral body formed by installing a magnet, which is magnetized such that its surface becomes an S pole or an N pole, at the column-shaped rotation shaft in a spiral shape; and a second spiral body formed by installing a ferromagnetic body, which is not previously magnetized, at the column-shaped rotation shaft in a spiral shape to be adjacent to and in parallel to the first spiral body.

11. The magnetron sputtering apparatus of claim 1, wherein the rotary magnet body is configured to have a magnet structure featuring a target use efficiency equal to or higher than about 80%, which is determined by a target consumption distribution determined based on a Larmor radius of electrons confined in the horizontal magnetic field and a curvature radius of the magnetic field.

12. The magnetron sputtering apparatus of claim 10, wherein a configuration of the first spiral body and/or a configuration of the second spiral body are/is set such that the target use efficiency, which is expressed by the following formula (3), is equal to or higher than about 80%:

$$\text{Target use efficiency} = \text{A cross sectional area of an erosion part} / \text{An initial cross sectional area of the target} \quad (3),$$

wherein the target use efficiency is calculated when a minimum thickness of the target is about 5% of the initial thickness thereof.

13. The magnetron sputtering apparatus of claim 1, further comprising:

a holder configured to mount the substrate; and a plasma shielding plate installed between the holder and the target holding member, wherein the shielding plate is provided with a slit in a space between the substrate and the target, and a difference between a width of the slit and a width of the plasma is within about 20 mm.

14. The magnetron sputtering apparatus of claim 1, further comprising:

a holder configured to mount the substrate; and a plasma shielding plate installed between the holder and the target holding member, wherein the shielding plate is provided with a slit in a space between the substrate and the target, and a distance between the shielding plate and the target is in the range of about 3 to 15 mm.

15. The magnetron sputtering apparatus of claim 1, further comprising:

a moving magnet configured to be movable in the apparatus, wherein a strong magnetic field, generated depending on a rotation coordinate of the rotary magnet body, is weakened by moving the moving magnet along with a rotation of the rotary magnet body.

16. The magnetron sputtering apparatus of claim 1, further comprising:

a collimator configured to allow travelling directions of sputtered target particles to be uniform.

* * * * *

UNITED STATES PATENT AND TRADEMARK OFFICE
CERTIFICATE OF CORRECTION

PATENT NO. : 8,568,577 B2
APPLICATION NO. : 12/594676
DATED : October 29, 2013
INVENTOR(S) : Tadahiro Ohmi et al.

Page 1 of 1

It is certified that error appears in the above-identified patent and that said Letters Patent is hereby corrected as shown below:

In the specification, column 31, Line 27 [Eq. 3] please replace " $W \approx 2\sqrt{2Rr_G}$ " with -- $W \approx 2\sqrt{2Rr_C}$ --

Signed and Sealed this
Fourth Day of February, 2014

Michelle K. Lee
*Deputy Director of the United States Patent and Trademark Office*

UNITED STATES PATENT AND TRADEMARK OFFICE
CERTIFICATE OF CORRECTION

PATENT NO.        : 8,568,577 B2                                              Page 1 of 1
APPLICATION NO.   : 12/594676
DATED             : October 29, 2013
INVENTOR(S)       : Ohmi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 676 days.

Signed and Sealed this
Fifteenth Day of September, 2015

Michelle K. Lee
*Director of the United States Patent and Trademark Office*